(12) United States Patent
Ohira et al.

(10) Patent No.: US 6,635,327 B2
(45) Date of Patent: Oct. 21, 2003

(54) ENERGY CONVERSION COMPOSITION

(75) Inventors: Yasuyuki Ohira, Seki (JP); Mitsuo Hori, Gifu (JP)

(73) Assignee: Shishiai-Kabushikigaisha (JP)

( * ) Notice: Subject to any disclaimer, the term of this patent is extended or adjusted under 35 U.S.C. 154(b) by 0 days.

(21) Appl. No.: 09/924,913

(22) Filed: Aug. 8, 2001

(65) Prior Publication Data

US 2002/0037381 A1 Mar. 28, 2002

Related U.S. Application Data

(62) Division of application No. 09/091,563, filed on Mar. 22, 1999.

(30) Foreign Application Priority Data

| | | |
|---|---|---|
| May 10, 1996 | (JP) | 8-116269 |
| May 30, 1996 | (JP) | 8-136583 |
| Jun. 12, 1996 | (JP) | 8-150592 |
| Jun. 28, 1996 | (JP) | 8-169162 |
| Sep. 3, 1996 | (JP) | 8-232810 |
| Nov. 7, 1996 | (JP) | 8-295076 |
| Nov. 7, 1996 | (JP) | 8-295297 |
| Nov. 12, 1996 | (JP) | 8-300586 |
| Nov. 14, 1996 | (JP) | 8-303295 |
| Nov. 19, 1996 | (JP) | 8-308526 |
| Nov. 26, 1996 | (JP) | 8-314725 |
| Dec. 3, 1996 | (JP) | 8-323120 |
| Dec. 27, 1996 | (JP) | 8-350649 |
| Jan. 27, 1997 | (JP) | 9-12842 |
| Feb. 5, 1997 | (JP) | 9-22846 |
| Feb. 20, 1997 | (JP) | 9-36159 |
| Mar. 7, 1997 | (JP) | 9-52921 |

(51) Int. Cl.[7] .................................................. C08K 3/00

(52) U.S. Cl. .................... 428/68; 428/296.7; 428/308.4

(58) Field of Search .................. 428/68, 296.7, 428/308.4, 36.9

(56) References Cited

U.S. PATENT DOCUMENTS

| | | | |
|---|---|---|---|
| 4,000,101 A | 12/1976 | McNally | 260/23 H |
| 4,188,212 A | 2/1980 | Fujiwara et al. | 430/69 |
| 4,605,869 A | 8/1986 | Choe | 307/425 |

(List continued on next page.)

FOREIGN PATENT DOCUMENTS

| | | | |
|---|---|---|---|
| JP | 58067779 | 4/1983 | |
| JP | 59163419 A | 9/1984 | |
| JP | 1168190 | 7/1989 | |
| JP | 3046399 | 2/1991 | |
| JP | 64-181923 | 2/1991 | H05K/9/00 |
| JP | 4503530 | 5/1992 | |
| JP | 5255521 | 10/1993 | |
| JP | 6208147 | 5/1994 | |
| JP | 6155666 | 6/1994 | |
| JP | 8224790 | 6/1994 | |
| JP | 6294980 | 10/1994 | |
| JP | 07076179 | 3/1995 | |
| JP | 7146686 | 6/1995 | |
| JP | 08073648 | 3/1996 | C08K/3/00 |
| JP | 8269240 | 10/1996 | |
| JP | 10268870 A | 10/1998 | |

Primary Examiner—Sandra M. Nolan
(74) Attorney, Agent, or Firm—Cantor Colburn LLP

(57) ABSTRACT

The present invention provides an energy conversion composition which has an excellent capability of absorbing and damping energy such as dynamic, thermal, or electric energy. The composition can be made into a very thin and small but excellent damping product. The energy conversion composition is characterized in that its base material contains a moment activator which can increase the amount of dipole moments in the base material. The energy conversion composition can be utilized as a vibration damping, sound absorptive, impact absorptive, vibration-proof, electromagnetic wave absorptive, piezoelectric, and endothermal material as well as a polarity liquid.

37 Claims, 51 Drawing Sheets

U.S. PATENT DOCUMENTS

| | | |
|---|---|---|
| 4,659,177 A | 4/1987 | Choe et al. ............... 350/96.34 |
| 4,722,946 A | 2/1988 | Hostettler ................... 521/158 |
| 4,886,339 A | 12/1989 | Scozzafava et al. ..... 350/96.34 |
| 4,988,909 A | 1/1991 | Hagimura et al. .......... 310/358 |
| 5,153,388 A | 10/1992 | Wittenmayer et al. ...... 181/290 |
| 5,217,637 A | 6/1993 | Balzer .......................... 252/73 |
| 5,262,459 A | 11/1993 | Kotani et al. ................. 524/91 |
| 5,267,487 A | 12/1993 | Falco et al. ................... 74/558 |
| 5,281,470 A | 1/1994 | Kobayashi et al. ......... 428/241 |
| 5,309,767 A | 5/1994 | Parmar et al. ................ 73/705 |
| 5,340,654 A | 8/1994 | Ueda et al. ................. 427/437 |
| 5,382,629 A * | 1/1995 | Coran et al. ................. 525/194 |
| 5,439,512 A * | 8/1995 | Kamijima et al. ........ 106/18.32 |
| 5,489,391 A | 2/1996 | Nawa et al. ................... 252/75 |
| 5,517,350 A | 5/1996 | Cabrera et al. ............. 359/326 |
| 5,633,286 A | 5/1997 | Chen ........................... 524/474 |
| 5,667,720 A | 9/1997 | Onishi et al. ........... 252/299.01 |
| 5,891,581 A | 4/1999 | Simpson et al. ............ 428/458 |
| 5,914,372 A | 6/1999 | Hasegawa et al. ........ 525/332.8 |
| 5,944,932 A | 8/1999 | Klein et al. ................. 156/245 |
| 6,002,196 A | 12/1999 | Sumita et al. .............. 310/326 |
| 6,147,150 A * | 11/2000 | Ohira et al. ................. 524/425 |

* cited by examiner

ENERGY CONVERSION COMPOSITION

CROSS REFERENCE TO RELATED APPLICATION

This application is a divisional of U.S. application Ser. No. 09/091,563, filed on Mar. 22, 1999, which is incorporated herein in its entirety.

TECHNICAL FIELD

The present invention generally relates to energy conversion compositions, excluding conversion of electrical energy into mechanical energy, which can effectively absorb and damp energy such as dynamic, thermal, and/or electrical energy excluding optical energy.

BACKGROUND ART

There conventionally exists a vibration energy damping material of a soft vinyl chloride resin and a plasticizer.

Such a soft vinyl chloride resin can damp vibration energy on the surface of and/or within the resin by converting the vibration energy into frictional heat, only to a very limited extent.

Japanese Laid-Open Patent Publication No. 5-332047 discloses a liquid material which absorbs or damps vibration energy to a degree. This liquid material or a viscous fluid comprises a glycol as a chief ingredient. Vibration energy or seismic energy generates an electric field in the viscous fluid and changes the viscosity of the fluid, an attempt to efficiently damp the dynamic energy.

A very large amount of liquid material is required to effectively damp huge seismic energy, for instance, from a major earthquake. Due to gradual oxidization of the liquid material, its damping performance gets lowered over time, requiring periodical refreshment of the liquid material. Accordingly, there exists a strong demand for a vibration damping material which with a minimum amount can efficiently damp seismic energy or vibrations over a longer period of time without such refreshment.

A sound or noise absorptive or damping material containing glass wool is known. Glass wool can damp sound or noise by consuming the energy as frictional heat when sound collides with the surface of glass wool fibers and passes therethrough.

The glass wool type sound absorptive material, however, need be prepared relatively thick to provide sufficient sound absorption. The material cannot effectively absorb sound of a low frequency below 1,000 Hz. The material does not function well at a frequency below 500 Hz.

There is an impact absorptive or damping material. Japanese Patent Laid-Open Publication No. 6-300071 discloses an impact absorptive material which comprises short fibers dispersed in a foamed polymer. This impact absorptive material can damp an impact applied against a surface portion of the formed material through the gradual collapse of the structural integration of the formed material. The short fibers dispersed in the foamed material act as a physical binder to promote the tensile strength of the material and prevent its cracking.

This impact absorptive material, however, requires a considerable thickness and volume to provide sufficient impact damping. Accordingly, if there is no sufficient room for installment, this impact absorptive material cannot be conveniently utilized.

There is an electromagnetic shield material as proposed in Japanese Patent Laid-Open Publication No. 5-255521, which can absorb electromagnetic energy to an extent. This material comprises an ultraviolet absorptive compound capable of absorbing or damping ultraviolet rays of a wavelength of 250 to 400 nm through excitation of the molecules of the compound and conversion of the ray energy into thermal energy.

This material need be 10 to 20 mm thick to provide a sufficient absorption of ultraviolet rays. Such a thick sheet hinders visibility. A demand for a material which can provide a thin but effective electromagnetic shield is strong.

Butyl rubber or NBR is conventionally utilized to provide a vibration damping material. Such a rubber material is economical and easy to process as well as possesses a considerable mechanical strength.

Such a rubber material shows an excelled vibration damping property among polymers, however, if a rubber material is used singly, its damping ability is somehow limited. Therefore, a metal plate or core or oil damper is conventionally incorporated in a rubber-type vibration damping material, which is rather complicated and costly to manufacture.

Accordingly, there is a strong demand for a vibration damping material which itself can provide excellent vibration absorption or damping.

Japanese Patent Laid-Open Publication No. 5-5215 discloses an endothermic fiber material. This material is a polymer comprising a straight-chain aliphatic carboxylic acid and straight-chain aliphatic diol, such as polyethyleneadipate, polypentamethyleneadipate, or polytetramethynenglutarate. The polymer absorbs heat as it melts and provides heat damping, though, a large amount of polymer is required to provide sufficient heat absorption.

A viscous fluid mainly composed of a glycol provides a high latent heat medium to be used as a transmission cooler, engine coolant or mold cooler. The cooling property of the fluid is given by the following equation.

$$(\Delta H - RT)/V = (SP)^2$$

$\Delta H$: latent heat, SP: SP value (solubility parameter). The SP value is an indication of polarity and increases as dipoles increase. Water has the largest SP value, however, use of water is not practical because water tends to corrode metals. Glycol has an excellent rust inhibition property, however, glycol does not provide a high latent heat property.

As described above, conventional energy conversion (damping) materials or compositions have insufficient damping capabilities, or require a considerable thickness or volume to provide a satisfactory damping capability.

The inventors have discovered through a lengthy research on energy conversion compositions that the magnitude of dipole moment of the compositions is directly related to their energy absorption/conversion/damping capability.

The inventors have also found that the dielectric loss factor of the compositions is related with their energy absorption/conversion damping capability.

Accordingly, an object of the present invention is to provide an energy conversion composition, excluding conversion of electrical energy into mechanical energy, which has an excellently improved capability of absorbing/converting or damping energy such as dynamic, thermal, and/or electric energy excluding optical energy. Another object, of the present invention is to provide an energy conversion/damping composition which can provide an excellently improved ability with a minimal thickness or volume.

DISCLOSURE OF THE INVENTION

An energy conversion composition according to this invention can be prepared into, but not limited to, an unconstrained or constrained vibration damping sheet, paint, paper, asphalt material (for automobile flooring), or a vibration damping material for asphalt roads (noiseless roads), or sound or noise absorptive material for sound absorptive sheets, fibers, foam materials, films or molds, or impact absorptive material for training shoe soles, protections, head gears, plaster casts, mats, supporters, handle grips and saddles of bicycles or motorbikes, front forks, grip ends of tennis or badminton rackets, baseball bats, or golf clubs, grip tapes, hammer grips, slippers, gun bottoms, shoulder pads, or bulletproof jackets, or vibration-proof rubber material for earthquake damping rubbers or molds, or electromagnetic shield material for X-ray or ultraviolet shield sheets, or piezoelectric material (excluding ones that convert electrical energy to mechanical energy), or endothermic material for endothermic fibers or pellets, or viscous fluid for earthquake damping apparatus, or polarity liquid for engine mount liquids, shock absorber oils, power supply transmission cooling liquids, engine coolants, floor heater media or solar heat media.

The energy conversion composition according to this invention is characterized in that its base material contains a moment promoter or moment activator which increases or promotes the amount or magnitude of dipole moment in the base material.

Such a base material is not limited to but may be a polymer material such as polyvinyl chloride, polyethylene, polypropylene, ethylene-vinyl acetate copolymer, polymethyl methacrylate, polyvinylidene fluoride, polyisoprene, polystyrene, styrene-butadiene-acrylonitrile copolymer, styrene-acrylonitrile copolymer, acrylonitrile-butadiene rubber (NBR), styrene-butadiene rubber (SBR), butadiene rubber (BR), natural rubber (NR), isoprene rubber (IR), or their selected mixture, among which polyvinyl chloride is preferred for its workability and low cost.

When such an energy conversion composition is to be made into a noise or impact absorptive material, electromagnetic shield material, endothermic material, or polarity material, its base material may be additionally provided with polyester, polyurethane, polyamide, polyvinylidene, polyacrylonitrile, polyvinylalcohol, or cellulose. In particular, when the composition is to be made into a sound absorptive material, a foaming agent may be added to provide a porous material to improve sound damping.

When the composition is to be made into a vibration damping rubber material, the base material may be acrylonitrile-butadiene rubber (NBR), styrene-butadiene rubber (SBR), butadiene rubber (BR), natural rubber (NR), or isoprene rubber (IR). When a polarity liquid is to be provided, the base material may be a glycol or water.

Mica scales, glass pieces, carbon fibers, calcium carbonate, barite, precipitated barium sulfate, corrosion inhibitor, dye, antioxidant, electricity control agent, stabilizer, or wetting agent may be selectively added to the base material as desired.

When vibration, sound, impact, electricity, pressure, or heat energy is applied onto the base material, dipoles 12 in the base material 11 as shown FIG. 1 are displaced to a state such as shown in FIG. 2. This displacement of the dipoles 12 may be caused by rotation or shifting of phase within the base material 11.

Prior to application of energy, the dipoles 12 in the base material 11 as shown in FIG. 1 are stable. When an energy is applied onto the base material, the dipoles 12 in the base material 11 are displaced into an unstable state. They are then prompted to return to a stable state such as shown in FIG. 1.

The applied energy is effectively consumed through this process. It is assumed that the consumption of energy provided by the displacement and recovery of the dipoles provides noise, impact, vibration, electromagnetic wave, or heat damping.

The mechanism of energy absorption/damping is associated with the magnitude of dipole moment in the base material 11. When the magnitude of dipole moment in the base material 11 is large, the base material 11 possesses a high energy absorptive capability.

The magnitude of dipole moment in the base material is subject to the base material used. Even when the base material is the same, the magnitude of dipole moment to be provided in the base material varies with the working temperature. The magnitude of dipole moment is also affected by the type and magnitude of particular energy applied onto the base material. Thus, the base material should be selected so as to provide the largest possible magnitude of dipole moment, considering the possible or expected working temperature as well as the type and magnitude of the energy to be applied.

It is desirable to also take into consideration factors such as workability, availability, temperature characteristics (temperature resistance), weatherability, and price of the base material in selecting the base material ingredient or ingredients.

A moment activator is blended in the base material to significantly increase the magnitude of dipole moment of the base material.

The moment activator itself may or may not provide a large magnitude of dipole moment, however, in combination with the base material it can significantly promote the overall magnitude of dipole moment in the base material.

The magnitude of dipole moment in the base material 11 will be increased by three to ten times under the same temperature and energy conditions as exemplary shown in FIG. 3 by blending a moment activator therein. The consumption of energy provided by the recovery of the dipoles in the base material is unexpectedly great, providing an unexpectedly improved total energy absorption/damping capability.

The moment activator which can provide such an unexpected effect may be a compound or compounds having a benzothiazyl radical such as N,N-dicyclohexylbenzothiazyl-2-sulfenamide (DCHBSA), 2-mercaptobenzothiazole (MBT), dibenzothiazylsulfide (MBTS), N-cyclohexylbenzothiazyl-2-sulfenamide (CBS), N-tert-butylbenzpthiazyl-2-sulfenamide (BBS), N-oxydiethylenebenzothiazyl-2sulfenamide (OBS), or N,N-diisopropylbenzothiazyl-2-sulfenamide (DPBS), or a benzotriazyl radical such as 2-2'-hydroxy-3'-(3", 4", 5", 6" tetrahydrophthalimidemethyl)-5'-methylphenyl)-benzotriazole (2HPMMB), 2-2'-hydroxy-5' methylphenyl)-benzotriazole (2HMPB), 2-2'-hydroxy-3', 5'-di-t-butyl--5'-methylphenyl)-5-chlorobenzotriazole (2HBMPCB), 2-2'-hydroxy-3', 5'-di-t-butylphenyl)-5-chlorobenzotriazole (2HDBPCB) having as a nucleus benzotriazole comprising an azole radical bound to a benzene ring, to which a phenyl radical is bound, or a diphenylacrylate such as ethyl-2-cyano-3,3-di-phenylacrylate (ECDPA).

Moment activators have their own dipole moment. The magnitude of dipole moment in a base material containing a moment activator is subject to the working temperature as well as the type and magnitude of energy applied to the base material. Accordingly, a moment activator to be blended in a base material should be selected so as to provide the largest possible magnitude of dipole moment in the base material, considering the working temperature and the type and magnitude of energy to be applied. When a polymer material is used as the base material for a vibration damping or sound absorptive material, it is important to select a moment activator to be blended in the base material considering the compatibility of both, or their respective SP values, which should advantageously be close for a better miscibility.

An energy conversion product according to this invention can be provided by blending a selected base material and selected moment activator and optionally additives such as a filler or dye, and molding or spinning the mixture into a film, fibrous or block material. Conventional blending and molding or spinning means can be utilized.

BEST MODE FOR CARRYING OUT THE INVENTION

Energy conversion compositions according to the present invention are now described in detail. First, a vibration damping material of this invention is described. The vibration damping material according to this invention includes a moment activator in its base material in an amount of 10 to 100 parts by weight in 100 parts by weight of the base material.

The base material is not limited to but may be a polymer material such as polyvinyl chloride, polyethylene, polypropylene, ethylene-vinyl acetate copolymer, polymethyl methacrylate, polyvinylidene fluoride, polyisoprene, polystyrene, styrene-butadiene-acrylonitrile copolymer, styrene-acrylonitrile copolymer, acrylonitrile-butadiene rubber (NBR), styrene-butadiene rubber (SBR), butadiene rubber (BR), natural rubber (NR), isoprene rubber (IR), or their selected blend. Polyvinyl chloride is preferred for its workability and low cost.

Figure 1:
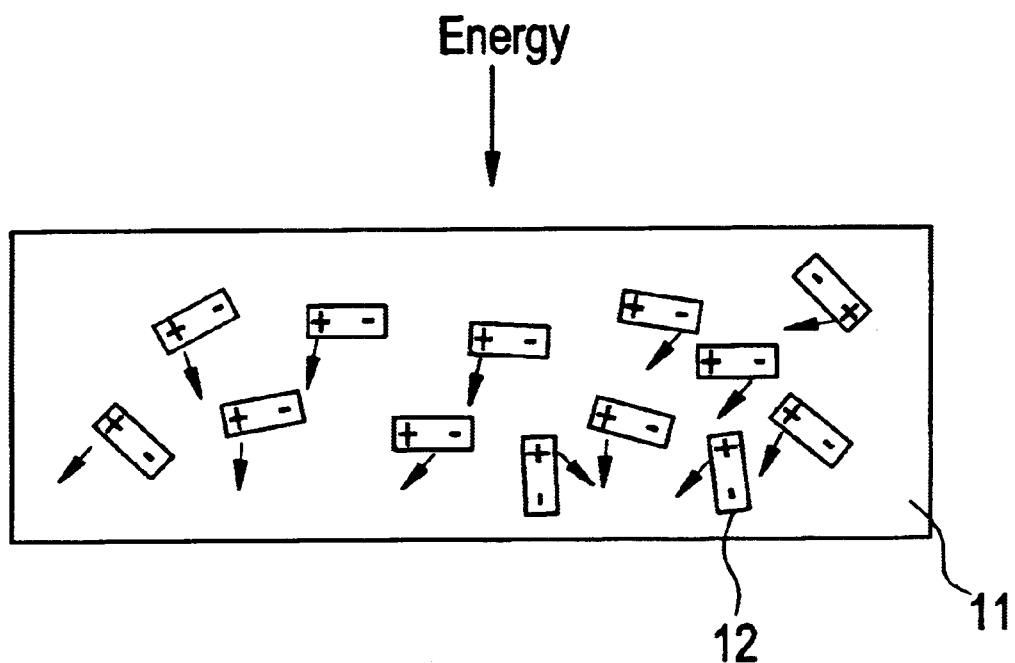
FIG. 1 is a schematic drawing showing a state of dipoles in a base material.
Figure 2:
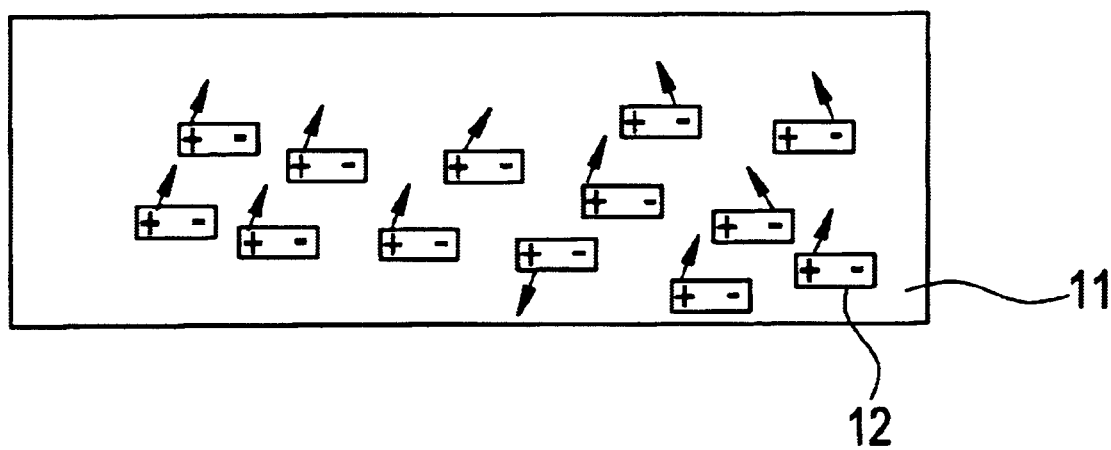
FIG. 2 is a schematic drawing showing a state of the dipoles in the base material after subjection to energy.
Figure 3:
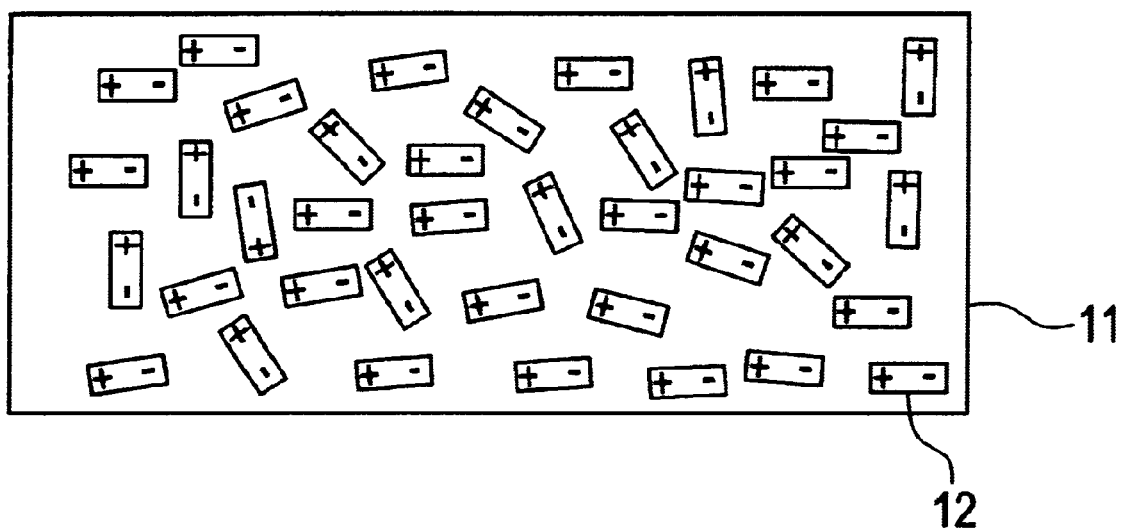
FIG. 3 is a schematic drawing showing a state of dipoles in a base material where a moment activator is blended.

The relationship between the magnitude of dipole moment and the vibration energy absorption property is described. FIG. 1 shows a natural state or original orientation of dipoles 12 in a base material 11 prior to the transfer of a vibration energy thereto. In this state, the dipoles 12 are stable. However, when a vibration energy is transferred to the base material, the dipoles 12 in the base material 11 are displaced into an unstable state such as shown in FIG. 2. The dipoles 12 in the base material 11 are prompted to return to a stable state such as shown in FIG. 1.

There is involved an energy consumption there. The vibration energy is assumed to be absorbed or damped through the consumption of energy provided by that displacement and recovery of the dipoles in the base material 11.

Based on this vibration energy consumption, the damping capability of the base material 11 can be improved by increasing the magnitude of dipole moment in the base material 11. Accordingly, a base material inherently capable of providing large dipole moment in the molecules should be selected so as to provide a high vibration energy absorption capability.

A base material inherently capable of providing a large magnitude of dipole moment may be a polarity polymer such as polyvinyl chloride, chlorinated polyethylene, acrylic rubber (ACR), acrylonitrile-butadiene rubber (NBR), styrene-butadiene rubber (SBR), or chloroprene rubber (CR). Such polarity polymers can also inherently provide considerable mechanical strength and workability.

As such a vibration damping material can be used on automobiles, interior materials, construction materials, and electric appliances, it is important to maximize the vibration energy damping capability at operating temperatures (operating temperature region of −20° C. to 40° C.).

To maximize the vibration energy absorption capability in the operating temperature region, this invention proposes use of a polymer such as polyvinyl chloride, polyethylene, polypropylene, ethylene-vinyl acetate copolymer, polymethyl methacrylate, polyvinylidene fluoride, polyisoprene, polystyrene, styrene-butadiene-acrylonitrile copolymer, or styrene-acrylonitrile copolymer, to which a plasticizer such as di-2-ethylhexalphthalate (DOP), dibutylphthalate (DBP), or diisononylphthalate (DINP) is added to shift their glass transition point or temperature (Tg) into the operating temperature region, or a polymer having a glass transition point within the operating temperature region itself such as acrylic rubber (ACR), acrylonitrile-butadiene rubber (NBR), styrene-butadiene rubber (SBR), butadiene rubber (BR), natural rubber (NR), isoprene rubber (IR), chloroprene rubber (CR), or chlorinated polyethylene.

In selecting an appropriate polymer for the base material of a vibration absorber or damper of the present invention, usability, moldability, availability, temperature property such as heat and cold resistance, weatherability, and price should also be taken into consideration.

The base material includes a moment activator in an amount of 10 to 100 parts by weight in 100 parts by weight of the base material, which can promote dipole moment in the base material. The moment activator may be a compound having a benzothiazyl or benzotriazyl radical or a diphenylacrylate radical such as ethyl-2-cyano-3,3-diphenylacrylate.

To improve the vibration energy absorption capability, mica scales, glass pieces, carbon fibers, calcium carbonate, barite, or precipitated barium sulfate may be optionally blended in the base material.

A vibration absorber of the present invention can be provided by mixing such a base material and a moment activator, with an optional addition of such a filler, by a conventional melting and mixing apparatus such as a heat roll, Banbury mixer, two-axis kneader, or extruder.

Such a vibration damping material containing a moment activator can significantly promote dipole moment in the base material and provide an excellently improved vibration energy absorption capability. Dipole moment in the vibration damping material may be defined as the difference in dielectric constant (∈') between A and B shown in FIG. 4. Therefore, dipole moment increases as the difference in dielectric constant (∈') between A and B increases.

Figure 4:
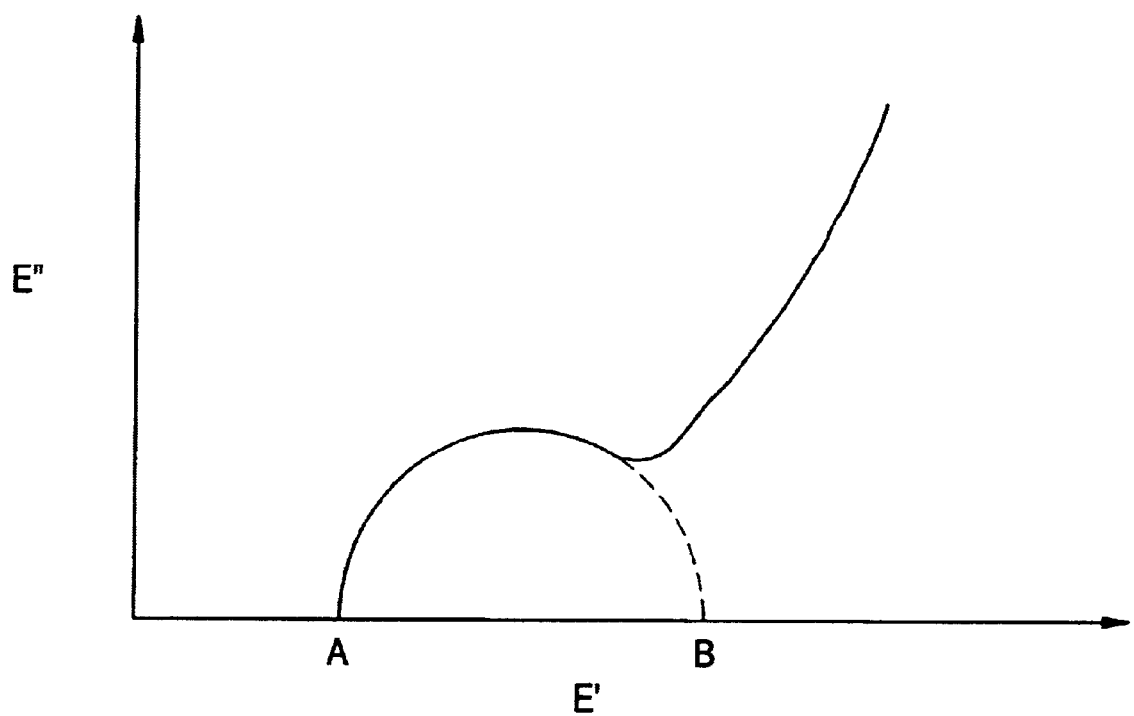
FIG. 4 is a graph showing a relationship between the dielectric constant ($\in'$) and dielectric loss factor ($\in''$) in a base material.

FIG. 4 is a graph showing a relationship between the dielectric constant (∈') and dielectric loss factor (∈"). The relationship between the dielectric constant (∈') and dielectric loss factor (∈") is given as follows: Dielectric Loss Factor (∈")=Dielectric Constant (∈')×Dielectric Loss Tangent (tan δ).

Through a lengthy research on vibration damping materials, the inventors have discovered that the vibration energy absorption capability can be improved by increasing the dielectric loss factor (∈"). The dielectric loss tangent (tan δ) indicating an electronic property of polymers is directly related to the elastic tangent (tan δ) indicating dynamic elasticity.

Through tests on the dielectric loss factor (∈") of the vibration damping materials, the inventors have also found that when the dielectric loss factor is 50 or over at the frequency of 110 Hz, the damping materials have a high elastic tangent (tan δ) and provide an excellent vibration energy absorption capability.

Thanks to such an excellent vibration absorption capability, the vibration damping materials of the present invention can be advantageously utilized as an unconstrained vibration damper.

Vibration dampers are categorized in two types, constrained and unconstrained. An unconstrained type of vibration dampers absorb or damp vibration energy through vibrations of a viscoelastic layer (macromolecular layer) provided by the vibration deformation of a plate member such as a steel plate and/or through frictional energy consumption.

Figure 57:
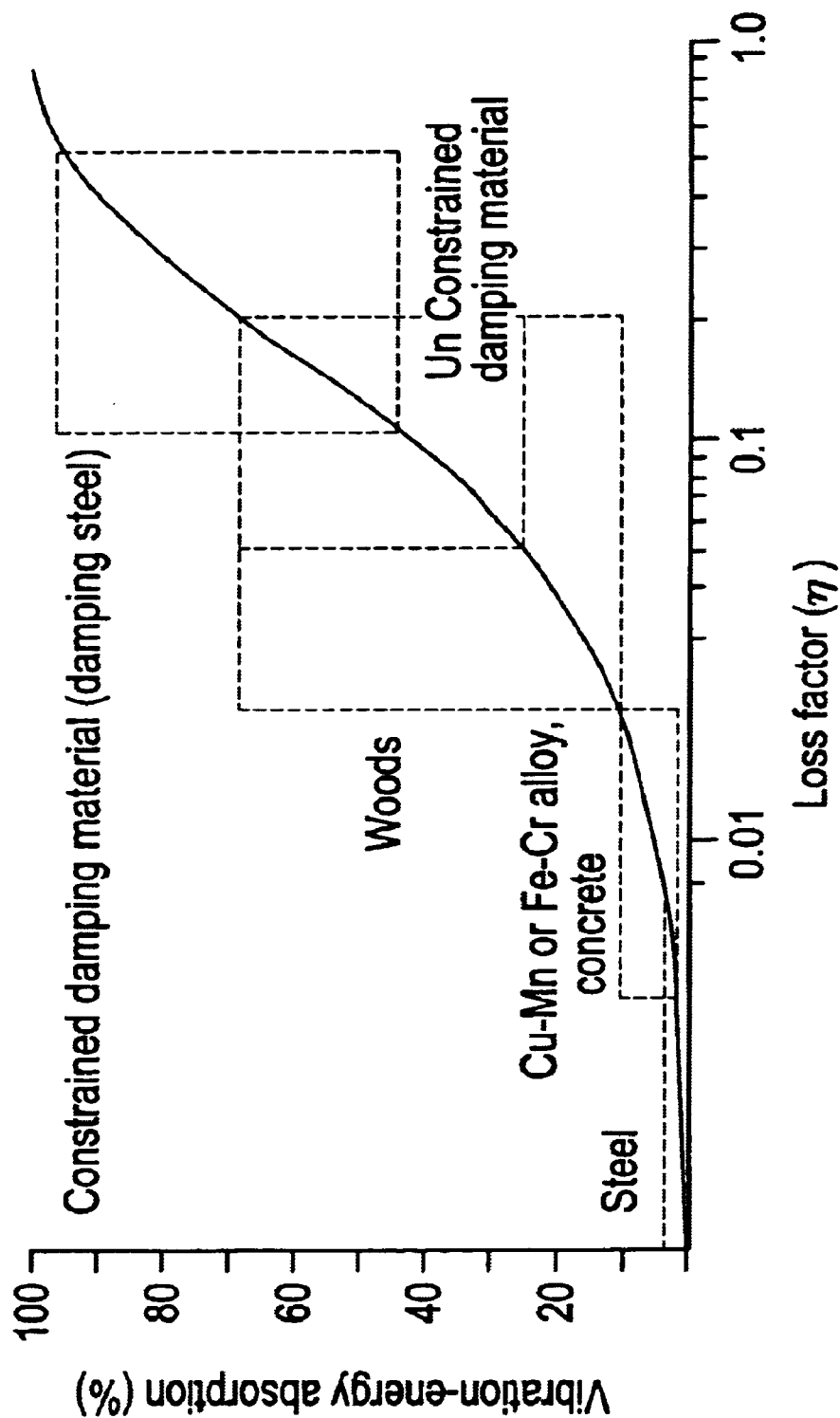
FIG. 57 is a graph showing a relationship between the loss factor and vibration energy absorption rate of conventional unconstrained and constrained vibration dampers.

Conventional unconstrained vibration dampers do not provide a loss factor (η) 0.1 or greater as shown in FIG. 57. To provide such a loss factor, a conventional damper will necessarily become very thick or need be constrained by sandwiching the damper material with a substrate and a constraining layer.

A thick unconstrained vibration damper may provide an improved vibration energy absorption capability, however, it is technically hard to process such a thick material such as by cutting or bending it to a desired size and shape. In addition, such a thick vibration damper cannot easily be fixed on an application site.

Conversion of such a conventional vibration damping material into a constrained type vibration damper requires a considerable cost, which will be rather heavy in weight anyway.

A vibration damping material of the present invention can appropriately solve such technical shortcomings of conventional vibration damping materials. The unconstrained vibration damper of the present invention is capable of providing vibration energy absorption which is comparable with that provided by conventional constrained vibration dampers, and is much lighter and thinner than those conventional dampers.

The unconstrained vibration damper of the present invention contains in its base material a moment activator which can promote dipole moment in an amount of 101 to 500 parts by weight in 100 parts by weight of the base material.

The relationship between the dipole moment and vibration energy absorption capability is described. FIG. 1 shows an original state of dipoles 12 in a base material 11 prior to the transfer of a vibration energy thereon. In this arrangement, the dipoles 12 are stable.

When a vibration energy is transferred to the base material 11, the dipoles 12 in the base material 11 are displaced as shown in FIG. 2 and held unstable. The dipoles 12 are then prompted to return to a stable state such as shown in FIG. 1.

The vibration energy is assumed to be absorbed or damped through that process of energy consumption by the dipoles 12 in the base material 11.

Based on this assumption of vibration damping, the vibration damping capability of the base material 11 can be improved by increasing the magnitude of dipole moment in the base material 11. Accordingly, a polymer inherently given a large dipole moment in the molecules can be advantageously used to provide high vibration energy absorption.

Polymers whose molecules can inherently provide a large dipole moment are polarity polymers such as polyvinyl chloride, chlorinated polyethylene, acrylic rubber (ACR), acrylonitrile-butadiene rubber (NBR), styrene-butadiene rubber (SBR), and chloroprene rubber (CR). Such a polarity polymer provides an excellent mechanical strength and is easy to process.

As the unconstrained vibration damper of the present invention may be advantageously utilized on automobiles, interior materials, construction materials, or electric appliances, it is essential to maximize the vibration energy damping capability in their operating temperature range.

To maximize the vibration energy absorption capability within the operating temperature range, a polymer which has or will have a glass transition point in the operating temperature range should advantageously be used as a base material. Such polymers are polyvinyl chloride, polyethylene, polypropylene, ethylene-vinyl acetate copolymer, polymethyl methacrylate, polyvinylidene fluoride, polyisoprene, polystyrene, styrene-butadiene-acrylonitrile copolymer, and styrene-acrylonitrile copolymer, to which a plasticizer such as di-2-ethylhexalphthalate (DOP), dibutylphthalate (DBP), or diisononylphthalate (DINP) is added to shift their glass transition point or temperature (Tg) into the operating temperature range of −20° C. to 40° C., or polymers such as acrylic rubber (ACR), acrylonitrile-butadiene rubber (NBR), styrene-butadiene rubber (SBR), butadiene rubber (BR), natural rubber (NR), isoprene rubber (IR), chloroprene rubber (CR), and chlorinated polyethylene which themselves inherently have a glass transition point (Tg) in the operating temperature range.

In selecting an appropriate polymer for the base material of a vibration damper of the present invention, not only the magnitude of dipole moment and the operating temperature range but also usability, moldability, availability, temperature property, weatherability, and price are to be taken into consideration.

The base material is provided with a moment activator of a compound or compounds selected from among compounds containing a benzothiazyl or benzothiazyl radical, or a diphenylacrylate radical, such as ethyl-2-cyano-3,3-diphenylacrylate.

101 to 500 parts by weight of a moment activator is blended in 100 parts by weight of a base material. If less than 101 parts by weight of a moment activator is mixed, the moment activator will not provide a sufficient dipole moment promotion, whereas if more than 500 parts by weight of a moment activator is blended, insufficient miscibility with the base material will result.

To select an appropriate moment activator to be blended into a base material, the miscibility (SP value) between the moment activator and the base material should be taken into due consideration. The SP value of the moment activator and that of the base material should be close enough to each other for desirable blending.

The magnitude of dipole moment in the base material is subject to the base material component or components and the moment activator. The magnitude is also subject to the working temperature and the magnitude of energy transferred to the base material. Accordingly, the base material and the moment activator to be blended into the base material should be selected so as to provide the largest possible dipole moment for a probable operation temperature range and magnitude of vibration energy to be applied.

A moment activator comprising a plurality of different compounds or different moment activators may be blended in a base material, in which case two or more types of moment activators having substantially different glass transition points may advantageously be used to expand the effective working temperature zone by combining their respective working temperature ranges. Such moment activators may be selected from among the combinations of DCHP and DCHBSA or DCHP, DCHBSA and ECDPA for a base material of polyvinyl chloride.

In addition to such a moment activator, a filler or fillers such as mica scales, glass pieces, carbon fibers, calcium carbonate, barite, or precipitated barium sulfate may be blended in the base material to further improve the vibration absorption capability of the base material. Preferably, 20 to 80 parts by weight of a filler or fillers are blended in the base material. When less than 20 parts by weight of such a filler is blended, the filler will not sufficiently improve the vibration absorption capability, whereas if more than 80 parts by weight of such a filler is blended, the filler will not blend well in the base material or will reduce the mechanical strength of the vibration damping product.

The unconstrained vibration damper of the present invention can be obtained by mixing a base material and a moment activator and optionally a filler by a conventional melt/mix apparatus such as a heat roll, Banbury mixer, two-axis kneader, or extruder.

As described above, the moment activator blended in the base material of the unconstrained vibration damper of the present invention can significantly promote dipole moment in the base material and provide an excellent vibration energy absorption effect. The magnitude of dipole moment in the unconstrained vibration damper is given as the difference in dielectric constant ($\in'$) between A and B shown in FIG. 4. Dipole moment increases as the difference in dielectric constant ($\in'$) between A and B shown in FIG. 4 increases.

FIG. 4 is a graph showing a relationship between the dielectric constant ($\in'$) and the dielectric loss factor ($\in''$). The relationship between the dielectric constant ($\in'$) and the dielectric loss factor ($\in''$) is given as follows: Dielectric Loss Factor ($\in''$)=Dielectric Constant ($\in'$)×Dielectric Loss Tangent (tan δ).

Through a lengthy research on unconstrained types of vibration dampers, the inventors have found that the loss factor ($\eta$) increases as the dielectric loss factor ($\in''$) increases. The dielectric loss factor ($\in''$) indicating an electronic property of polymers is correlated with the loss factor ($\eta$) indicating a dynamic characteristic.

Testing on the dielectric loss factor ($\in''$) of the unconstrained vibration dampers, the inventors have found that when the dielectric loss factor is 50 or larger at 110 Hz, the unconstrained vibration damping material has an excellent loss factor (h) and provides excellent vibration energy absorption.

The vibration damping materials described above can also be utilized as vibration damping or absorptive paints.

Conventionally vibration damping sheets are applied on automobiles, interior materials, construction materials, and electric appliances where vibrations are inherent.

Such a vibration damping sheet is first cut to a size and shape corresponding to an application site, which is often manually mounted on the application site using an adhesive. The application of such a vibration damper on a curbed portion or narrow gap is time consuming and problematical.

In view of such disadvantages, conventional vibration damping paints have recently been proposed, in which mica scales are mixed in the paint base material usually of a viscoelastic polymer such as rubber, plastic or asphalt. Such conventional vibration damping paints provide a damping layer by spraying or brushing means without requiring problematical cutting or sticking on even curbed surfaces or in narrow gaps. As spray application is possible, a robot can be introduced to perform the application operation, substantially improving work efficiency and lowering cost.

Despite these advantages, as the thickness of the conventional vibration damping films or layers provided with such a damping paint are limited to 2 mm or so, the films cannot not provide sufficient and substantial vibration damping.

The vibration damping paint prepared according to the present invention can solve such a technical weakness and provide a thin but excellent vibration damping layer or film.

The vibration damping paint according to this invention includes a moment activator in the base material, which can promote dipole moment in the paint.

The relationship between the dipole moment and vibration energy absorption capability is explained. FIG. 1 shows an arrangement of dipoles 12 in a vibration damping layer (base material) 11 prior to the transfer of a vibration energy thereon. Here, the dipoles 12 are held stable. However, when a vibration energy is transferred to the damping layer 11, the dipoles 12 in the layer 11 are displaced into an unstable state such as shown in FIG. 2. The dipoles 12 then are prompted to move or return to a stable state such as shown in FIG. 1.

There occurs energy consumption in the process. The vibration energy is greatly absorbed through that energy consumption process provided by the displacement and recovery of the dipoles 12 in the damping film or base material 11.

The vibration damping capability of the damping layer 11 can be improved by promoting dipole moment in the damping film 11. Accordingly, a material which can inherently provide large dipole moment in the molecules should be used for the base material of the vibration damping paint.

Such a material may be a polarity polymer such as polyvinyl chloride, chlorinated polyethylene, acrylic rubber (ACR), acrylonitrile-butadiene rubber (NBR), styrene-butadiene rubber (SBR), or chloroprene rubber (CR).

Since the vibration damping paint according to this invention is likely applied on automobiles, interior materials, construction materials, and electric appliances, it is essential that the vibration energy damping capability is maximized in the operation temperature range or −20 C. to 40 C.

To maximize the vibration energy absorption capability in the operation temperature range, this invention proposes that a polymer or polymers which will have a glass transition point in the operating temperature region be used as the base material, such as polyvinyl chloride, polyethylene, polypropylene, ethylene-vinyl acetate copolymer, polymethyl methacrylate, polyvinylidene fluoride, polyisoprene, polystyrene, styrene-butadiene-acrylonitrile copolymer, and/or styrene-acrylonitrile copolymer, to which a plasticizer such as di-2-ethylhexalphthalate (DOP), dibutylphthalate (DBP), or diisononylphthalate (DINP) is added to shift their glass transition point (Tg) into the operating temperature range of −20 C. to 40 C., or a polymer or polymers which inherently have a glass transition point there, such as acrylic rubber (ACR), acrylonitrile-butadiene rubber (NBR), styrene-butadiene rubber (SBR), butadiene rubber (BR), natural rubber (NR), isoprene rubber (IR), chloroprene rubber (CR), and/or chlorinated polyethylene.

Besides the above compounds, other materials such as polyurethane or asphalt materials which are conventionally used as vibration damping paint base materials can be blended as well.

In selecting an appropriate base material for a vibration damping paint, not only the magnitude of dipole moment and the operating temperature region but also usability, easiness to process, availability, temperature property, weatherability, and price are to be duly considered.

The moment activator to be blended in the base material is advantageously selected from compounds containing a benzothiazyl or benzothiazyl radical or compounds containing a diphenylacrylate radical such as ethyl-2-cyano-3,3-diphenylacrylate.

Preferably, 10 to 100 parts by weight of a moment activator is blended in 100 parts by weight of a base material. If less than 10 parts by weight is mixed, the dipole moment will not be sufficiently promoted, whereas more than 100 parts by weight will lead to insufficient miscibility with the base material and thus insufficient durability or integrity.

To select an appropriate moment activator to be blended in the paint, the miscibility between the moment activator and the paint base material should be excellent, or both SP values should be close enough to each other.

The magnitude of dipole moment depends on the paint base material and moment activator used. The magnitude of dipole moment also varies with the operating temperature and is affected by the magnitude of energy transferred to the vibration damping paint layer. Accordingly, the paint base material and moment activator should be selected appropriately to provide the largest possible dipole moment by considering the expected working temperature and magnitude of vibration energy.

A plurality of different moment activators or a moment activator comprising a plurality of activating compounds may be blended in a base material, in which case it is advantageous that they respectively have sufficiently different glass transition points so as to expand the workable or effective temperature region. Such moment activators may be selected from the combinations of DCHP and DCHBSA or DCHP, DCHBSA and ECDPA for a base material of polyvinyl chloride.

In addition, a filler or fillers such as mica scales, glass pieces, glass fibers, carbon fibers, calcium carbonate, barite, or precipitated barium sulfate may be selectively and optionally blended into the base material to further improve the absorption capability and increase the mechanical integrity of the vibration damping paint.

Preferably, 10 to 90 parts by weight of a filler is blended in 100 parts by weight of the base material. Less than 10 parts by weight will not sufficiently improve the absorption capability, whereas more than 90 parts by weight will be impractical as the integrity of the base material will be weakened.

The vibration damping paint according to this invention may be provided in an emulsion form by mixing the paint material and moment activator and an optional filler and dispersing the mixture in water or alcohol. Other materials such as a dispersing agent, wetting agent, thickener, antifoaming agent, or colorant may be optionally added.

To use such vibration damping paints, a conventional air spray gun, airless spray gun, or brush may be used.

As described above, a moment activator is blended in a vibration damping paint base material to significantly promote dipole moment in the paint and provide an excellently improved vibration energy absorption capability. The magnitude of dipole moment in the damping paint is represented by the difference in dielectric constant (∈') between A and B shown in FIG. 4. The magnitude of dipole moment increases as the difference in dielectric constant (∈') between A and B increases.

FIG. 4 shows a relationship between the dielectric constant (∈') and the dielectric loss factor (∈"), which is given as follows: Dielectric Loss Factor (∈")=Dielectric Constant (∈')×Dielectric Loss Tangent (tan δ).

The inventors have discovered that both the loss factor (η) and the loss tangent (tan δ) increase as the dielectric loss factor (∈") increases. That is, the dielectric loss factor (∈") indicating an electronic property of polymers is correlated with the loss factor (η) and loss tangent (tan δ) indicating dynamic characteristics.

Tests on the dielectric loss factor (∈") of those vibration damping paints have proved that when the dielectric loss factor is 50 or larger at the frequency of 110 Hz, a vibration damping layer formed with those damping paints provides an excellently improved loss factor (h) and loss tangent (tand), thus an excellent vibration energy absorption capability.

Next, sound or noise absorptive materials of the present invention are described.

Conventional sound absorptive or damping materials are prepared of rock fibers, glass wool, or open cell foam polyurethane moldings, often covered with a film material. In such a sound absorptive material, an acoustic energy hits and passes through the fibrous or porous surface, and loses its energy as heat through friction therewith. Accordingly, how to increase surface acoustic resistance of the fibrous or porous surface was a main concern to improve the sound damping of such conventional sound absorptive materials.

Such a conventional sound absorptive material need be relatively thick to provide sufficient sound absorption, particularly to effectively damp sound of a low frequency such as 1,000 Hz or less, or 500 Hz or less in particular. However, the thickness cannot be increased without inviting various accompanying shortcomings.

Sound absorptive materials according to this invention can provide, even when made very thin, excellent absorption of sound or noise including sound of a low frequency such as 1,000 Hz or less, or even 500 Hz or less.

The sound absorptive material of the present invention may be made into a sound absorptive film, fiber (strands), foam, paper, and molding. The sound absorptive material of the present invention includes a moment activator (or activators) which can promote dipole moment in its base material.

The base material may be a polymer material such as polyvinyl chloride, polyethylene, polypropylene, ethylene-vinyl acetate copolymer, polymethyl methacrylate, polyvinylidene fluoride, polyisoprene, polystyrene, styrene-butadiene-acrylonitrile copolymer, styrene-acrylonitrile copolymer, polyester, polyurethane, polyamide, polyvinylidene, polyacrylonitrile, polyvinylalcohol, cellulose, acrylonitrile-butadiene rubber (NBR), styrene-butadiene rubber (SBR), butadiene rubber (BR), natural rubber (NR), isoprene rubber (IR), or their selected mixture.

Sound hits and passes through the fibrous or porous surface and is excellently damped through conversion into frictional heat.

The sound energy is further damped when the sound collides against the base material. The dipoles 12 in the base material 11 as shown in FIG. 1 are displaced to a state such as shown in FIG. 2 by rotation or shifting of phase within the base material 11.

Prior to the application of a sound energy, the dipoles 12 in the base material 11 are stable, however, the collision of the sound causes displacement of the dipoles 12 into an unstable state.

The dipoles 12 are then prompted to go back to a stable state.

Energy is then consumed. The sound absorption function is provided through the generation of frictional heat on the surface of the base material and the consumption of energy by the displacement and recovery of the dipoles 12 within the base material 11.

Sound absorption provided by the present invention is assumed to be associated with both the magnitude of surface resistance per unit area of the base material (as in conventional sound absorptive materials) and the magnitude of the dipole moment provided in the base material 11. The inventors' experiment has shown that the sound damping capability of the base material 11 is improved by increasing the magnitude of dipole moment in the base material 11.

The magnitude of dipole moment is subject to the base material, though, even if the same polymer material is used, the magnitude of the dipole moment to be provided in the base material varies with the operation temperature and the frequency of sound. The magnitude of dipole moment is also affected by the magnitude of sound energy applied to the base material. Thus, the polymer for the base material should be selected so as to provide the largest possible magnitude of dipole moment, considering the probable working temperature, frequency of sound, and magnitude of sound energy for a particular application of the sound damping material of the present invention.

To choose an appropriate polymer for the base material, not only the magnitude of dipole moment in the base material but also usability, moldability, availability, temperature property, weatherability, and price should be duly considered in accordance with a particular application.

The sound absorptive material according to this invention contains in the base material a moment activator which can significantly promote dipole moment in the base material.

The moment activator is a compound or compounds containing a benzothiazyl or benzothiazyl radical or a diphenylacrylate radical such as ethyl-2-cyano-3,3-diphenylacrylate.

The sound absorptive material may be obtained by mixing an appropriately selected base material and such a moment activator with an optional corrosion inhibitor or dye as desired, and molding or spinning the mixture into films, fibers or blocks. A conventional molder or spinner may be used to provide the sound absorptive products of the present invention.

In the sound absorptive material containing a moment activator, the magnitude of dipole moment in the base material significantly increases and provides excellent damping of sound energy.

The magnitude of dipole moment is defined as the difference in dielectric constant (∈') between A and B shown in FIG. 4.

The magnitude of dipole moment increases as the difference in dielectric constant (∈') between A and B increases.

FIG. 4 shows a relationship between the dielectric constant (∈') and the dielectric loss factor (∈"). The relationship between the dielectric constant (∈') and the dielectric loss factor (∈") is given as follows: Dielectric Loss Factor (∈")=Dielectric Constant (∈')×Dielectric Loss Tangent (tan δ).

A strenuous research on sound absorptive materials, the inventors have found that the energy absorption capability can be greatly improved by increasing the dielectric loss factor ($\in''$).

Through study on the dielectric loss factor ($\in''$) of sound absorptive materials, the inventors have also discovered that excellent energy absorption is provided when the dielectric loss factor is 7 or greater at 110 Hz.

The sound absorption material according to the present invention can be used as a sound absorptive sheet which may be used as Japanese slide door paper, wall paper or ceiling cloth.

Conventional sound absorptive sheets incorporate rock fibers, glass wool or felt. In such a conventional sound absorptive sheet, sound is damped through conversion into frictional heat.

The surface acoustic resistance of the component fibers of the conventional sound absorptive sheet can be improved somewhat, however, such a conventional sound absorptive sheet is required to have a thickness of 5 or 10 mm, or even 20 to 30 mm to provide sufficient noise damping. Thus, such a thick material has been utilized as a back-filling material for doors, walls or ceiling panels, not directly as door paper, wall paper or ceiling cloth.

The sound absorptive sheet according to this invention can effectively solve the shortcomings and can be utilized directly as a sheet of paper or cloth.

The sound absorptive sheet of the present invention may take a form of a fibrous sheet on which a polymer material is deposited. Although this sheet is thin like paper, it can provide sufficient sound absorption.

Such a fibrous sheet may be any sheet composed of fibers of the present invention. A non-woven fabric may be advantageously utilized.

An appropriate polymer material or materials to be used as a base material of the present invention are blended with a moment activator which can magnify the dipole moment in the base material.

The relationship between the magnitude of dipole moment and the sound absorption capability is described again hereunder. FIG. 1 shows an exemplary arrangement of dipoles 12 in a polymer material (base material) 11 prior to application of a sound energy.

The arrangement of the dipoles 12 is stable. A sound energy displaces the dipoles 12 in the base material 11 into an unstable state such as shown in FIG. 2, which are prompted to return to a stable state.

Sound energy consumption takes place then. The sound absorption capability unique to the present invention seems provided by this consumption of energy provided through the displacement and recovery of the dipoles 12 in the polymer material or base material 11.

Based on this theory of sound absorption, the sound absorption capability of the polymer material 11 can be improved by increasing the magnitude of dipole moment in the polymer material 11. Accordingly, it is advantageous to use a polymer material inherently having a large dipole moment in the molecules so as to provide improved sound absorption.

Polarity polymers can provide a large magnitude of dipole moment. Such polarity polymers may be polyvinyl chloride, chlorinated polyethylene, acrylic rubber (ACR), acrylonitrile-butadiene rubber (NBR), styrene-butadiene rubber (SBR), and chloroprene rubber (CR). Such a polarity polymer can provide an excellent mechanical strength and is easy to process.

The sound absorptive sheet according to this invention may be used as door paper, wall paper or ceiling cloth, so it is advantageous to maximize the sound absorption capability in the operating temperature region or −20 C. to 40 C.

To maximize the sound absorption capability in the operating temperature region, the sound absorptive sheet according to this invention selectively comprises a polymer or polymers which have a glass transition point falling in the operating temperature region, such as polyvinyl chloride, polyethylene, polypropylene, ethylene-vinyl acetate copolymer, polymethyl methacrylate, polyvinylidene fluoride, polyisoprene, polystyrene, styrene-butadiene-acrylonitrile copolymer, and styrene-acrylonitrile copolymer, to which a plasticizer such as di-2-ethylhexalphthalate (DOP), dibutylphthalate (DBP), or diisononylphthalate (DINP) is added to shift the glass transition point (Tg) into the operating temperature region of −20 C. to 40 C., or polymers such as acrylic rubber (ACR), acrylonitrile-butadiene rubber (NBR), styrene-butadiene rubber (SBR), butadiene rubber (BR), natural rubber (NR), isoprene rubber (IR), chloroprene rubber (CR), and chlorinated polyethylene which themselves have a glass transition point (Tg) in the operating temperature region of −20 C. to 40 C.

In selecting an appropriate polymer material, not only the magnitude of dipole moment and the operating temperature region but also usability, moldability, availability, temperature property, weatherability, and price are to be duly considered for a particular usage.

The moment activator to be blended may be a single compound or a plurality of compounds selected from ones containing a benzothiazyl or benzothiazyl radical and ones containing a diphenylacrylate radical such as ethyl-2-cyano-3,3-di-phenylacrylate.

Preferably, 10 to 300 parts by weight of a moment activator is mixed in 100 parts by weight of a base polymer material. If less than 10 parts by weight is mixed, the addition of the moment activator will not provide sufficient promotion of dipole moment, whereas if more than 300 parts by weight of a moment activator is mixed, the moment activator will not sufficiently blend with the polymeric base material.

Accordingly, in selecting an appropriate moment activator to be blended, the miscibility between the moment activator and polymeric base material should appropriately be considered, or the SP values of both should be close enough to each other.

The magnitude of dipole moment is dependent on the polymer material and moment activator. The magnitude of dipole moment also varies with the operation temperature as well as affected by the magnitude of sound energy applied. Thus, the polymer base material and moment activator should be selected so as to provide the largest possible amount of dipole moment, taking the expected temperature and magnitude of sound energy into due consideration.

The sound absorptive sheet according to this invention can be provided in an emulsion form comprising a selected polymer material blended with a selected moment activator, which is provided on a fibrous base sheet. The amount of the polymer material deposited on the fibrous sheet is not particularly limited to but is preferably 20 to 300 g/m2, more preferably 40 to 200 g/m2. Less than 20 g/m2 of the polymer material deposited on the sheet will not provide sufficient sound absorption, whereas more than 300 g/m2 of the polymer material deposited on the sheet will give very poor appearance and degraded nature.

It is well known in the field of sound absorptive materials that the sound absorption capability of a sound absorptive material is subject to the frequency of sound. The sound absorptive sheet of the present invention can cope with various types of sounds by controlling its thickness or size. For example, for low frequencies, the thickness of the sound absorptive sheet is reduced and/or its area is increased. For high frequencies, the thickness of the sheet is increased and/or its area is reduced.

As described above, in the sound absorptive sheet of the present invention comprising a fibrous sheet on which are deposited a selected polymer base material and moment activator blended therewith, the magnitude of dipole moment in the polymer base material is significantly promoted and provides excellent sound absorption. The magnitude of dipole moment in the sound absorptive sheet is defined as the difference in dielectric constant ($\in'$) between A and B shown in FIG. 4. That is, the magnitude of dipole moment increases as the difference in dielectric constant ($\in'$) between A and B increases.

FIG. 4 is a graph showing a relationship between the dielectric constant ($\in'$) and the dielectric loss factor ($\in''$). The relationship between the dielectric constant ($\in'$) and the dielectric loss factor ($\in''$) is given as follows: Dielectric Loss Factor ($\in''$)=Dielectric Constant ($\in'$)×Dielectric Loss Tangent (tan $\delta$).

Through research on sound absorptive sheets, the inventors have discovered that the sound energy absorption capability can be improved by increasing the dielectric loss factor ($\in''$).

Studying the dielectric loss factor ($\in''$) of the sound absorptive sheets of the present invention, the inventors have found that the sheets provide excellently improved sound absorption when the dielectric loss factor is 7 or greater at the frequency of 110 Hz.

The sound absorptive material according to this invention can be incorporated into a foamed sound absorptive sheet to be applied on automobiles, interior materials, construction materials, or electric appliances.

Conventional foamed sound absorptive materials utilize foamed moldings provided by a polymer such as polyurethane, polyethylene, or polyvinyl chloride. When sound collides with such a conventional foamed sound absorptive material, vibrations are transmitted to the porous portions in the sound absorptive material, where the viscous friction of air takes place, partially converting the sound energy into heat, and providing damping of the sound energy.

A problem pertaining to such conventional foamed sound absorptive materials is that they do not provide sufficient damping for sounds of a frequency below 2,000 Hz.

To sufficiently absorb and damp a sound of a frequency below 2,000 Hz, a conventional foamed sound absorptive material needs to be thick, as thick as 3.4 cm for sound of 10 KHz and even 3.4 m for sound of 100 Hz, which has been impractical for application due to limitation of available space and cost.

Attempts have been made to promote the material density, expansion rate, or porosity rate of conventional foamed dampers to improve their damping capability to damp sounds of frequencies below 2,000 Hz. The improvement with such attempts have been only 20 to 30% at best. Provision of sufficient sound absorption has not been successful with conventional noise dampers.

Foamed sound absorptive materials according to this invention can appropriately cope with these shortcomings and sufficiently absorb sound of frequencies below 2,000 Hz.

A foamed sound damper of the present invention may be provided by foam molding. The foamed molding may be provided by foaming a polymer such as polyurethane, polyvinylalcohol, polyvinyl chloride, chlorinated polyethylene, polyethylene, polypropylene, ethylene-vinyl acetate copolymer, polymethyl methacrylate, polystyrene, styrene-butadinene-acrylonitrile copolymer, polyvinylformal, epoxy, phenol, urea, or silicon, or rubber polymer such as acryl rubber (ACR), acrylonitrile-butadinene rubber (NBR), styrene-butadinene rubber (SBR), butadiene rubber (BR), natural rubber (NR), isoprene rubber (IR), or chloroprene rubber (CR), by conventional bubbling means using a thermal decomposing foaming agent or volatile solvent, or by generating an inactive gas to be absorbed by the polymer under a high pressure and provide foaming under a normal pressure.

The expansion rate of such a foam may be arbitrarily controlled as desired for a particular application, while it is preferred to provide 5 to 50 times of expansion, more preferably 10 to 30 times the original polymer material. If this expansion rate is less than 5 times, the damping capability will be insufficient, whereas if this rate is more than 50 times, the mechanical strength will be sacrificed. The damping capability increases as the number of cells and density of the foamed molding increase. Thus, the expansion rate should be determined taking such factors into due consideration.

The foamed molding may have an open cell structure or closed cell structure depending on its particular application or the type of sound (high or low frequency).

The foamed sound absorber of the present invention contains a moment activator in its base material which can promote the magnitude of dipole moment in the product. The relationship between the magnitude of dipole moment and the sound absorption capability is again explained.

It is known that when sound collides against the foamed sound absorptive material, air vibrations are transmitted to the porous portions within the sound absorptive material, causing viscous friction of air within the porous portions, which partially converts the sound energy into heat energy, thereby providing partial sound damping.

The vibrations are attenuated by the resistance from air movement. The inventors have found that there is involved another excellent sound absorption that differs from the above sound absorption mechanism.

The inventors have focused their attention on the dipoles in the foamed molding which are subject to displacement and recovery when sound energy is applied thereon.

Details of the finding are given below. FIG. 1 shows dipoles 12 in a foamed molding (base material) 11 prior to the propagation of sound (sound energy). The dipoles 12 are stable there. When a sound energy is provided, the dipoles 12 are displaced in the foamed molding 11 into an unstable state as shown in FIG. 2, which are prompted to return to their stable state such as shown in FIG. 1.

Energy is greatly consumed during this process. The sound absorption capability unique with the invention is assumed to be provided through the consumption of energy through the displacement and recovery of the dipoles 12.

The foam of the present invention can provide excellent sound absorption through the consumption of sound energy provided by the viscous friction of air in the porous portions together with the displacement and recovery of the dipoles in the foamed material.

The sound absorption capability of the foamed molding 11 can be promoted by promoting the dipole moment.

Accordingly, it is essential to use a foam material inherently possessing large dipole moment in the molecules so as to provide a greatly improved sound absorption capability.

Such a material inherently possessing large dipole moment may be polarity polymers such as polyvinyl chloride, chlorinated polyethylene, acrylic rubber (ACR), acrylonitrile-butadiene rubber (NBR), styrene-butadiene rubber (SBR), and chloroprene rubber (CR). Such a polarity polymer is excellent in mechanical strength and is easy to process.

The foamed sound absorptive material according to this invention may be applied on automobiles, interior materials, construction materials, or electric appliances, so it is essential to maximize the sound absorption capability in the operating temperature range of −20 C. to 40 C.

To maximize the sound absorption capability in the operating temperature region, the foamed sound absorptive material according to this invention comprises a polymer which has or will have a glass transition point in the operating temperature region. A polymer which will have a glass transition point in the operating temperature region may be polyvinyl chloride, chlorinated polyethylene, polyethylene, polypropylene, ethylene-vinyl acetate copolymer, polymethyl methacrylate, polystyrene, or styrene-butadiene-acrylonitrile copolymer, to which a plasticizer such as di-2-ethylhexalphthalate (DOP), dibutylphthalate (DBP), or diisononylphthalate (DINP) is added to shift their glass transition point or temperature (Tg) into the operating temperature region of −20 C. to 40 C., or a rubber polymer such as acrylic rubber (ACR), acrylonitrile-butadiene rubber (NBR), styrene-butadiene rubber (SBR), butadiene rubber (BR), natural rubber (NR), isoprene rubber (IR), or chloroprene rubber (CR) which inherently has a glass transition point (Tg) in the operating temperature region of −20 C. to 40 C.

An appropriate polymer material should be selected considering not only the magnitude of dipole moment and the operating temperature region but also usability, moldability, availability, temperature property, weatherability, and price.

A moment activator to be blended with such a base polymer material may be selected from polymers containing a benzothiazyl or benzothiazyl radical and ones containing a diphenylacrylate radical such as ethyl-2-cyano-3,3-diphenylacrylate.

Preferably, 10 to 200 parts by weight of a moment activator is mixed in 100 parts by weight of a foaming polymer.

If less than 10 parts by weight of a moment activator is mixed, the addition of the moment activator will not sufficiently promote the dipole moment, whereas if more than 200 parts by weight is blended, insufficient miscibility with the foaming polymer will result.

To select an appropriate moment activator to be blended with a foaming polymer, the miscibility between the moment activator and the forming polymer should be considered, that is the SP values of both should be close enough.

The magnitude of dipole moment to be provided in the polymeric base material depends on the types of the moment activator and forming polymer.

The same materials will provide different magnitude of dipole moment when the working temperature is different. The magnitude of dipole moment is also affected by the magnitude of sound energy. Accordingly, the moment activator and foaming polymer should be selected so as to provide the largest possible magnitude of dipole moment considering those factors.

It is known in the field of sound absorptive materials that the sound absorption capability of a material is subject to the type of sound or frequency. Conventional foamed sound absorptive materials cope with different types of sound by increasing or reducing their thickness. For low frequencies, the thickness of the material is increased, while for high frequencies, the thickness of the material is reduced.

As described above, the moment activator is blended in a foaming polymer material to significantly increase the magnitude of dipole moment in the foamed molding to provide a greatly improved sound absorption capability. The magnitude of dipole moment in the foamed sound absorptive material (foamed molding) is defined as the difference in dielectric constant ($\in'$) between A and B shown in FIG. 4. That is, the magnitude of dipole moment increases as the difference in dielectric constant ($\in'$) between A and B increases.

FIG. 4 shows a relationship between the dielectric constant ($\in'$) and the dielectric loss factor ($\in''$). The relationship between the dielectric constant ($\in'$) and the dielectric loss factor ($\in''$) is given by the following equation: Dielectric Loss Factor ($\in''$)=Dielectric Constant ($\in'$)×Dielectric Loss Tangent (tanδ).

Through a lengthy research on foamed sound absorptive materials, the inventors have found that the sound energy absorption capability can be improved by increasing the dielectric loss factor ($\in''$).

Through study on the dielectric loss factor ($\in''$) of the foamed sound absorptive materials, the inventors have found that the materials provide excellently improved sound absorption when the dielectric loss factor is 10 or larger at the frequency of 110 Hz.

Although the foamed sound absorptive material according to this invention can provide excellent sound absorption alone, they may be fixedly deposited on a synthetic resin film of polyvinyl chloride, polyethylene, polypropylene, or polyethylene or a fibrous sheet of paper, cloth, or non-woven fabric, which provide combined sound damping of the synthetic resin film or fibrous sheet and the foamed sound absorptive material of the invention, further improving the sound absorption capability of the product.

The sound absorptive material according to this invention can be utilized as sound absorptive fiber or sound absorptive yam or fibrous material containing such fibers.

Conventional sound absorptive fibers or fibrous materials comprise rock wool, glass wool or felt. Such a conventional sound absorptive material damps sound energy through conversion into frictional heat provided on the fiber surface and through the fibers.

As conventional sound absorptive materials provide sound damping through such a process, sufficient sound absorption cannot be expected without increasing the thickness of the damper or fiber diameter, fiber length and/or fiber density. Therefore, a conventional sound damper tends to become thick and large to provide an effective performance, which cannot practically be used as door paper, wall paper, casings or covers for electric appliances.

Sound absorptive fibers, yarns and fibrous bodies according to this invention can adequately solve the above problem.

The fibers of the present invention themselves have an improved sound absorption capability.

The sound absorptive fibers of the present invention are characterized in that a moment activator is blended in the base polymer material, which can significantly promote dipole moment in the base polymer material. The polymer material of the fibers may be selected from polyolefine such as polyethylene, chlorinated polyethylene, polypropylene, polyester, and polyurethane, polyamide such as nylon 6, nylon 66, or nylon 12, polyvinyl chloride, polyvinylidene chloride, polyacrylonitrile, polyvinylalcohol, cellulose, and their derivatives.

Such a polymer is blended with a moment activator which can increase the magnitude of dipole moment in the polymer. The relationship between the magnitude of dipole moment and the sound absorption capability is again explained. The mechanism of sound absorption by the sound absorptive fibers is that when a sound collides and passes though the fibrous surface, sound energy is partially consumed as frictional heat and damped. The inventors have found that there is involved another significant sound absorption mechanism that differs from the above known sound absorption mechanism. The dipoles in the base polymer are displaced into an unstable state and then return to a stable state, consuming substantial energy.

Further details are given below. FIG. 1 shows an arrangement of dipoles 12 in a base polymer (base material) 11 prior to the propagation of a sound or sound energy. The arrangement of the dipoles 12 is stable there. When a sound propagates onto the base polymer, the dipoles 12 in the polymer are displaced into an unstable state, which are prompted to return to a stable state.

Substantial energy is then consumed. The sound absorption of the present invention is assumed to be additionally provided through that consumption of energy provided by the displacement and recovery of the dipoles 12 in the base polymer 11.

Accordingly, the sound absorption capability of the base polymer 11 can be improved by increasing the magnitude of dipole moment in the polymer 11. Thus, a polymer inherently has a large magnitude of dipole moment in the molecules can provide an improved sound absorption capability. A polymer which can inherently provide a large magnitude of dipole moment may be a polarity polymer such as polyvinyl chloride, chlorinated polyethylene, polyurethane, polyamide, polyvinylidene chloride, polyacrylonitrile, or cellulose.

Sound absorptive fibers according to this invention can be used in varied ways, so it is essential to maximize the sound absorption capability in the operating temperature range or −20 C. to 40 C.

To maximize the sound absorption capability within the operating temperature region, the sound absorptive fibers according to this invention comprise a polymer which has or will have a glass transition point in the operating temperature region. Polymers which will have a glass transition point in the operating temperature region may be polyvinyl chloride, polyethylene, or polypropylene, to which a plasticizer such as di-2-ethylhexalphthalate (DOP), dibutylphthalate (DBP), or diisononylphthalate (DINP) is blended to shift their glass transition point or temperature (Tg) into the operating temperature region of −20 C. to 40 C., or polymers such as chlorinated polyethylene or polyurethane which inherently have a glass transition point (Tg) in the operating temperature region of −20 C. to 40 C.

In selecting an appropriate polymer, not only the magnitude of dipole moment in the molecules of the base material and the operating temperature region but also usability, moldability, availability, temperature property, weatherability, and price should be appropriately considered.

A moment activator to be blended with such a polymer may be a polymer containing a benzothiazyl or benzothiazyl radical, or a diphenylacrylate radical such as ethyl-2-cyano-3,3-di-phenylacrylate. Preferably, 10 to 200 parts by weight of a moment activator is mixed in 100 parts by weight of a base polymer. If less than 10 parts by weight is mixed, poor improvement will result, whereas if more than 200 parts by weight is mixed, the miscibility will be poor and the product will provide poor integrity.

To select an appropriate moment activator, the miscibility between the moment activator and the base polymer should be satisfactory, that is, the SP values of both should be close enough.

The magnitude of dipole moment is subject to the types of the base polymer and moment activator. The magnitude of dipole moment varies with the temperature at the time a sound energy is transferred to the base polymer. The magnitude of dipole moment is also affected by the magnitude of the sound energy. Thus, the base polymer and moment activator should be selected so as to provide the largest possible magnitude of dipole moment taking into consideration the expected temperature and magnitude of sound energy.

It is known that the sound absorptive capability of a material depends on the type of sound, that is, its frequency. The sound absorptive fibers of the present invention can cope with practically any type of sound with an appropriately selected base polymer or polymers for fibers and moment activator to be blended in the base material.

As described above, the moment activator in the mixture significantly promotes the dipole moment of the base material of the sound damping fibers of the present invention and provides excellently improved sound absorption. The magnitude of dipole moment in the base material is defined as the difference in dielectric constant ($\in'$) between A and B shown in FIG. 4. The magnitude of dipole moment increases as the difference in dielectric constant ($\in'$) between A and B increases.

FIG. 4 is a graph showing a relationship between the dielectric constant ($\in'$) and the dielectric loss factor ($\in''$), which is given as follows: Dielectric Loss Factor ($\in''$)= Dielectric Constant ($\in'$)×Dielectric Loss Tangent (tan δ).

A research on sound absorptive fibers conducted by the inventors has revealed that the sound energy absorption capability can be improved by increasing the dielectric loss factor ($\in''$). Studying the dielectric loss factor ($\in''$) of the sound absorptive fibers based on this finding has also revealed that the base polymer material provides an excellent sound absorption capability when the dielectric loss factor is 10 or larger at the frequency of 110 Hz.

It is desirable that effective sound absorption is provided over a wide frequency range. The sound absorptive fibers according to this invention satisfy this demand by incorporating a moment activator and a polymer which respectively exhibit substantially different sound absorption characteristics in different frequency ranges.

Such expansion of frequency effect can be provided as well by blending with a base material a plurality of different moment activators or compounds exhibiting substantially different frequency characteristics, or by blending a plurality of moment activator compounds in a plurality of different base polymers having substantially different frequency characteristics, or by blending a moment activator in such a plurality of polymers.

The sound absorptive fibers according to this invention can be provided from a base material comprising an appropriately selected polymer or polymers and moment activator by any appropriate conventional spinning method. The sound absorptive fibers can also be obtained in a composite form of a core-sheath, side-by-side, sea-island, or sandwich type using appropriate conventional spinning means.

The sound absorptive fibers according to this invention can be utilized for household articles such as door paper, wall paper, ceiling cloth, curtains, mats, or carpets, vehicle base materials such as car flooring or wall materials, casings or covers for refrigerators or washing machines, wall or floor materials for buildings, film materials for domes, or construction materials for roads or rail bases.

The sound absorptive fibers of the present invention may take a form comprising a selected polymer blended with a moment activator, which provides fiber surface. The various factors of such sound absorptive fibers such as fiber type, material or shape can be determined as desired.

The cover or surface of such sound absorptive fibers may wholly or partially comprise a polymer containing a moment activator.

Such a wholly covered type of sound absorptive fibers may be a sheath-core type or sea-island type composite fibers, whose sheath or sea portions are composed of a polymer including a moment activator.

Such wholly covered type sound absorptive fibers can also be provided by coating conventional fiber surface with a polymer material containing a moment activator.

Such a partially covered type of sound absorptive fibers may be a side-by-side type, sea-island type, or sandwich composite type of composite fibers, whose one side, island or layer portions are composed of a polymer including a moment activator.

Such partially covered sound absorptive fibers can also be provided by partially coating conventional fiber surface with a polymer containing a moment activator.

A polymer to be coated on the fiber surface may be ethylene-vinyl acetate copolymer, polymethacryl acid methyl, polyvinylidene fluoride, polyisoprene, polystyrene, styrene-butadinene-acrylonitrile copolymer, or styrene-acrylonitrile copolymer, or a rubber polymer such as acryl rubber (ACR), acrylonitrile-butadiene rubber (NBR), styrene-butadinene rubber (SBR), butadiene rubber (BR), natural rubber (NR), isoprene rubber (IR), or chloroprene rubber (CR).

The polymer is applied onto the fibrous surface in an emulsion form or dispersion in water or alcohol. Optionally, a dispersant or thickener is further blended in the polymer. The blend is dispersed and mixed using a conventional mixer or disperser such as a dissolver, Banbury mixer, planetary mixer, grain mill, open kneader, or vacuum kneader. The mixture is then deposited on the fibrous surface with a conventional applicator such as an air spray gun, airless spray gun, or brush.

A plurality of different moment activator compounds which respectively exhibit substantially different sound absorption characteristics in substantially different frequency ranges may be blended in a base polymer to provide in combination effective sound absorption over a wide frequency range. Equally, a plurality of such moment activator compounds may be blended with a plurality of different base polymers having substantially different frequency characteristics, or a single moment activator compound may be blended with a plurality of such different base polymers to provide an expanded frequency property for damping noise or sound.

The sound absorptive fibers of the present invention can provide sound absorptive yarn or fibrous bodies. The sound absorptive yarn may be formed of a plurality of different sound absorptive fibers, advantageously, having substantially different sound absorption characteristics in substantially different frequency ranges.

The sound absorptive yarn may be provided either in a filament or spun yarn configuration. The length, thickness, number or twists of filaments or staples for the filament yarn or spun yarn may be determined as desired.

A plurality of different sound absorptive fibers of different sound absorption characteristics over different frequency ranges (500–1,000 Hz, 1,000–2,000 Hz, and/or 2,000–3,000 Hz) may be bundled together and twisted into a single sound absorptive yarn or fibrous body, which can provide a combined wider scope of effective damping property relative to the frequency, that is, such a sound absorptive yarn may be particularly useful in the frequency range between 500 and 3,000 Hz.

Such a sound absorptive yarn can incorporate, besides sound absorptive fibers, certain functional fibers such as high-strength, flame-retardant or antibacterial fibers to provide multiple fiber functions.

The sound absorptive fibrous body is provided nearly identically with the sound absorptive yarn except that the fibrous body may be made into other configurations.

The sound absorptive fibrous body may be made into a sheet such as cloth, non-woven cloth, or paper, or other forms such as a block, plate, ball honeycomb, or pleat. To provide a non-woven cloth or paper, the sound absorptive fibers are directly processed, while to provide cloth, the sound absorptive fibers are first formed into sound absorptive yarn, which is then woven or knitted. The fibrous body may also be composed of a combination of the sound absorptive fibers and yarn.

A plurality of different sound absorptive fibers which exhibit substantially different sound absorption characteristics over substantially different frequency ranges may be bundled together and twisted into a single yarn or fibrous body so as to provide a wide effect over a wider range of frequency, such as by combining sound absorptive fibers exhibiting effective sound absorption in the frequency range between 500 and 1,000 Hz and another exhibiting effective sound absorption in the frequency range between 1,000 and 2,000 Hz to provide yarn exhibiting widened effective sound absorption over the frequency range between 500 to 2,000 Hz and provide a fabric with the sound absorption effect over the frequency range between 500 to 2,000 Hz, or by weaving yarn of sound absorptive fibers exhibiting effective sound absorption in the frequency range between 500 to 1,000 Hz as weft and yarn of sound absorptive fibers exhibiting effective sound absorption in the frequency range between 1,000 to 2,000 Hz as warp to provide a fabric having widened effective sound absorption over the range of 500 to 2,000 Hz, or by knitting yarn of sound absorptive fibers exhibiting effective sound absorption in the frequency range between 500 and 1,000 Hz, yarn of sound absorptive fibers exhibiting effective sound absorption in the frequency range between 1,000 and 2,000 Hz, and yarn of sound absorptive fibers exhibiting effective sound absorption in the frequency range between 2,000 and 3,000 Hz to together provide a knit exhibiting a widened effective sound absorption over the frequency range between 500 to 3,000 Hz.

As regards non-woven cloth, a plurality of different sound absorptive fibers exhibiting substantially different sound absorption characteristics over substantially different frequency ranges may be combined to provide a fibrous web which provides a widened effect over a widened frequency range by combining sound absorptive fibers exhibiting a sound absorption effect in the frequency range between 500 and 1,000 Hz and sound absorptive fibers exhibiting a sound absorption effect in the frequency range between 1,000 and 2,000 Hz to provide a non-woven fabric exhibiting effective sound absorption over the frequency range between 500 to 2,000 Hz, or combining sound absorptive fibers exhibiting a sound absorption effect in the frequency range between 500 and 1,000 Hz, sound absorptive fibers exhibiting a sound absorption effect in the frequency range between 1,000 and 2,000 Hz, and sound absorptive fibers exhibiting a sound absorption effect in the frequency range between 2,000 and 3,000 Hz to obtain non-woven cloth exhibiting widened effective sound absorption over the frequency range between 500 to 3,000 Hz.

Sound absorptive paper can be provided similarly as with the sound absorptive non-woven fabric described above.

Besides incorporating such different sound absorption fibers, the sound absorptive fibrous body may contain functional fibers such as high-strength, flame-retardant, antibacterial and/or deodorant fibers to provide multiple fiber functions.

The sound absorptive fibrous body may be made into a composite configuration by fixing the sound absorptive fibrous body on a fibrous sheet, or a synthetic resin film, corrugated fiber board, wooden board, or metallic plate.

Next, an impact absorptive material according to this invention is described.

Conventionally, foamed impact absorptive materials comprising a thermoplastic resin such as polystyrene, polyethylene, polypropylene, or polyurethane are utilized on walls or fences, helmet lining, interior articles for vehicles or airplanes, or car bumpers.

Figure 58:
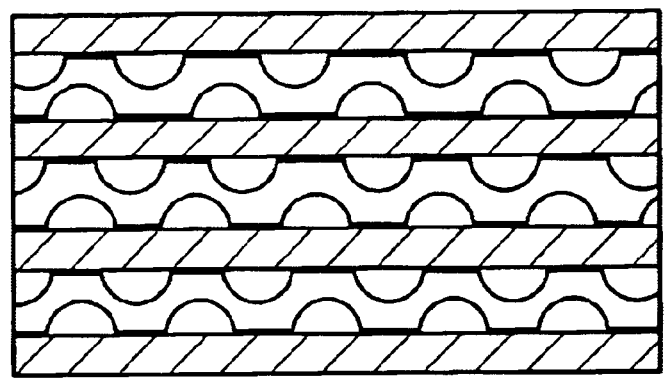
FIG. 58 is an enlarged front view of an impact absorber partially corrugated and laminated.

For packaging fragile products such as glass articles for transportation, a synthetic resin foam of polystyrene or polyurethane, or a protection board where synthetic resin sheets (cardboard) and corrugated synthetic resin sheets (cardboard) are laminated as shown in FIG. 58 have been utilized to prevent damage to the articles during transportation.

Figure 59:
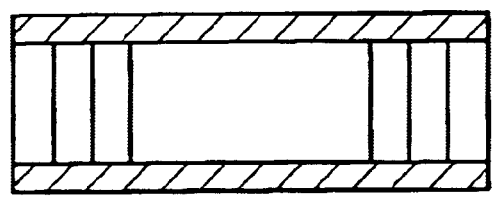
FIG. 59 is an enlarged front view of another impact absorber comprising impact absorptive cylinders shown in FIG. 61 and sheets covering both top and bottom surfaces thereof.

A synthetic resin molded into a synthetic resin foam or honeycomb structure shown in FIG. 59 has been used alone or in a composite form in construction materials such as wall or floor materials or certain facilities or rock sheds which are subject to impacts P such as blasts or underwater impacts.

In applications on vehicle air bags or shoe soles, a liquid such as water, a gas such as air, or gel sealed in a flexible casing has conventionally been in use to absorb impacts applied to the casing.

Conventional impact absorptive materials have the following disadvantages.

When an impact is applied on a cushion having a honeycomb or corrugated structure or an impact absorber comprising a synthetic resin foam such as a polyurethane foam, the device gradually deforms or collapses. The device does not return to its original state when the impact is removed, which leads to degradation of its damping capability.

Since such a conventional impact absorber only gradually deforms and collapses to provide impact damping, it does not instantly provide sufficient impact absorption. Consequently, the fragile products to be protected may not be adequately protected.

Besides, an impact cushion of a honeycomb or corrugated structure is costly to manufacture. A conventional impact absorptive synthetic resin foam, despite its relative easiness to manufacture and process, is fragile and likely damaged and degraded with heat, sun rays or a solvent.

A conventional impact absorber which uses air, water or gel has a recovery function and may provide impact absorption each time it is subjected to an impact. Such a conventional impact absorber comprising a casing containing air, water or gel requires a relatively large over all dimension to provide effective impact absorption, limiting its applications.

The impact absorptive materials or absorbers according to this invention can solve these technical weaknesses and have improved impact absorption capabilities. The impact absorptive materials of the present invention, even when made thin, can provide sufficient mechanical strength and excellent impact absorption from the moment of impact, as well as an instant recovery function thereafter.

The impact absorptive material according to this invention can be used, for example, as walls or fences in athletic fields, helmet linings, interior materials for vehicles and airplanes, car bumpers, saddles, grips, packing cushioning materials, construction materials such as floor materials, certain facilities or rock sheds which are subject to impact loads P such as blasts or underwater impacts, sports goods such as training shoes, protections, gloves or head gears, medical articles such as plaster casts, mats, or supporters, gun bottoms, shoulder pads, or bulletproof jackets.

The impact absorptive material of the invention is characterized in that the base material contains a moment activator which can increase the magnitude of dipole moment therein.

The resin component for the base material should provide effective sound absorption at working temperatures. Such a resin may be a polymer such as polyvinyl chloride, polyethylene, chlorinated polyethylene, polypropylene, ethylene-vinyl acetate copolymer, polymethyl methacrylate, polyvinylidene fluoride, polyisoprene, polystyrene, styrene-butadiene-acrylonitrile copolymer, styrene-acrylonitrile copolymer, acrylonitrile-butadiene rubber (NBR), styrene-butadiene rubber (SBR), butadiene rubber (BR), natural rubber (NR), isoprene rubber (IR), or their selected mixture. Polyvinyl chloride is preferred for its moldability and low cost.

When such a base material composed of a selected polymer or polymers is subjected to an impact, dipoles 12 present in the base material 11 are displaced. The displacement of the dipoles 12 may be by their rotation or phase shifting within the base material 11.

Prior to the application of an impact energy, the dipoles 12 in the base material 11 are stable. When an impact energy is applied on the base material 11, the dipoles 12 in the base material 11 are displaced into an unstable state, which are then prompted to return to a stable state.

Energy is then efficiently consumed. The impact absorption unique to the present invention is assumed to be provided through that consumption of energy.

The impact absorption is assumed to be associated with the dipole moment in the base material 11. Therefore, the impact absorbing capability of the base material 11 can be improved by increasing the magnitude of dipole moment in the base material 11.

The magnitude of dipole moment is subject to the type of base material or resin material. The same polymer material provides a different magnitude of dipole moment when the working temperature varies.

Effective sound absorption at working temperatures. Such a resin may be a polymer such as polyvinyl chloride, polyethylene, chlorinated polyethylene, polypropylene, ethylene-vinyl acetate copolymer, polymethyl methacrylate, polyvinylidene fluoride, polyisoprene, polystyrene, styrene-butadiene-acrylonitrile copolymer, styrene-acrylonitrile copolymer, acrylonitrile-butadiene rubber (NBR), styrene-butadiene rubber (SBR), butadiene rubber (BR), natural rubber (NR), isoprene rubber (IR), or their selected mixture. Polyvinyl chloride is preferred for its moldability and low cost.

When such a base material composed of a selected polymer or polymers is subjected to an impact, dipoles 12 present in the base material 11 are displaced. The displacement of the dipoles 12 may be by their rotation or phase shifting within the base material 11.

Prior to the application of an impact energy, the dipoles 12 in the base material 11 are stable. When an impact energy is applied on the base material 11, the dipoles 12 in the base material 11 are displaced into an unstable state, which are then prompted to return to a stable state.

Energy is then efficiently consumed. The impact absorption unique to the present invention is assumed to be provided through that consumption of energy.

The impact absorption is assumed to be associated with the dipole moment in the base material 11. Therefore, the impact absorbing capability of the base material 11 can be improved by increasing the amount of dipole moment in the base material 11.

The magnitude of dipole moment is also affected by the magnitude of impact energy. Thus, the resin material should be selected so as to provide the largest possible magnitude of dipole moment considering the expected working temperature and magnitude of impact energy.

In selecting an appropriate polymer for the base material, not only the magnitude of dipole moment in the base material but also usability, moldability, availability, temperature capability, weatherability, and price should be duly considered for particular usage.

The resin component is blended with a moment activator which can significantly increase the magnitude of dipole moment therein.

The moment activator may comprise a plurality of compounds selected from compounds containing a benzothiazyl or benzothiazyl radical or ones containing a diphenylacrylate radical.

The magnitude of dipole moment is subject to the moment activator as well.

Even if the same moment activator is used, the magnitude of the dipole moment varies with the operation temperature. The magnitude of dipole moment is also affected by the magnitude of impact energy applied to the base material.

Thus, the moment activator should be selected so as to provide the largest possible magnitude of dipole moment considering the possible operation temperature and magnitude of impact energy.

To select a moment activator appropriately, the miscibility between the moment activator and the resin base material should be taken into due consideration, that is, the SP values of both should be close enough.

The impact absorptive material of the present invention may be provided by mixing the resin base material and moment activator, and The magnitude of dipole moment is subject to the type of base material or resin material. The same polymer material provides a different magnitude of dipole moment when the working temperature varies. optionally a dye, corrosion inhibitor, electric control agent, stabilizer, or wetting agent as desired by conventional melting/mixing means such as a heat roll, Banbury mixer, two-axis kneader, or extruder.

As described above, such a moment activator is mixed in the base polymer of the impact absorptive material to significantly promote dipole moment in the base material. The magnitude of dipole moment in the impact absorptive material is given as the difference in dielectric constant ($\in'$) between A and B shown in FIG. 4.

The magnitude of dipole moment increases as the difference in dielectric constant ($\in'$) between A and B increases.

FIG. 4 is a graph showing a relationship between the dielectric constant ($\in'$) and the dielectric loss factor ($\in''$). The relationship between the dielectric constant ($\in'$) and the dielectric loss factor ($\in''$) is given as follows: Dielectric Loss Factor ($\in''$)=Dielectric Constant ($\in'$)×Dielectric Loss Tangent (tan $\delta$).

Through a lengthy research on impact absorptive materials, the inventors have found that the impact absorption capability can be improved by increasing the dielectric loss factor ($\in''$). In other words, the dielectric loss tangent (tan $\delta$) indicating an electric property of polymers is substantially correlated with the impact resilience (%) indicating a dynamic characteristic.

Upon study of the dielectric loss factor ($\in''$) of the impact absorptive materials based on this finding, the inventors have also found that the materials have a high impact resilience (%) and provide excellent shock absorption when the dielectric loss factor is 50 or larger at the frequency of 110 Hz.

The configuration of the impact absorber is not limited to a sheet and can be provided in varied forms depending on application conditions. The configuration shown in FIG. 60 may be obtained by mixing a moment activator in a resin base and adding a foaming agent to provide the foamed molding.

Figure 61:
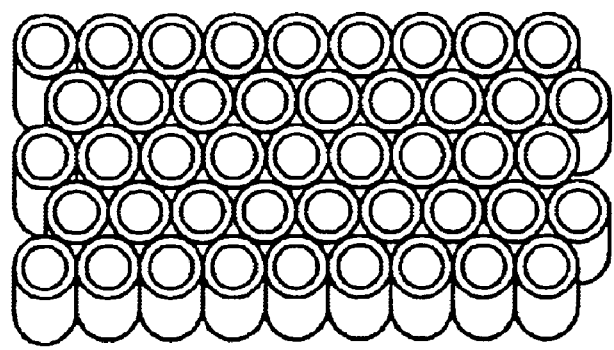
FIG. 61 is a perspective view of impact absorptive cylinders of the present invention.
Figure 62:
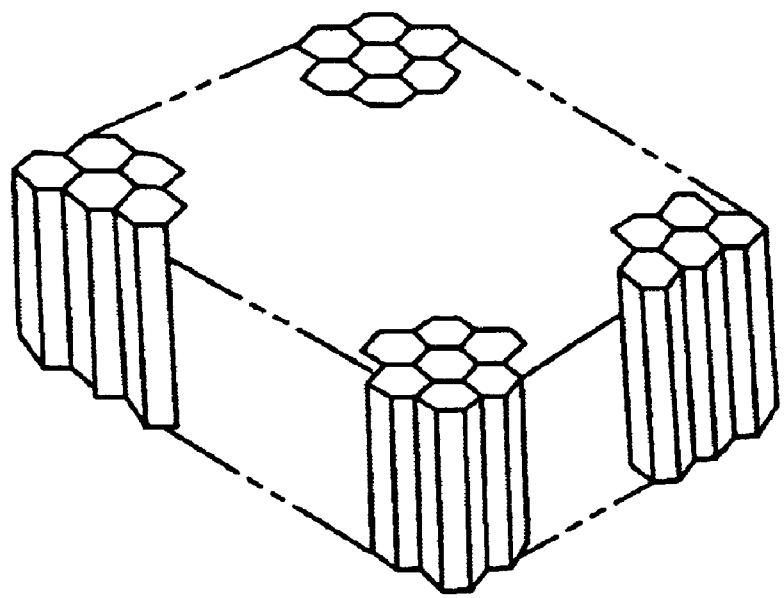
FIG. 62 is a perspective view of a honeycomb impact absorber.

The damper shown in FIG. 61 may be provided by molding a polymer matrix blended with a moment activator into cylinders to be arranged and coupled together. The damper shown in FIG. 62 may be obtained by molding the resin into a honeycomb configuration while the damper shown in FIG. 58 may be obtained using corrugate processing in which sheet-like moldings and corrugated moldings are laminated.

Figure 60:
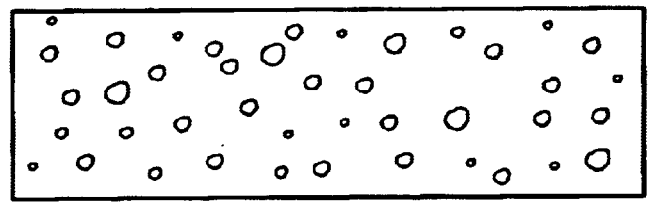
FIG. 60 is a cross sectional view of an impact absorptive foam of the present invention.

The damper shown in FIG. 59 may be provided by sandwiching impact absorptive cylinders such as shown in FIG. 60 with impact absorptive sheets.

The impact absorber according to this invention is also applicable onto front forks installed between an automobile body and shaft to absorb and reduce impact such as vibrations from a road surface.

A conventional front fork has spring means between a shaft-side outer tube and a body-side inner tube so that the spring force can act as a cushion to absorb and reduce impact from the road surface, and/or seal oil between the shaft-side outer tube and the body-side inner tube to provide air cushioning for absorbing and damping impact.

The front fork with the built-in spring means, however, is subject to stress fatigue from repeated use, which will not retain its original capability over a long period of use. On the other hand, the front fork with the air-cushion damper requires a large amount of oil to provide sufficient air compression force, which substantially increase cost and overall weight. In addition, such a conventional front fork mechanism requires a large number of parts such as oil sealing chambers, air chambers, cylinders, or shafts, which further pushes up cost.

A front fork with both spring means and damper means mounted on a car body and shaft will provide improved shock damping, however, both means must be well balanced. This balancing is a very complicated operation requiring professional skills.

A front fork which utilizes an elastic body such as rubber or foamed urethane instead of spring or damper means is also conventionally used in many applications, chiefly on bicycles, thanks to its simple structure and light weight.

However, due to the low impact absorption capability of such a conventional elastic body, the front fork cannot sufficiently absorb and reduce impact or shock.

The front fork according to this invention can appropriately cope with such problems and provide an unexpectedly excellent impact absorption.

Figure 63:
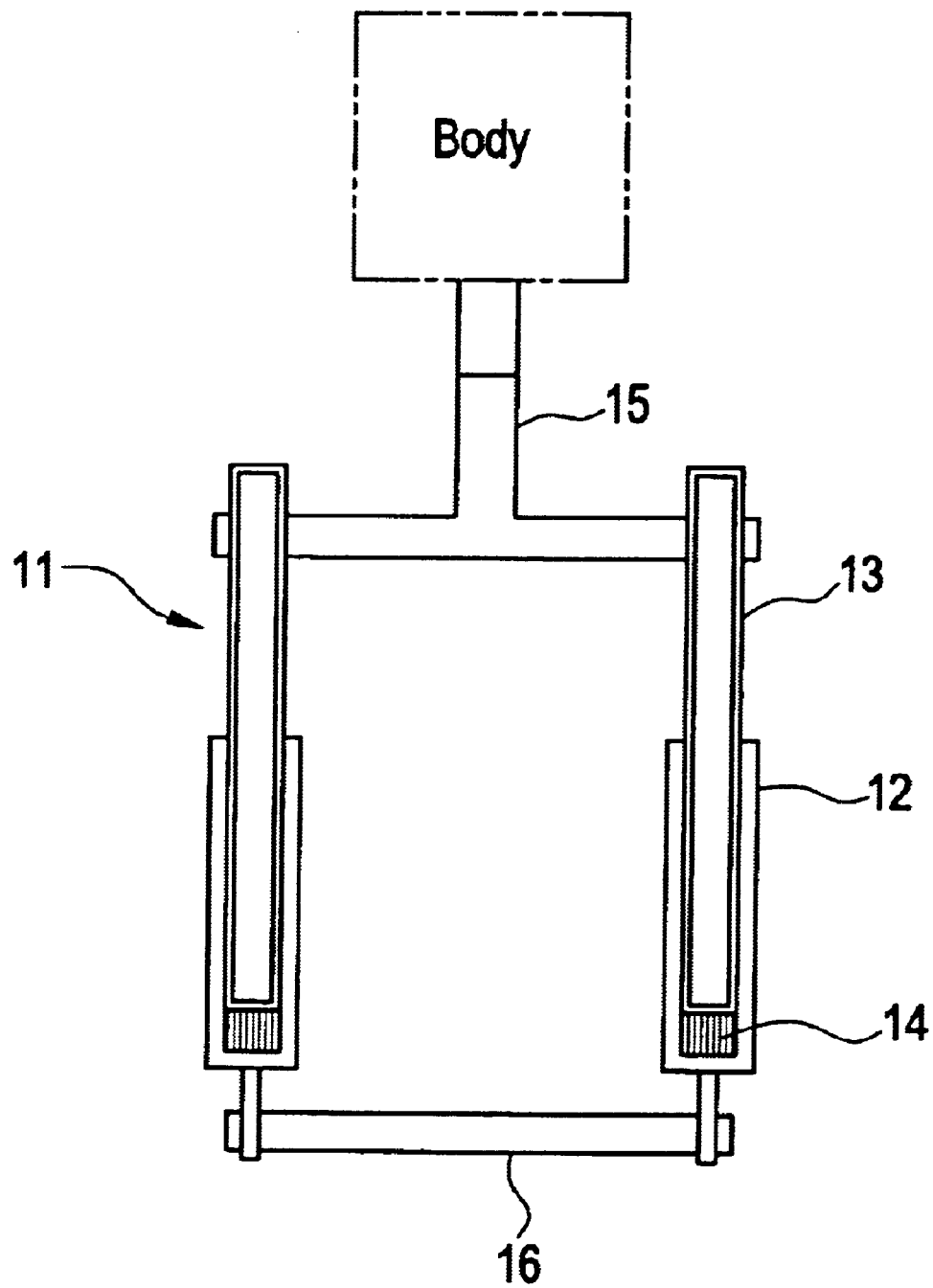
FIG. 63 is a schematic drawing showing front forks incorporating an impact absorptive material according to this invention.

A front fork 11 in FIG. 63 of the present invention comprises a shaft-side outer tube 12 and a body-side inner tube 13 movably inserted in the outer tube 12, wherein an impact absorber 14 including a moment activator is disposed between the outer and inner tubes 12 and 13 as shown.

The base material of the impact absorber may be polyvinyl chloride, polyethylene, chlorinated polyethylene, polypropylene, ethylene-vinyl acetate copolymer, polymethyl methacrylate, polyvinylidene fluoride, polyisoprene, polystyrene, styrene-butadiene-acrylonitrile copolymer, styrene-acrylonitrile copolymer, acrylonitrile-butadiene rubber (NBR), styrene-butadiene rubber (SBR), butadiene rubber (BR), natural rubber (NR), isoprene rubber (IR), or their selected mixture. Polyvinyl chloride is preferred for its moldability and low cost.

In the impact absorber provided with such a polymer as the base material and a moment activator, the relationship between the magnitude of dipole moment and the impact absorption capability is given as follows.

The general mechanism of impact absorption in the impact absorber is such that an impact applied to the impact absorber is partially converted into heat energy, providing some impact damping. Through research on the mechanism of impact absorption, the inventors have found that the displacement and recovery of the dipoles in the impact absorber base material provides significant energy damping.

The details are given below. FIG. 1 shows dipoles 12 in the impact absorptive base material 11 prior to application of an impact. The arrangement of the dipoles 12 is stable. When an impact is applied, the dipoles 12 in the impact absorptive base material 11 get displaced to an unstable state such as shown in FIG. 2, which are prompted to return to a stable state such as shown in FIG. 1.

Energy is then absorbed or damped. The impact absorption capability is assumed to be provided through the absorption or conversion of energy by the displacement and recovery of the dipoles 12 in the impact absorptive base material 11.

Based on this mechanism of impact absorption, the impact absorption capability of the impact absorptive material 11 can be improved by increasing the magnitude of dipole moment in the impact absorptive material 11.

Thus, it is essential to use a base material inherently having a large magnitude of dipole moment in the molecules in order to provide excellently improved impact absorption.

Materials inherently having a large magnitude of dipole moment may be polarity polymers such as polyvinyl chloride, chlorinated polyethylene, acrylic rubber (ACR), acrylonitrile-butadiene rubber (NBR), styrene-butadiene rubber (SBR), and chloroprene rubber (CR).

The front fork according to this invention can significantly absorb and reduce impact from the road surface and can excellently function in a wide range of temperature or between about −20 C. and about 40 C. It is advantageous to use as the base material a polymer which has or will have a glass transition point in this operating temperature zone because the impact absorption capability is maximized near the glass transition point of the polymer.

A polymer to have a glass transmission point in that operating temperature region may be polyvinyl chloride, polyethylene, polypropylene, ethylene-vinyl acetate copolymer, polymethyl methacrylate, polystyrene, or styrene-butadiene-acrylonitrile copolymer, to which a plasticizer such as di-2-ethylhexylphthalate (DOP), dibutylphthalate (DBP), or diisononylphthalate (DINP) is added to shift the glass transition point (Tg) into the operating temperature region, or a polymer such as acrylic rubber (ACR), acrylonitrile-butadiene rubber (NBR), styrene-butadiene rubber (SBR), butadiene rubber (BR), natural rubber (NR), isoprene rubber (IR), chloroprene rubber (CR), or chlorinated polyethylene which inherently has a glass transition point (Tg) in the operating temperature region.

In selecting an appropriate base material, not only the magnitude of dipole moment in the molecules and the operating temperature region but also usability, moldability, availability, temperature capability, weatherability, and price should be duly considered.

A plurality of moment activators or moment activator compounds may be blended, which may be selected from compounds containing a benzothiazyl or benzothiazyl radical or a diphenylacrylate radical such as ethyl-2-cyano-3,3-di-phenylacrylate.

Preferably, 10 to 200 parts by weight of a moment activator is mixed in 100 parts by weight of a base material. If less than 10 parts by weight of a moment activator is blended, the dipole moment will not be sufficiently improved, whereas if more than 200 parts by weight of a moment activator is mixed, the moment activator will not be sufficiently blended with the base material or may provide an insufficient mechanical strength.

To select an appropriate moment activator to be blended in the base material, not only the magnitude of dipole moment but also the miscibility between the moment activator and the base material should be considered, that is, the SP values of both should be close enough.

The magnitude of dipole moment is subject to the base material and moment activator. Even if the same base material and moment activator are used, the magnitude of dipole moment varies with the working temperature. The magnitude of dipole moment is also affected by the magnitude of energy transferred to the base material. Thus, the base material and moment activator should be selected so as to provide the largest possible magnitude of dipole moment considering the possible working temperature and magnitude of sound energy.

A filler such as mica scales, glass pieces, glass fibers, carbon fibers, calcium carbonate, barite, or precipitated barium sulfate may be additionally blended in the base material to further improve the absorption capability. Preferably, 10 to 80% by weight of a filler is blended in the base material.

If less than 10% by weight is mixed, the filler will not sufficiently improve the absorption capability, whereas if more than 80% by weight is mixed, it will not be blended appropriately or reduce the mechanical strength of the product.

The impact absorptive material of the present invention for a front fork can be manufactured by mixing a base material and moment activator, and as an option a filler, dispersant, or thickener as desired using a conventional melt/mix apparatus such as a dissolver, Banbury mixer, planetary mixer, grain mill, open kneader, or vacuum kneader.

As described above, the moment activator is blended in the base material to significantly increase the magnitude of dipole moment in the base material in order to provide an excellently improved impact absorption capability. The magnitude of dipole moment in the impact absorptive material is defined as the difference in dielectric constant ($\in'$) between A and B shown in FIG. 4. That is, the magnitude of dipole moment increases as the difference in dielectric constant ($\in'$) between A and B increases.

FIG. 4 is a graph showing a relationship between the dielectric constant ($\in'$) and the dielectric loss factor ($\in''$). The relationship between the dielectric constant ($\in'$) and the dielectric loss factor ($\in''$) is given as follows: Dielectric Loss Factor ($\in''$)=Dielectric Constant ($\in'$)×Dielectric Loss Tangent (tan δ).

Through a lengthy research on impact absorptive materials for front forks, the inventors have found that the energy absorption capability or impact absorption capability can be improved by increasing the dielectric loss factor ($\in''$). Through study on the dielectric loss factor ($\in''$) of the above impact absorptive material based on this finding, the inventors have also found that the material provides excellent shock absorption when the dielectric loss factor is 50 or larger at the frequency of 110 Hz.

The above impact absorptive material is provided between the outer tube and the inner tube of a front fork as shown in FIG. 63 to absorb and reduce impact from the road surface.

In FIG. 63, reference numeral 15 designates a bracket for fixing the front forks 11 to a car body. The inner tube 13 is inserted into the outer tube 12. The impact absorptive material 14 disposed between the bottom of the outer tube 12 and the lower end of the inner tube 13 absorbs and damps impact or shock from the road surface.

Figure 64:
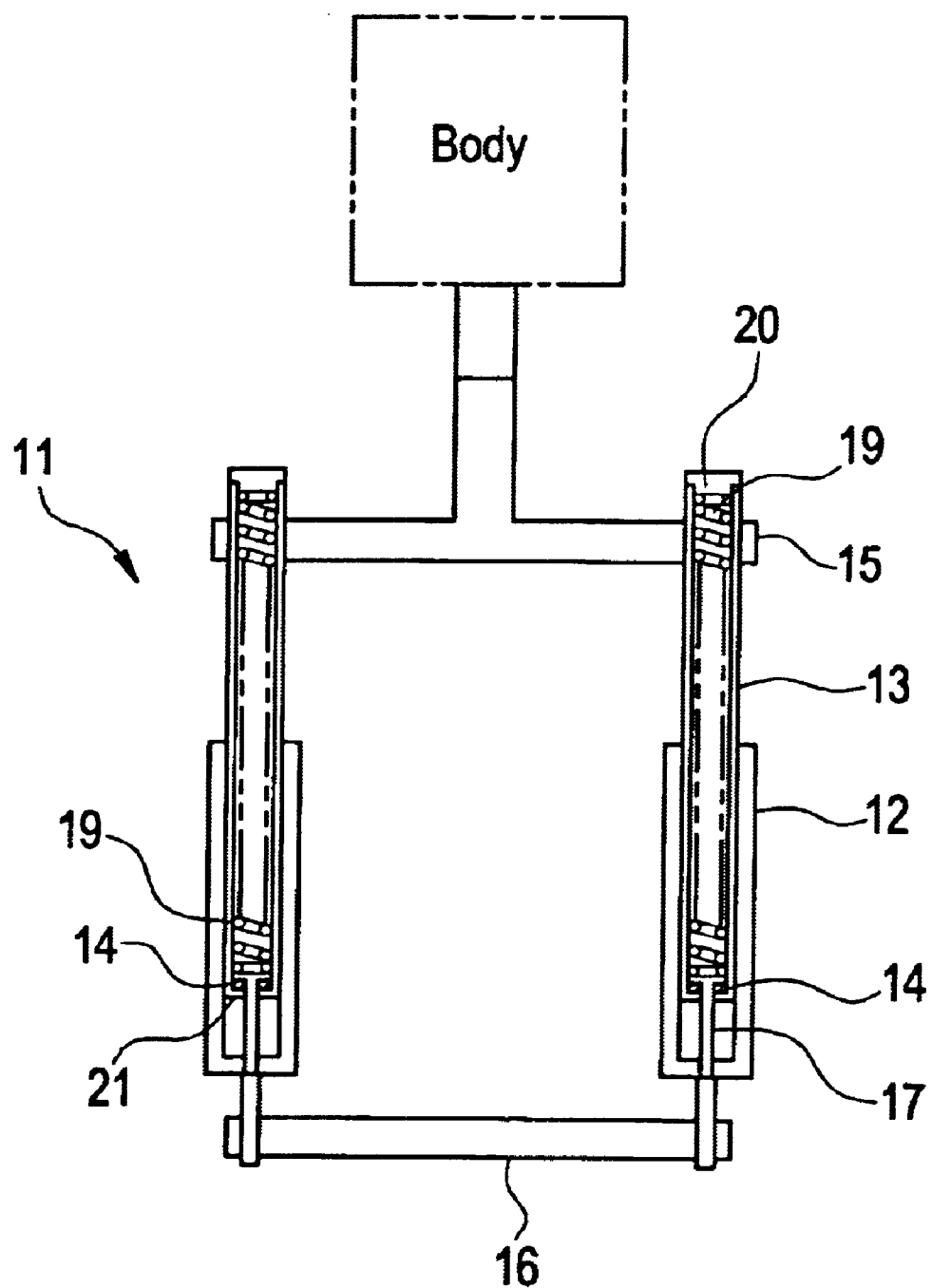
FIG. 64 is a schematic drawing showing another type of front forks incorporating an impact absorptive material according to this invention.
Figure 65:
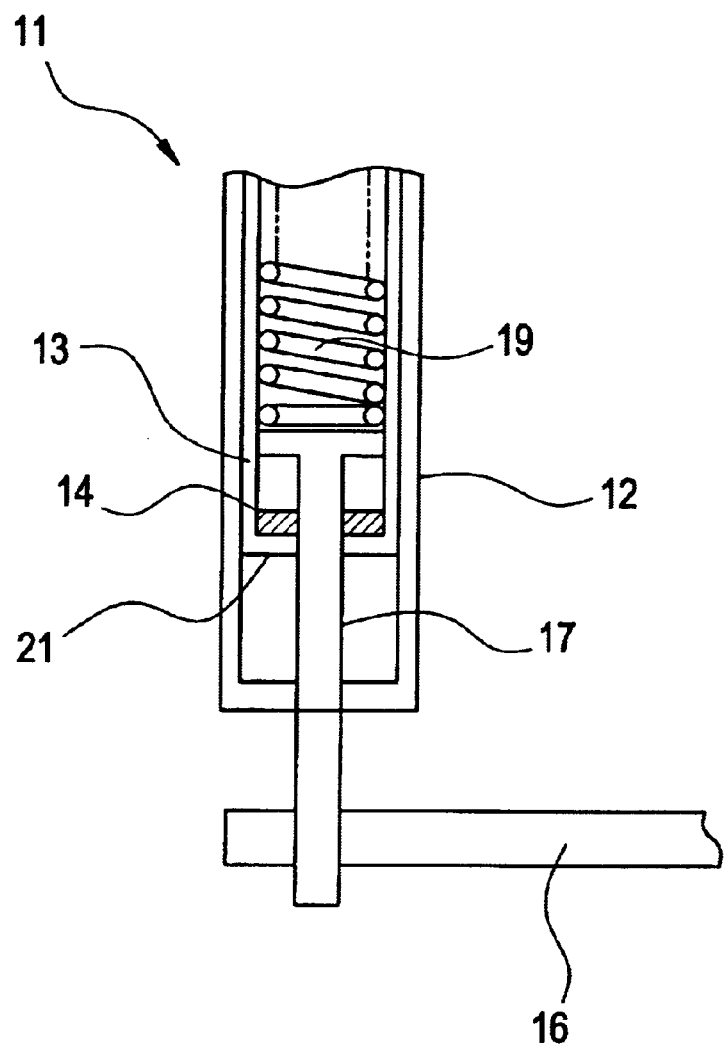
FIG. 65 is an enlarged cross sectional view showing another state of the front forks of FIG. 64.

FIGS. 64 and 65 show another type of front forks 11 which can damp impact in both ways, upward and downward. The front fork 11 shown in FIG. 64 has the outer tube 12 on the shaft side 16 and the inner tune 13 fixed to the body via the bracket 15. The inner tube 13 can be inserted into the outer tube 12. A T-shaped support lever 17 is provided in the center of the bottom of the outer tube 12, and a coil spring 19 is provided between the upper end surface of the supporting lever 17 and a cap 20 attached to the upper end of the inner tube 13 to urge the inner tube 13 against the outer tube 12 in the upward direction.

The lower end of the inner tube 13 extends from the upper end of the support lever 17 to the lower part, with a stopper 21 provided inside the lower end of the inner tube 13. A ring-like impact absorptive material 14 is provided between the stopper 21 and the upper end of the support lever 17.

In the front fork 11, the spring 19 damps impact on the inner tube 13 inserted in the outer tube 12 in the upward direction, while the impact absorptive material 14 damps impact in the downward direction.

The dimension of the impact absorptive material can be appropriately decided.

The impact absorptive material according to this invention can be used as grip tapes as described below.

In recent years, impact absorptive tapes are conventionally used on sports equipment such as tennis or badminton rackets, baseball bats, or golf clubs, or handles of bicycles or motorbikes, or tools such as hammers.

Such sports equipment, or handles or hand tools with such conventional shock damping tapes on can provide limited impact absorption and therefore their users receive uncomfortable feelings from use. Their elbows may eventually be damaged.

Accordingly, professionals and artisans as well as general public demand a grip tape which can provide much improved shock damping.

Commercially available conventional grip tapes generally comprise a foam resin material such as polyvinyl chloride or polyurethane foam.

Due to the low impact absorption capability of such a foam resin material, conventional grip tapes do not provide sufficient damping of impact.

The grip tape according to this invention can effectively solve this shortcoming and can provide unexpectedly excellent impact absorption.

Figure 66:
FIG. 66 is an enlarged cross sectional view showing a grip tape according to the present invention.
Figure 67:
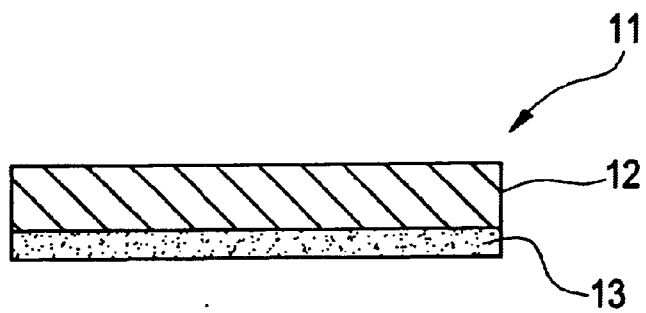
FIG. 67 is an enlarged cross sectional view showing another grip tape according to this invention.
Figure 68:
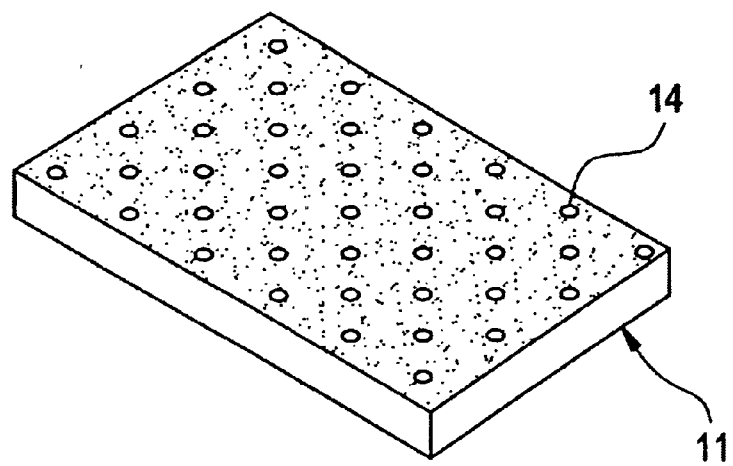
FIG. 68 is a perspective view showing yet another grip tape according to this invention.

The grip tape 11 shown in FIG. 66 consists of a single layer of only a tape substrate 12, and the grip tape 11 shown in FIG. 67 has an adhesive layer 13 under the tape substrate 12. The grip tape 11 shown in FIG. 68 has a large number of through holes 14 in the tape substrate 12 for ventilation to evacuate moisture from the users.

The configuration of the grip tape according to this invention can be varied according to application or use conditions. For example, recesses and protrusions can be provided on the tape surface to improve grip, or a shock absorptive adhesive layer may be provided under the substrate.

The tape substrate of the grip tape according to this invention is described. The substrate base material may be a polymer such as polyvinyl chloride, polyethylene, chlorinated polyethylene, polypropylene, ethylene-vinyl acetate copolymer, polymethyl methacrylate, polyvinylidene fluoride, polyisoprene, polystyrene, styrene-butadiene-acrylonitrile copolymer, styrene-acrylonitrile copolymer, acrylonitrile-butadiene rubber (NBR), styrene-butadiene rubber (SBR), butadiene rubber (BR), natural rubber (NR), isoprene rubber (IR), or their appropriate mixture. Polyvinyl chloride is preferred for its moldability and low cost.

In the tape substrate of such a polymer, the relationship between the magnitude of dipole moment and the impact absorption capability is as follows.

Impact vibration transferred to the grip tape is partially converted into heat.

This energy conversion damps the impact vibration on the grip tape. Through research on the mechanism of impact absorption, the inventor have found that the displacement and recovery of the dipoles in the tape substrate provides excellent energy damping.

The details are given below. FIG. 1 shows an arrangement of dipoles 12 in a tape substrate (base material) 11 prior to the propagation of an impact. The dipoles 2 are stable there. When an impact or shock is applied on the substrate, the dipoles 12 are displaced into an unstable state such as shown in FIG. 2, which are prompted to return to a stable state such as shown in FIG. 1.

Energy is then absorbed or consumed excellently. The impact absorption is assumed to be provided through the absorption of energy provided by the displacement and recovery of the dipoles in the tape substrate (base material) 11.

Based on this assumption, the impact absorption capability of the tape substrate 11 can be improved by increasing the magnitude of dipole moment in the tape substrate 11. Thus, the substrate material should have large dipole moment in the molecules to provide an excellent impact absorption capability.

Materials which inherently have large dipole moment may be polarity polymers such as polyvinyl chloride, chlorinated polyethylene, acrylic rubber (ACR), acrylonitrile-butadiene rubber (NBR), styrene-butadiene rubber (SBR), and chloroprene rubber (CR).

The tape is usually used within a temperature range between about −20 C. and about 40 C. It is essential that a polymer which has or will have a glass transition point in this operating temperature region be used to maximize the damping effect, as the glass transition point of a polymer provides the most effective damping according to the inventors' experiments.

Polymers which will have a glass transmission point in such an operating temperature region may be polyvinyl chloride, polyethylene, polypropylene, ethylene-vinyl acetate copolymer, polymethyl methacrylate, polystyrene, or styrene-butadiene-acrylonitrile copolymer, to which a plasticizer such as di-2-ethylhexalphthalate (DOP), dibutylphthalate (DBP), or diisononylphthalate (DINP) is added to shift their glass transition point (Tg) into the operating temperature region, or polymers such as acrylic rubber (ACR), acrylonitrile-butadiene rubber (NBR), styrene-butadiene rubber (SBR), butadiene rubber (BR), natural rubber (NR), isoprene rubber (IR), chloroprene rubber (CR), and chlorinated polyethylene, which themselves have a glass transition point (Tg) in the operating temperature region.

In selecting an appropriate tape substrate material, not only the magnitude of dipole moment in the base polymer and the operating temperature region but also usability, moldability, availability, temperature property, weatherability, and price should be duly considered.

A moment activator to be mixed in the tape substrate may be a plurality of compounds selected from compounds containing a benzothiazyl or benzothiazyl radical or a diphenylacrylate radical such as ethyl-2-cyano-3,3-diphenylacrylate.

Preferably, 10 to 200 parts by weight of a moment activator is mixed in 100 parts by weight of a tape substrate. If less than 10 parts by weight is mixed, the magnitude of dipole moment will not be sufficiently improved, whereas if more than 200 parts by weight is mixed, the moment activator will be insufficiently blended with the tape substrate or may waken the mechanical integrity of the product.

To select an appropriate moment activator to be mixed in the tape substrate, not only the magnitude of dipole moment but also the miscibility between the moment activator and the tape substrate should be appropriately considered, that is, the SP values of the two should be close enough.

The magnitude of dipole moment is subject to the tape substrate material and moment activator. Even if the same materials are used, the magnitude of dipole moment varies with the working temperature. The magnitude of dipole moment is also affected by the magnitude of energy transferred to the tape substrate. Thus, the tape substrate material and moment activator should be selected so as to provide the largest possible magnitude of dipole moment considering the probable temperature and magnitude of energy.

A filler such as mica scales, glass pieces, glass fibers, carbon fibers, calcium carbonate, barite, or precipitated barium sulfate may be additionally provided in the tape substrate to further improve the impact absorption capability and to increase the mechanical strength of the material. Preferably, 10 to 80% by weight of a filler is blended in the tape substrate.

If less than 10% by weight is blended, the filler will not sufficiently improve the absorption capability, whereas if more than 80% by weight is blended, it will not be blended well or will reduce the mechanical integrity of the tape product.

The grip tape of the present invention can be manufactured by mixing the tape substrate material and moment activator and optionally a filler such as a dispersant or thickener with conventional melting/mixing means such as a dissolver, Banbury mixer, planetary mixer, grain mill, open kneader, or vacuum kneader.

As described above, the moment activator is mixed in the tape substrate to significantly increase the magnitude of dipole moment and provide an excellent impact absorption capability. The magnitude of dipole moment in the tape substrate containing a moment activator is given as the difference in dielectric constant ($\in'$) between A and B shown in FIG. 4. That is, the magnitude of dipole moment increases when the difference in dielectric constant ($\in'$) between A and B increases.

FIG. 4 is a graph showing a relationship between the dielectric constant ($\in'$) and the dielectric loss factor ($\in''$). The relationship between the dielectric constant ($\in'$) and the dielectric loss factor ($\in''$) is given as follows: Dielectric Loss Factor ($\in''$)=Dielectric Constant ($\in'$)×Dielectric Loss Tangent (tan δ).

Through research on grip tapes, the inventors have found that the energy or impact absorption capability can be improved by increasing the dielectric loss factor ($\in''$).

The inventors have also found that the grip tape of the present invention provides excellent impact absorption when the dielectric loss factor is 50 or greater at the frequency of 110 Hz.

The impact absorption material according to this invention can be used on shoe soles as well.

Conventional impact absorptive shoes use a foamed resin material such as polyvinyl chloride or polyurethane in their shoe soles.

Due to the low impact absorption capability of such a foamed resin material, conventional shoe soles cannot not sufficiently damp impact or shock.

Some conventional shoe soles utilize innersoles provided with two sheets put together to form a large number of cells filled with liquid silicon, polyurethane, or rubber.

Although such shoe soles somewhat improve the impact absorption capability, the resultant shock absorption capability is still not high enough.

In addition, such shoe soles require a complicated structure and the manufacturing cost is high.

The shoe sole according to this invention can appropriately cope with those shortcomings and can provide unexpectedly excellent impact absorption.

Figure 69:
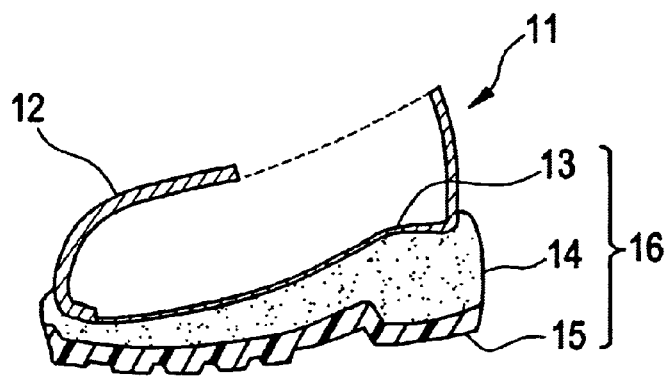
FIG. 69 is a schematic drawing showing a shoe incorporating an impact absorptive shoe sole according to this invention.

The shoe 11 shown in FIG. 69 has under a shoe leather 12 a multi-layer shoe bottom 16 consisting of a thin and soft insole 13, a midsole 14 installed under the insole 13 of an impact absorptive material, and a wear-resistant outersole 15 installed under the midsole 14.

The structure and shape of impact absorptive shoes using the shoe sole according to this invention may be designed as desired depending on the requirements.

The functions of the shoes can also be designed as desired, for example by applying a wear-resistant and impact-absorptive material to the outsole 15 of the shoe 11 as shown in FIG. 69 to improve the impact absorption capability of the shoes.

An impact absorptive material containing a moment activator which can increase the amount of dipole moment in the base material is applied on the shoe sole of this invention (the midsole 14 in the shoe 11 shown in FIG. 69).

The impact absorptive material to be used as the shoe sole is now described in detail. The base material of this impact absorptive material may be a polymer such as polyvinyl chloride, polyethylene, chlorinated polyethylene, polypropylene, ethylene-vinyl acetate copolymer, polymethyl methacrylate, polyvinylidene fluoride, polyisoprene, polystyrene, styrene-butadiene-acrylonitrile copolymer, styrene-acrylonitrile copolymer, acrylonitrile-butadiene rubber (NBR), styrene-butadiene rubber (SBR), butadiene rubber (BR), natural rubber (NR), isoprene rubber (IR), or their selected mixture. Polyvinyl chloride is preferred for its moldability and low cost.

In the impact absorption base material of such a polymer, the relationship between the magnitude of dipole moment and the impact absorption capability is as follows. The general mechanism of impact absorption in the impact absorption material is that impact such as vibration collides against the shoe sole (the impact absorptive material) to be partially converted into heat. That is, the impact energy is converted into heat and damped. Through research on the mechanism of the impact absorption of impact absorptive materials used as shoe soles, the inventors have found that the displacement and recovery of the dipoles in the impact absorptive material (base material) provides great energy damping.

The details are given below. FIG. 1 shows an arrangement of dipoles 12 in an impact absorptive material (base material) 11 prior to the propagation of impact. The arrangement of the dipoles 12 is stable there. When an impact is applied onto the base material, the dipoles 12 present in the impact absorptive material 11 are displaced into an unstable state such as shown in FIG. 2, which are then prompted to return to a stable state such as shown in FIG. 1.

Energy is then absorbed and damped. The impact absorption capability is assumed to be provided through the absorption of energy by the displacement and recovery of the dipoles in the impact absorptive material 11.

Based on this mechanism of impact absorption, the impact absorption capability of the impact absorptive material 11 can be improved by increasing the magnitude of dipole moment in the impact absorptive material 11. Thus, a polymer inherently having a large magnitude of dipole moment in the molecules can be advantageously used to provide a better impact absorption capability.

Polymers which inherently have large dipole moment may be a polarity polymer such as polyvinyl chloride, chlorinated polyethylene, acrylic rubber (ACR), acrylonitrile-butadiene rubber (NBR), styrene-butadiene rubber (SBR), or chloroprene rubber (CR).

The shoe sole according to this invention (midsole 14 shown in FIG. 69) is expected to be used within the temperature range between about −20 C. and about 40 C. It is advantageous to use a polymer which has or will have a glass transition point in this operating temperature region because the impact absorption capability is maximized near the glass transition point of the polymer according to the inventors' experiment.

Polymers which will have a glass transition point in the operating temperature region may be polyvinyl chloride, polyethylene, polypropylene, ethylene-vinyl acetate copolymer, polymethyl methacrylate, polystyrene, or styrene-butadiene-acrylonitrile copolymer, to which a plasticizer such as di-2-ethylhexalphthalate (DOP), dibutylphthalate (DBP), or diisononylphthalate (DINP) is added to shift their glass transition point (Tg) into the operating temperature region, or polymers such as acrylic rubber (ACR), acrylonitrile-butadiene rubber (NBR), styrene-butadiene rubber (SBR), butadiene rubber (BR), natural rubber (NR), isoprene rubber (IR), chloroprene rubber (CR), and chlorinated polyethylene which themselves have a glass transition point (Tg) in the operating temperature region.

In selecting an appropriate base material, not only the magnitude of dipole moment in the polymer and the operating temperature region but also usability, moldability, availability, temperature property, weatherability, and price should be appropriately considered.

The moment activator to be mixed in the impact absorptive material for shoe soles can be a plurality of compounds containing a benzothiazyl or benzothiazyl radical or a diphenylacrylate radical such as ethyl-2-cyano-3,3-diphenylacrylate.

Preferably, 10 to 200 parts by weight of a moment activator is mixed in 100 parts by weight of a base material. If less than 10 parts by weight of a moment activator is mixed, the magnitude of dipole moment will not be sufficiently increased, whereas if more than 200 parts by weight is mixed, the moment activator will insufficiently blend with the base material and will provide a poor mechanical strength.

To select an appropriate moment activator to be mixed in the base material, not only the magnitude of dipole moment but also the miscibility between the moment activator and the base material should be duly considered, that is, the SP values of both should be close enough.

The magnitude of dipole moment is subject to the base material and moment activator. Even if the same materials are used, the magnitude of dipole moment varies with the temperature. The magnitude of dipole moment is also affected by the magnitude of energy transferred to the base material. Thus, the base material and moment activator should be selected so as to provide the largest possible magnitude of dipole moment considering the expected temperature and magnitude of energy.

A filler such as mica scales, glass pieces, glass fibers, carbon fibers, calcium carbonate, barite, or precipitated barium sulfate can be additionally blended in the base material to further improve the absorption capability and as well as the mechanical integrity of the material. Preferably, 10 to 80% by weight of a filler is blended in the base material. If less than 10% by weight of a filler is blended, the addition of the filler will not sufficiently improve the absorption capability, whereas if more than 80% by weight of a filler is blended, it will not blend well in the base material and will reduce the mechanical strength of the product.

The impact absorptive material used as the shoe sole of the present invention can be manufactured by mixing the base material and moment activator and optionally a filler, dispersant, or thickener as desired using a conventional melting and mixing apparatus such as a dissolver, Banbury mixer, planetary mixer, grain mill, open kneader, or vacuum kneader.

As described above, the moment activator is mixed in the base material to significantly increase the magnitude of dipole moment in order to provide an excellent impact absorption capability.

The magnitude of dipole moment in the impact absorptive material containing the moment activator in its base material is given as the difference in dielectric constant ($\in'$) between A and B shown in FIG. 4.

That is, the magnitude of dipole moment increases as the difference in dielectric constant ($\in'$) between A and B increases.

FIG. 4 is a graph showing a relationship between the dielectric constant ($\in'$) and the dielectric loss factor ($\in''$). The relationship between the dielectric constant ($\in'$) and the dielectric loss factor ($\in''$) is given as follows: Dielectric Loss Factor ($\in''$)=Dielectric Constant ($\in'$)×Dielectric Loss Tangent (tan $\delta$).

Through lengthy research on impact absorptive materials used as shoe soles, the inventors have found that the energy or impact absorption capability can be improved by increasing the dielectric loss factor ($\in''$).

Studying the dielectric loss factor ($\in''$) of the above impact absorptive materials, the inventors have also found that the materials provide excellent impact absorption when the dielectric loss factor is 50 or larger at the frequency of 110 Hz.

In the following is a description of electromagnetic wave absorptive materials according to the present invention.

Metal sheets have been conventionally used to block electromagnetic waves coming from electronic devices. Due to mass production and for cost reduction, plastic materials that pass electromagnetic waves are concurrently in use as housings for electronic devices, resulting in leakage of electromagnetic waves.

Various attempts have been made to prevent electromagnetic waves from leaking. For example, sheet-like electromagnetic wave absorptive materials are provided by sintering and molding ferrite powders.

Such electromagnetic wave absorptive sheets do not provide sufficient electromagnetic wave absorption. They are hard to process or mold, and are fragile and unsuitable for mass production.

To solve such shortcomings, ferrite powders are mixed with a resin material. However, the electromagnetic wave absorption capability of such a material is still insufficient, and the ferrite powders have a poor miscibility with a polymer due to their relatively large surface area. As a result, the product will be very fragile.

Carbon powders or titanic acid alkali earth metal powders are also used instead of ferrite powders, but their electromagnetic wave absorptive characteristics are still insufficient.

The electromagnetic wave absorptive materials according to this invention can appropriately solve these technical problems of conventional electromagnetic wave absorptive materials. The material of the present invention provides excellent electromagnetic wave absorption, and is sufficiently sturdy and easy to process.

The base material of such an electromagnetic wave absorber of the present invention may be a polymer such as polyvinyl chloride, chlorinated polyethylene, polyethylene, polypropylene, ethylene-vinyl acetate copolymer, polymethyl methacrylate, polystyrene, styrene-butadinene-acrylonitrile copolymer, polyurethane, polyvinylformal, epoxy, phenol, urea, or silicon, or rubber polymer such as acryl rubber (ACR), acrylonitrile-butadinene rubber (NBR), styrene-butadinene rubber (SBR), butadiene rubber (BR), natural rubber (NR), isoprene rubber (IR), or chloroprene rubber (CR).

The electromagnetic wave absorptive material or absorber of the present invention contains a moment activator which can increase the magnitude of dipole moment in the base material. The relationship between the magnitude of dipole moment and the electromagnetic wave absorption capability is described below. Electromagnetic waves are propagation of vibration through an electromagnetic field in a vacuum or matter. The general mechanism of electromagnetic wave absorption in the electromagnetic wave absorptive material is that electromagnetic waves collide against the electromagnetic wave absorptive material to be partially converted into heat. The vibration of electromagnetic fields is damped through this energy conversion. Through research on the mechanism of electromagnetic wave absorption, the inventors have found that the displacement and recovery of the dipoles in the base material constituting the electromagnetic wave absorber significantly promotes the energy conversion.

The detail is given below. FIG. 1 shows a representative arrangement of dipoles 12 in a base material 11 prior to the propagation of electromagnetic waves (vibration of electromagnetic fields).

The dipoles 12 are held stable there. When electromagnetic waves propagate and displace the dipoles 12 in the base material 11, the dipoles 12 are displaced into an unstable state such as shown in FIG. 2, which are prompted to return to a stable state such as shown in FIG. 1.

Energy is then absorbed or converted. The electromagnetic wave absorption capability of the present invention is assumed to be provided through this conversion of energy provided by the displacement and recovery of the dipoles in the base material 11.

Based on this mechanism of electromagnetic wave absorption, the electromagnetic wave absorption capability of the base material 11 can be improved by increasing the magnitude of dipole moment in the base material 11. Thus, it is essential to use a base material which inherently has large dipole moment in the molecules in order to provide improved electromagnetic wave absorption.

Polymers inherently having a large magnitude of dipole moment may be a polarity polymer such as polyvinyl chloride, chlorinated polyethylene, acrylic rubber (ACR), acrylonitrile-butadiene rubber (NBR), styrene-butadiene rubber (SBR), or chloroprene rubber (CR). Such a polarity polymer is also very strong and easy to process.

The electromagnetic wave absorptive material according to this invention can be used for electronics appliances, and it is essential to maximize the electromagnetic wave absorption characteristic at working temperatures or between about −20 C. and about 40 C.

To maximize the electromagnetic wave absorption in the operating temperature region, the electromagnetic wave absorptive material according to this invention uses as its base material a polymer which has or will have a glass transition point in the operating temperature region, such as polyvinyl chloride, chlorinated polyethylene, polyethylene, polypropylene, ethylene-vinyl acetate copolymer, polymethyl methacrylate, polystyrene, or styrene-butadiene-acrylonitrile copolymer, to which a plasticizer such as di-2-ethylhexalphthalate (DOP), dibutylphthalate (DBP), or diisononylphthalate (DINP) is added to shift their glass transition point (Tg) into the operating temperature region of −20 C. to 40 C., or a rubber polymer such as acrylic rubber (ACR), acrylonitrile-butadiene rubber (NBR), styrene-butadiene rubber (SBR), butadiene rubber (BR), natural rubber (NR), isoprene rubber (IR), chloroprene rubber (CR), or chlorinated polyethylene, which themselves have a glass transition point (Tg) in the operating temperature region of −20 C. to 40 C.

In selecting an appropriate polymer for a base material, not only the magnitude of dipole moment in the molecules and the operating temperature region but also strength and easiness to process, usability, moldability, availability, temperature property, weatherability, and price should be duly considered.

The moment activator to be mixed in the base material may be a plurality of compounds selected from ones containing a benzothiazyl or benzotriazole radical or a diphenylacrylate radical such as ethyl-2-cyano-3,3-diphenylacrylate.

Preferably, 10 to 200 parts by weight of a moment activator is mixed in 100 parts by weight of a base material. If less than 10 parts by weight of a moment activator is mixed, the addition will not provide a sufficient increase of dipole moment, whereas if more than 200 parts by weight is mixed, the moment activator will not sufficiently mix with the polymer constituting the base material.

To select an appropriate moment activator to be mixed in the base material, the miscibility between the moment activator and the polymer of the base material should be appropriately considered, that is, the SP values of the both should be close enough.

The magnitude of dipole moment is subject to the base material and the moment activator blended therewith. The magnitude of dipole moment also varies with the working temperature as well as is affected by the magnitude of energy transferred to the base material. Thus, the base material and the moment activator should be selected so as to provide the largest possible amount of dipole moment considering the expected temperature and magnitude of energy.

As described above, the electromagnetic wave absorptive material containing a moment activator provides excellent electromagnetic wave absorption. The magnitude of dipole moment in the electromagnetic wave absorptive material (base material) is represented as the difference in dielectric constant ($\in'$) between A and B shown in FIG. 4. That is, the magnitude of dipole moment increases as the difference in dielectric constant ($\in'$) between A and B increases.

FIG. 4 is a graph showing a relationship between the dielectric constant ($\in'$) and the dielectric loss factor ($\in''$). The relationship between the dielectric constant ($\in'$) and the dielectric loss factor ($\in''$) is given as follows: Dielectric Loss Factor ($\in''$)=Dielectric Constant ($\in'$)×Dielectric Loss Tangent (tan δ).

Through research on electromagnetic wave absorptive materials, the inventors have found that the energy absorption capability or electromagnetic wave absorption capability can be improved by increasing the dielectric loss factor ($\in''$).

The inventors have also found that the material of the invention provides excellent electromagnetic wave absorption when the dielectric loss factor is 100 or larger at the frequency of 110 Hz.

Since different electromagnetic frequency regions need be coped with, it is essential to provide particularly favorable electromagnetic wave absorption characteristics in particular frequency ranges. To meet this requirement, the electromagnetic wave absorptive material of the present invention contains a base material moment activator which is appropriately selected. Different base materials and moment activators exhibit different electromagnetic wave absorption characteristics in different frequency regions. Accordingly, a base material and a moment activator which exhibit high electromagnetic wave absorption in different electromagnetic frequency regions should be selected and used.

There is a demand for a single electromagnetic wave damper which can effectively cover a wide frequency region. Such a requirement can be met by combining together a plurality of different types of electromagnetic wave absorptive materials having different frequency properties, or blending different moment activators exhibiting different peak electromagnetic wave absorption properties in different frequency regions with a plurality of different base materials exhibiting different frequency characteristics, or blending a plurality of different types of moment activator compounds exhibiting different frequency properties with a base material.

Such a combined type absorber may be provided, for example, by combining a sheet material having a peak property in a frequency range of 500 60 1,000 MHz with a sheet material having a peak property in a frequency range of 1,000 to 2,000 MHz to obtain a combined type sheet material by lamination or integration. Thus, an electromagnetic wave absorber sheet which exhibits an effective electromagnetic wave absorption characteristic in the frequency range between 500 and 2,000 MHz can be obtained.

A moment activator or compound exhibiting an effective electromagnetic wave absorption characteristic in the frequency range between 500 to 1,000 MHz and a moment activator or compound exhibiting an effective electromagnetic wave absorption characteristic in the frequency range between 1,000 to 2,000 MHz may be blended in a base material, which is molded into a sheet. Thus, an electromagnetic wave absorptive sheet exhibiting an effective electromagnetic wave absorption characteristic in the frequency range between 500 and 2,000 MHz can be obtained. This embodiment absorber can be a single sheet and does not require lamination or adhesion.

The electromagnetic wave absorptive material according to this invention may be used as a composite comprising a synthetic resin film such as of polyvinyl chloride, polyethylene, polypropylene, or polyethylene, or a fibrous sheet such as paper, cloth, or non-woven cloth.

The electromagnetic wave absorptive material or absorber of the present invention may be provided as an electromagnetic wave absorptive paint.

Conventional electromagnetic wave absorptive paints contain metal powders such as ferrite or titanic acid alkali earth metal or inorganic powders such as carbon powders.

Such conventional electromagnetic wave absorptive paints have an insufficient electromagnetic absorption capability and require a large amount of inorganic powders to be mixed therein to provide effective electromagnetic wave absorption. Furthermore, to provide sufficient electromagnetic wave absorption, the electromagnetic wave absorptive layer need be 20 to 30 mm thick. Such an electromagnetic wave absorber is heavy and may be removed easily from the application site. All these defects are detrimental factors for applications on electronics, communication apparatuses, or airplanes.

The electromagnetic wave absorptive paint according to this invention can adequately solve these technical problems. It can provide a thin and light electromagnetic wave absorptive layer which is capable of providing highly effective electromagnetic wave absorption.

The electromagnetic wave absorptive paint of the present invention contains a moment activator which can increase the amount of dipole moment.

The relationship between the magnitude of dipole moment and the electromagnetic wave absorption capability is described below. As is well known, electromagnetic waves are vibrations in electromagnetic fields through a vacuum or matter. Electromagnetic waves collide against an electromagnetic wave absorptive layer to be partially converted into heat, providing an energy conversion or damping.

Through research, the inventors have found that the displacement and recovery of the dipoles in the electromagnetic wave absorptive paint provides additional and excellent energy absorption.

The details are given below. FIG. 1 shows an arrangement of dipoles 12 in an electromagnetic wave absorptive layer (base material) 11 provided by the electromagnetic wave absorptive paint of the present invention prior to the propagation of electromagnetic waves. The dipoles 12 are stable. When electromagnetic waves propagate and displace the dipoles 12 in the electromagnetic wave absorptive layer 11, the dipoles 12 are displaced into an unstable state such as shown in FIG. 2, which are prompted to return to a stable state such as shown in FIG. 1.

Energy is then absorbed or consumed. The electromagnetic wave absorption capability is assumed to be provided through this absorption or conversion of energy provided by the displacement and recovery of the dipoles in the electromagnetic wave absorptive layer 11.

The paint base material may be a polymer such as polyvinyl chloride, chlorinated polyethylene, polyethylene, polypropylene, ethylene-vinyl acetate copolymer, polymethyl methacrylate, polystyrene, styrene-butadinene acrylonitrile copolymer, polyurethane, polyvinylformal, epoxy, phenol, urea, or silicon, or rubber polymer such as acryl rubber (ACR), acrylonitrile-butadiene rubber (NBR), styrene-butadiene rubber (SBR), butadiene rubber (BR), natural rubber (NR), isoprene rubber (IR), or chloroprene rubber (CR).

Based on the above mechanism of electromagnetic wave absorption, the electromagnetic wave absorption capability of the electromagnetic wave absorptive layer 11 can be improved by increasing the amount of dipole moment in the electromagnetic wave absorptive layer 11.

Accordingly, a polymer inherently having large dipole moment in the molecules may be advantageously used to provide highly effective electromagnetic wave absorption.

Polymers which inherently have large dipole moment may be polarity polymers such as polyvinyl chloride, chlorinated polyethylene, acrylic rubber (ACR), acrylonitrile-butadiene rubber (NBR), styrene-butadiene rubber (SBR), and chloroprene rubber (CR).

The electromagnetic wave absorptive paint according to this invention is applicable on electronics, communication apparatuses, vehicles, airplanes, interior materials, or electric appliances, so it is very important to maximize the electromagnetic wave absorption property at operating temperatures between about −20 C. and about 40 C.

To maximize the electromagnetic wave absorption in the operating temperature region, this invention proposes that the electromagnetic wave absorptive paint comprise a polymer which has or will have a glass transition point in the operating temperature region. A polymer which will have a glass transmission point in the operating temperature region may be polyvinyl chloride, polyethylene, polypropylene, ethylene-vinyl acetate copolymer, polymethyl methacrylate, polystyrene, or styrene-butadiene-acrylonitrile copolymer, to which a plasticizer such as di-2-ethylhexalphthalate (DOP), dibutylphthalate (DBP), or diisononylphthalate (DINP) is added to shift their glass transition point (Tg) into the operating temperature region of −20 C. to 40 C., or a rubber polymer such as acrylic rubber (ACR), acrylonitrile-butadiene rubber (NBR), styrene-butadiene rubber (SBR), butadiene rubber (BR), natural rubber (NR), isoprene rubber (IR), chloroprene rubber (CR), or chlorinated polyethylene which themselves have a glass transition point (Tg) in the operating temperature region of −20 C. to 40 C.

In selecting an appropriate paint base material, not only the magnitude of dipole moment in the molecules and the operating temperature region but also usability, moldability, availability, temperature property, weatherability, and price should be duly considered.

The moment activator may be a plurality of compounds selected from ones containing a benzothiazyl or benzothiazyl radical or ones containing a diphenylacrylate radical such as ethyl-2-cyano-3,3di-phenylacrylate.

Preferably, 10 to 200 parts by weight of a moment activator is mixed in 100 parts by weight of a paint base material. If less than 10 parts by weight of a moment activator is mixed, the dipole moment will not be sufficiently promoted, whereas if more than 200 parts by weight of a moment activator is mixed, the miscibility of the moment activator with the base paint material will be a problem and will not provide sufficient strength.

To select an adequate moment activator to be mixed in the paint base, the miscibility between the moment activator and the paint base material should be adequately considered. That is, the SP values of both should be close enough.

The magnitude of dipole moment is subject to the paint base material and moment activator. The same components will not provide the same magnitude of dipole moment under different temperature conditions.

The magnitude of dipole moment is also affected by the magnitude of energy transferred to the paint. Accordingly, the paint base and moment activator should be selected so as to provide the largest possible magnitude of dipole moment, considering the expected temperature and magnitude of energy.

An electromagnetic wave absorptive paint should advantageously be also workable in various electromagnetic frequency regions, so it is desirable to provide an electromagnetic wave absorptive paint which can effectively cover a wide frequency range. To meet this requirement, the electromagnetic wave absorptive paint may comprise a plurality of different paint base materials and moment activator compounds. Different types of paint base materials and moment activators exhibit different absorption characteristics in different frequency regions, which in combination can provide a wide range of electromagnetic wave absorption.

There is a demand for an electromagnetic wave absorber workable over a wide frequency range. Such a requirement is met by mixing a plurality of paint base materials and moment activator compounds exhibiting different electromagnetic wave absorption characteristics in different frequency regions.

A moment activator which effectively provides electromagnetic wave absorption in the frequency region between 500 to 1,000 MHz may be mixed in a paint base material which provides effective electromagnetic wave absorption in the frequency region between 1,000 to 2,000 MHz. Consequently, an electromagnetic absorptive layer provided with this electromagnetic wave absorptive paint provides effective electromagnetic wave absorption in the frequency range between 500 to 2,000 MHz.

A moment activator compound providing peak electromagnetic wave absorption in the frequency range between 500 to 1,000 MHz and a moment activator compound providing peak electromagnetic wave absorption in the frequency range between 1,000 to 2,000 MHz may be mixed in a paint base material. Consequently, the electromagnetic wave absorptive layer can provide effective electromagnetic wave absorption in the frequency range between 500 and 2,000 MHz.

A filler such as mica scales, glass pieces, glass fibers, carbon fibers, calcium carbonate, barite, or precipitated barium sulfate can be additionally blended in the paint material to further improve electromagnetic wave absorption capability and provide the paint film with strength. Preferably, 10 to 90% by weight of a filler is blended in the paint material.

If less than 10% by weight of a filler is blended, the addition of the filler will not sufficiently improve the absorption capability, whereas if more than 90% by weight of a filler is blended, the filler will not blend sufficiently and will reduce the integrity of the paint layer.

The electromagnetic wave absorptive paint according to this invention may be obtained in an emulsion form by mixing together the paint material and moment activator and optionally a filler or fillers, and dispersing the mixture in water or alcohol. Dispersant, wetting agent, thickener, antifoaming agent, or colorant may be further added as desired.

Such an electromagnetic wave absorptive paint of the present invention may be manufactured by mixing the paint base material and moment activator and a dispersing solvent such as water or alcohol as well as a filler, dispersant, or thickener as required, and dispersing and blending the mixture using conventional melting and mixing means such as a dissolver, Banbury mixer, planetary mixer, grain mill, open kneader, or vacuum kneader.

The electromagnetic wave absorptive paint may be applied by a conventional air spray gun, airless spray gun, or brushing.

As described above, the moment activator is mixed in the paint material to significantly increase the magnitude of dipole moment in order to provide an excellent electromagnetic wave absorption capability for the electromagnetic wave absorptive layer.

The magnitude of dipole moment in the electromagnetic wave absorptive layer is defined as the difference in dielectric constant ($\in'$) between A and B shown in FIG. 4. The magnitude of dipole moment increases as the difference in dielectric constant ($\in'$) between A and B increases.

FIG. 4 is a graph showing a relationship between the dielectric constant ($\in'$) and the dielectric loss factor ($\in''$). The relationship between the dielectric constant ($\in'$) and the dielectric loss factor ($\in''$) is given as follows: Dielectric Loss Factor ($\in''$)=Dielectric Constant ($\in'$)×Dielectric Loss Tangent (tan δ).

Through research on electromagnetic wave absorptive paints, the inventors have found that the energy absorption capability or the electromagnetic wave absorption capability can be improved by increasing the dielectric loss factor ($\in''$).

The inventors have also found that the paint provides excellent electromagnetic wave absorption when the dielectric loss factor is 100 or larger at the frequency of 110 Hz.

A vibration-proof material according to this invention is now described.

Rubber materials such as butyl rubber and NBR, which can be easily processed and possess sufficient mechanical strength, have been used as conventional vibration-proofing materials.

The vibration shielding capability (vibration-energy insulation or reduction capability) of such a rubber material is excellent, however, it is not high enough when used singly. Thus, for a vibration shielding of buildings and equipment, such a rubber material has been used in a composite form such as a laminate with steel plates or in a combination of such a laminate with a lead core or oil damper, which plastically deforms to absorb vibration energy.

Since such a conventional rubber material used as a vibration shield need be used in a composite form to provide sufficient vibration damping, its vibration-proof structure necessarily becomes complicated, so there has been a demand for an improved vibration-proof material.

Japanese Patent Laid-Open Publication No. 2-308835 and Japanese Patent Laid-Open Publication No. 2-34643 have proposed rubber compositions with improved vibration-proof capabilities.

Those disclosed rubber compositions, however, require a large amount of carbon, for example, 40 to 50 parts by weight of carbon black to be mixed in 100 parts by weight of a rubber material in order to provide high enough vibration shield, resulting in significantly reduced tensile strength and creep resistance.

The vibration-proof material according to this invention can appropriately solve these technical problems and provide improved vibration shield, which is mechanically strong and easy to process.

The vibration shielding material of the present invention contains in its base material a moment activator which can increase the magnitude of dipole moment in an amount 10 to 300 parts by weight in 100 parts by weight of the base material.

First, the relationship between the magnitude of dipole moment and the vibration-proof capability is described. FIG. 1 shows an arrangement of dipoles 12 in a base material 11 prior to the transfer of vibration energy. Those dipoles 12 are stable. When a vibration energy is transferred and displaces the dipoles 12 in the base material 11 into an unstable state such as shown in FIG. 2, the dipoles 12 are prompted to return to a stable state such as shown in FIG. 1.

Energy is then consumed. The vibration-proof capability is assumed to be provided through the consumption of energy provided by the displacement and recovery of the dipoles in the base material 11.

The vibration shielding capability of the base material 11 can be improved by increasing the magnitude of dipole moment in the base material 11. Thus, the base material should be one which inherently has large dipole moment in the molecules to provide an improved vibration-proof capability.

Polymers which inherently have large dipole moment may be a polarity polymer such as polyvinyl chloride, chlorinated polyethylene, acrylic rubber (ACR), acrylonitrile-butadiene rubber (NBR), styrene-butadiene rubber (SBR), or chloroprene rubber (CR).

Such a polarity polymer is mechanically strong and easy to process. The vibration damping material according to this invention can be applied on automobiles, interior materials, construction materials, and electric appliances, so it is essential to maximize the vibration-energy shielding at operating temperatures between about −20 C. and about 40 C.

To maximize the vibration-energy absorption capability in the operating temperature region, this invention proposes that the vibration shielding material comprise as its base material a polymer which has or will have a glass transition point in the operating temperature region. Polymers which will have a glass transmission point in the operating temperature range may be polyvinyl chloride, polyethylene, polypropylene, ethylene-vinyl acetate copolymer, polymethyl methacrylate, polyvinylidene fluoride, polyisoprene, polystyrene, styrene-butadiene-acrylonitrile copolymer, or styrene-acrylonitrile copolymer, to which a plasticizer such as di-2-ethylhexalphthalate (DOP), dibutylphthalate (DBP), or diisononylphthalate (DINP) is added to shift their glass transition point (Tg) into the operating temperature region of −20 C. to 40 C., or a rubber polymer such as acrylic rubber (ACR), acrylonitrile-butadiene rubber (NBR), styrene-butadiene rubber (SBR), butadiene rubber (BR), natural rubber (NR), isoprene rubber (IR), chloroprene rubber (CR), or chlorinated polyethylene which themselves have a glass transition point (Tg) in the operating temperature region of −20 C. to 40 C.

In selecting an appropriate polymer for the base material, not only the magnitude of dipole moment in the molecules and the operating temperature region but also usability, moldability, availability, temperature property, weatherability, and price should be duly considered.

The moment activator may be a plurality of compounds selected from ones containing a benzothiazyl or benzothiazyl radical or containing a diphenylacrylate radical such as ethyl-2-cyano-3,3-di-phenylacrylate.

10 to 300 parts by weight of a moment activator is mixed in 100 parts by weight of a base material. If less than 10 parts by weight of a moment activator is mixed, the addition of the moment activator will not sufficiently increase the magnitude of dipole moment, whereas if more than 300 parts by weight of a moment activator is mixed, the moment activator will not sufficiently blend with the base material.

To select an appropriate moment activator to be mixed in the base material, the miscibility between the moment activator and the base material should be duly considered. That is, the SP values of both should be close enough.

The magnitude of dipole moment is subject to the base material and moment activator. Even if they are the same, the magnitude of dipole moment varies with the working temperature. The magnitude of dipole moment is also affected by the magnitude of vibration energy transferred to the base material. Thus, the base material and moment activator should be selected so as to provide the largest possible magnitude of dipole moment, considering the possible temperature and magnitude of vibration energy.

A filler such as mica scales, glass pieces, glass fibers, carbon fibers, calcium carbonate, barite, or precipitated barium sulfate can be additionally blended in the base material to further improve the vibration-proof capability.

The vibration damping material according to this invention can be obtained by mixing together the base material and moment activator, and optionally a filler or fillers. They can be made into various forms such as sheets, blocks, grains, or fibers depending on applications or use conditions. The size or shape of the vibration-proof material may be controlled to provide different resonance frequency properties and may thus be determined as appropriate depending on applications or use conditions.

As described above, the vibration shielding material of the present invention provides an excellent vibration-proof capability.

The magnitude of dipole moment in the vibration absorptive material is represented as the difference in dielectric constant ($\in'$) between A and B shown in FIG. 4. The magnitude of dipole moment increases as the difference in dielectric constant ($\in'$) between A and B increases.

FIG. 4 is a graph showing a relationship between the dielectric constant ($\in'$) and the dielectric loss factor ($\in''$). The relationship between the dielectric constant ($\in'$) and the dielectric loss factor ($\in''$) is given as follows: Dielectric Loss Factor ($\in''$)=Dielectric Constant ($\in'$)×Dielectric Loss Tangent (tan δ).

Through research on vibration absorptive materials, the inventors have found that the vibration-proof capability (ζ) can be improved by increasing the dielectric loss factor ($\in''$). That is, the dielectric loss tangent (tan δ) indicating an electronic property of polymers corresponds to the elastic tangent (tan δ) indicating dynamic elasticity, and the relationship between the elastic tangent (tan δ) and the vibration-proof ratio (ζ) indicating the level of the vibration-proofing capability is expressed as follows: ζ=tan δ/2.

The inventors have also found that with a dielectric loss factor of 50 or larger at the frequency of 110 Hz, the material has a high elastic tangent (tan δ) or high damping ratio (ζ), which is in proportion to the elastic tangent (tan δ), and can provide excellent vibration shield.

A piezoelectric material according to this invention is now described.

A conventional piezoelectric material is formed by sintering a piezoelectric ceramic such as lead zirconate titanate (PZT) or barium titanate and polarization of the ceramic.

Such a piezoelectric material is fragile and hard to process over a large area. Besides, piezoelectric materials are generally expensive.

Another type of piezoelectric polymer is provided by drawing a fluorine resin such as PVDF and polarization thereof.

Although its fragile nature is improved, this piezoelectric material provides poorer performance than the piezoelectric ceramic and is more expensive due to the need for drawing and polarization processes.

Yet another piezoelectric material has been proposed, which is a composite material formed by combining the piezoelectric ceramic with a piezoelectric polymer.

Even this piezoelectric material cannot eliminate the disadvantages of the above conventional piezoelectric materials.

The piezoelectric material according to this invention can appropriately solve these technical weaknesses and does not require drawing or polarization treatment. Furthermore, the material of the present invention is relatively inexpensive but has an excellent piezoelectric property.

The piezoelectric material of the present invention is characterized in that a moment activator is blended in its base material to increase the magnitude of dipole moment therein.

The base material of this piezoelectric material may be a polymer such as polyvinyl chloride, polyethylene, chlorinated polyethylene, polypropylene, ethylene-vinyl acetate copolymer, polymethyl methacrylate, polyvinylidene fluoride, polyisoprene, polystyrene, styrene-butadiene-acrylonitrile copolymer, styrene-acrylonitrile copolymer, acrylonitrile-butadiene rubber (NBR), styrene-butadiene rubber (SBR), butadiene rubber (BR), natural rubber (NR), isoprene rubber (IR), or their selected mixture. Polyvinyl chloride is preferred for its moldability and low cost.

In the piezoelectric material comprising such a polymer as its base material, the relationship between the magnitude of dipole moment and the piezoelectric property is as follows.

As is well known, when a stress is applied onto the piezoelectric material, opposite electric charges appear at the opposite surfaces of the piezoelectric material. The magnitude of the charges is in proportion to the stress. When electric fields are applied to the piezoelectric material, distortion occurs. Its magnitude is in proportion to the electric fields. It is also known that a piezoelectric material consisting of a polymer produces a piezoelectric effect through polarization caused by the freezing of the orientation of the dipole moment in the main and side chains of the polymer.

This characteristic is provided through energy conversion. While studying the mechanism of the piezoelectric property of the piezoelectric material, the inventors have found that the dipoles in the piezoelectric material can be displaced with certain freedom and then recovered to a stable state, consuming energy and providing an excellent piezoelectric performance.

Further details are given below. FIG. 1 shows an arrangement of dipoles 12 in a piezoelectric base material 11 prior to the propagation of energy (stress). The dipoles 2 are stable. When an energy propagates and displaces the dipoles 12 in the piezoelectric material 11, the dipoles 12 in the piezoelectric material 11 are displaced into an unstable state such as shown in FIG. 2, which are then prompted to return to a stable state such as shown in FIG. 1.

Energy is then effectively converted. The extra piezoelectric property is assumed to be provided through the conversion of energy provided by the displacement and recovery of the dipoles in the piezoelectric material 11.

The piezoelectric property can be improved by increasing the amount of dipole moment in the piezoelectric material (the base material) 11.

Accordingly, a polymer material inherently having large dipole moment should advantageously be selected to provide a high piezoelectric capacity.

Polymers which inherently have large dipole moment are polarity polymers such as polyvinyl chloride, chlorinated polyethylene, acrylic rubber (ACR), acrylonitrile-butadiene rubber (NBR), styrene-butadiene rubber (SBR), and chloroprene rubber (CR).

When applied to a sensor, the piezoelectric material of the present invention is subjected to temperatures between about −20 C. and about 40 C. It is advantageous to use as the base material a polymer which has or will have a glass transition point in this operating temperature region because the piezoelectric capacity is maximized near the glass transition point of polymers.

Polymers which will have a glass transmission point in this operating temperature range may be polyvinyl chloride, polyethylene, polypropylene, ethylene-vinyl acetate copolymer, polymethyl methacrylate, polystyrene, or styrene-butadiene-acrylonitrile copolymer, to which a plasticizer such as di-2-ethylhexylphthalate (DOP), dibutylphthalate (DBP), or diisononylphthalate (DINP) is added to shift their glass transition point (Tg) into the operating temperature region, or a rubber polymer such as acrylic rubber (ACR), acrylonitrile-butadiene rubber (NBR), styrene-butadiene rubber (SBR), butadiene rubber (BR), natural rubber (NR), isoprene rubber (IR), chloroprene rubber (CR), or chlorinated polyethylene, which themselves have a glass transition point (Tg) in the operating temperature region.

In selecting an appropriate base material, not only the magnitude of dipole moment in the molecules and the operating temperature region but also usability, moldability, availability, temperature property, weatherability and price should be adequately considered.

According to the piezoelectric material of this invention, the moment activator mixed in the base material may be a plurality of compounds selected from ones containing a benzothiazyl or benzothiazyl radical or ones containing a diphenylacrylate radical such as ethyl-2-cyano-3,3-diphenylacrylate Preferably, 10 to 200 parts by weight of a moment activator is mixed in 100 parts by weight of a base material. If less than 10 parts by weight of a moment activator is mixed, the amount of dipole moment will not be sufficiently increased, whereas if more than 200 parts by weight of a moment activator is mixed, the moment activator will be insufficiently mixed with the base material and insufficient mechanical integrity will result.

To select an appropriate moment activator to be mixed in the base material, not only the magnitude of dipole moment but also the miscibility between the moment activator and the base material should be duly considered. The SP values of both should be close enough.

The magnitude of dipole moment is subject to the base material and moment activator. The amount of dipole moment varies with the working temperature. The magnitude of dipole moment is also affected by the magnitude of energy transferred to the base material. Thus, the base material and moment activator should be appropriately selected so as to provide the largest possible magnitude of dipole moment, considering the expected temperature and magnitude of energy.

A filler such as mica scales, glass pieces, glass fibers, carbon fibers, calcium carbonate, barite, or precipitated barium sulfate can be additionally blended in the base material to increase the mechanical strength of the piezoelectric material or to reduce the cost of the product. Preferably, 10 to 80% by weight of a filler is blended in the base material. If less than 10% by weight is blended, the addition of the filler will not sufficiently improve the strength, whereas if more than 80% by weight is blended, it will not be actually blended in the base material and will reduce the strength of the piezoelectric product.

The piezoelectric material or product of the invention can be manufactured by mixing such a base material and moment activator, and optionally a filler, dispersant, or thickener as desired, and dispersing and mixing the mixture using a conventional melting and mixing apparatus such as a dissolver, Banbury mixer, planetary mixer, grain mill, open kneader, or vacuum kneader.

As described above, the moment activator is mixed in the base material to significantly promote dipole moment to provide an excellent piezoelectric property. The magnitude of dipole moment in the piezoelectric material containing a moment activator is represented as the difference in dielectric constant ($\in'$) between A and B shown in FIG. 4. That is, the magnitude of dipole moment increases as the difference in dielectric constant ($\in'$) between A and B increases.

FIG. 4 is a graph showing a relationship between the dielectric constant ($\in'$) and the dielectric loss factor ($\in''$). The relationship between the dielectric constant ($\in'$) and the dielectric loss factor ($\in''$) is given as follows: Dielectric Loss Factor ($\in''$)=Dielectric Constant ($\in'$)×Dielectric Loss Tangent (tan $\delta$).

Through research on piezoelectric materials, the inventors have found that the energy absorption capability or piezoelectric capacity can be improved by increasing the dielectric loss factor ($\in''$).

The inventors have also found that the piezoelectric material of the present invention provides an excellent piezoelectric property when the dielectric loss factor is 50 or larger at the frequency of 110 Hz.

Embodiment

Various embodiments of the present invention are provided below, along with conventional comparative examples or comparisons, embodying vibration dampers, sound absorbers, impact absorbers, electromagnetic wave dampers, vibration shields, and piezoelectric materials, prepared from the energy conversion composition of the present invention.

First, embodiments of the vibration damper of the present invention are explained. Sample sheets 1 mm thick were prepared from 0 part by weight of DCHBSA in 100 parts by weight of acrylic rubber (AR-15, Japan Zeon Corporation) as Comparison 1. 10 parts by weight of DCHBSA was blended in 100 parts by weight of said acrylic rubber as Embodiment 1. They were made into sheets with kneading roll means set at 160 C.

Figure 5:
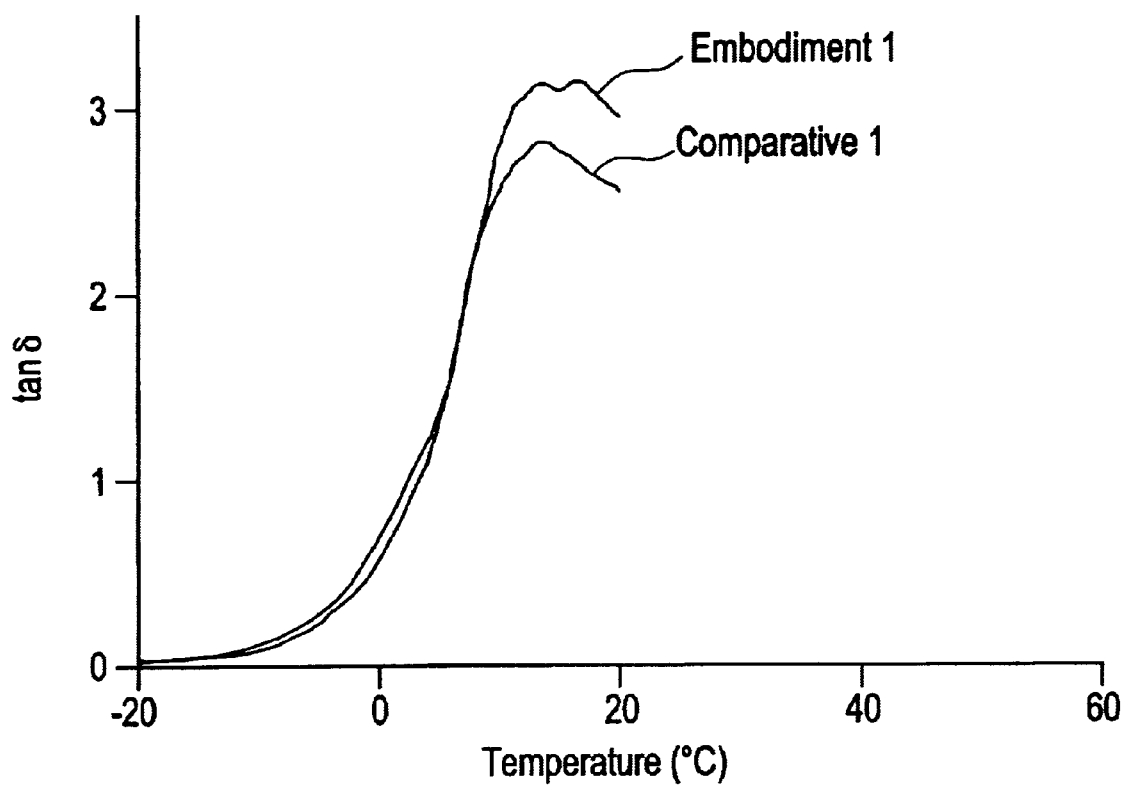
FIG. 5 is a graph showing respective relationships between the temperature and elastic tangents (tan δ) of Embodiment 1 and Comparison 1.

The sheets obtained according to Embodiment 1 and Comparison 1 were measured for elastic tangent (tan δ) at various temperatures. The measurements of elastic tangent (tan δ) were provided using Reovibron DDV-25FP (Orientech Inc.). The results are shown in FIG. 5.

Next, 0 part by weight (Comparison 2), 10 parts by weight (Embodiment 2), 30 parts by weight (Embodiment 3), 50 parts by weight (Embodiment 4), and 70 parts by weight (Embodiment 5) of DCHBSA were respectively mixed with NBR (202S (35% by weight nitrile) manufactured by Japan Synthetic Rubber Inc.) to provide sample sheets in the same manner as for Embodiment 1.

Figure 6:
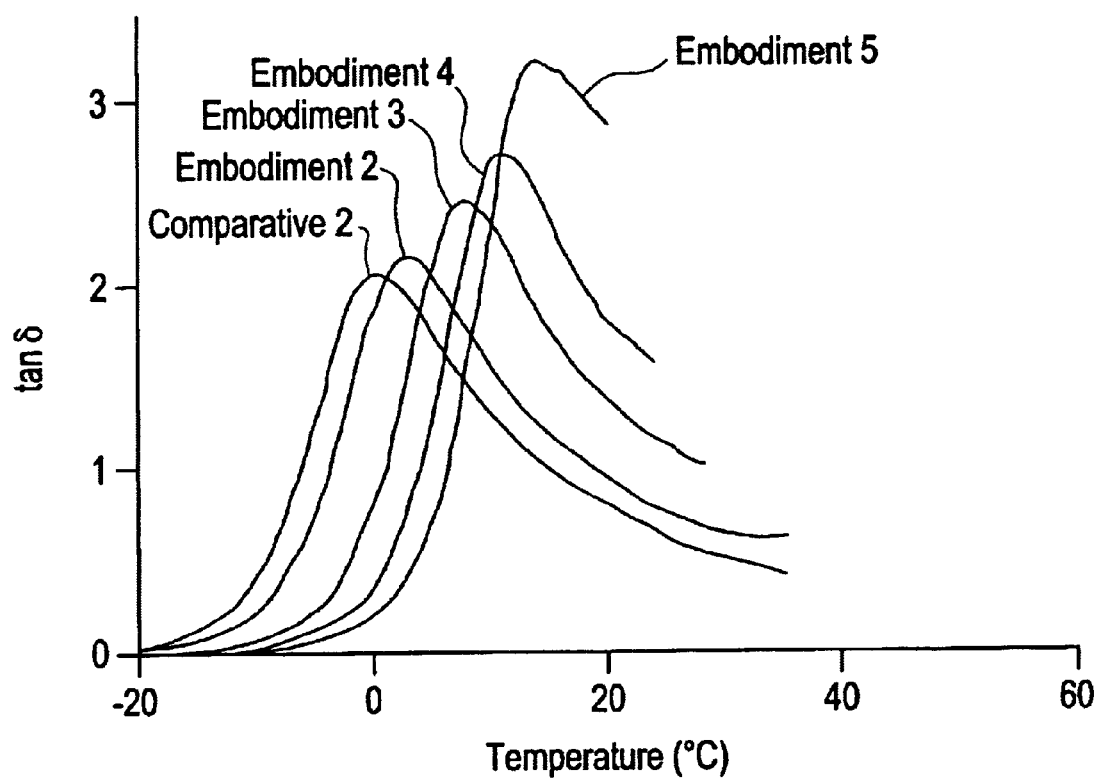
FIG. 6 is a graph showing respective relationships between the temperature and elastic tangents (tan δ) of Embodiments 2 to 5 and Comparison 2.

The sheets according to Embodiments 2 to 5 and Comparison 2 were measured for elastic tangent (tan δ) at various temperatures in the same manner as for Embodiment 1. The results are shown in FIG. 6.

Next, 0 part by weight (Comparison 3), 20 parts by weight (Embodiment 6), 30 parts by weight (Embodiment 7), 40 parts by weight (Embodiment 8), and 50 parts by weight (Embodiment 9) of DCHBSA were respectively mixed with NBR (DN401 (15% by weight nitrile) manufactured by Japan Zeon Inc.) to provide sample sheets in the same manner as for Embodiment 1.

Figure 7:
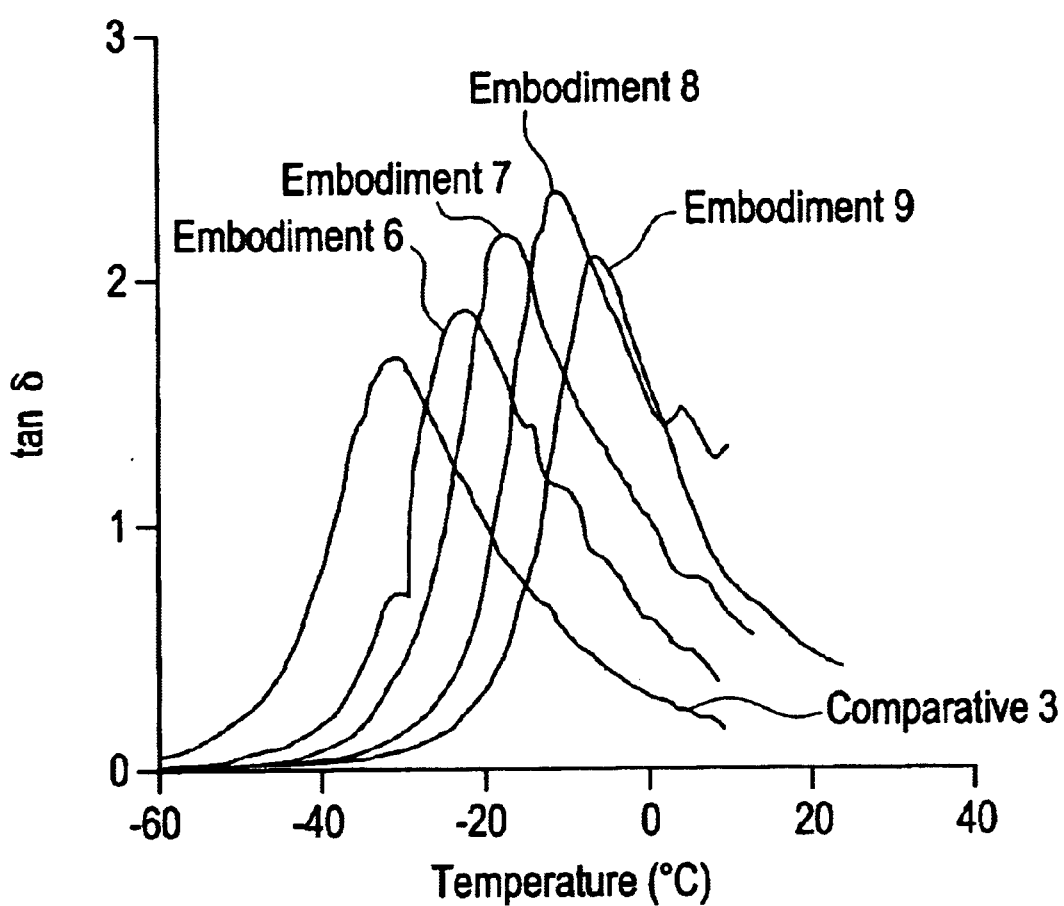
FIG. 7 is a graph showing respective relationships between the temperature and elastic tangents (tan δ) of Embodiments 6 to 9 and Comparison 3.

The sheets according to Embodiments 6 to 9 and Comparison 3 were measured for elastic tangent (tand) at various temperatures in the same manner as for Embodiment 1. The results are shown in FIG. 7.

Next, 0 part by weight (Comparison 4), 30 parts by weight (Embodiment 10), 50 parts by weight (Embodiment 11), and 100 parts by weight (Embodiment 12) of DCHBSA were respectively mixed with chlorinated polyethylene (Elasrene 352NA manufactured by Showa Denko Inc.) to provide sample sheets in the same manner as for Embodiment 1.

Figure 8:
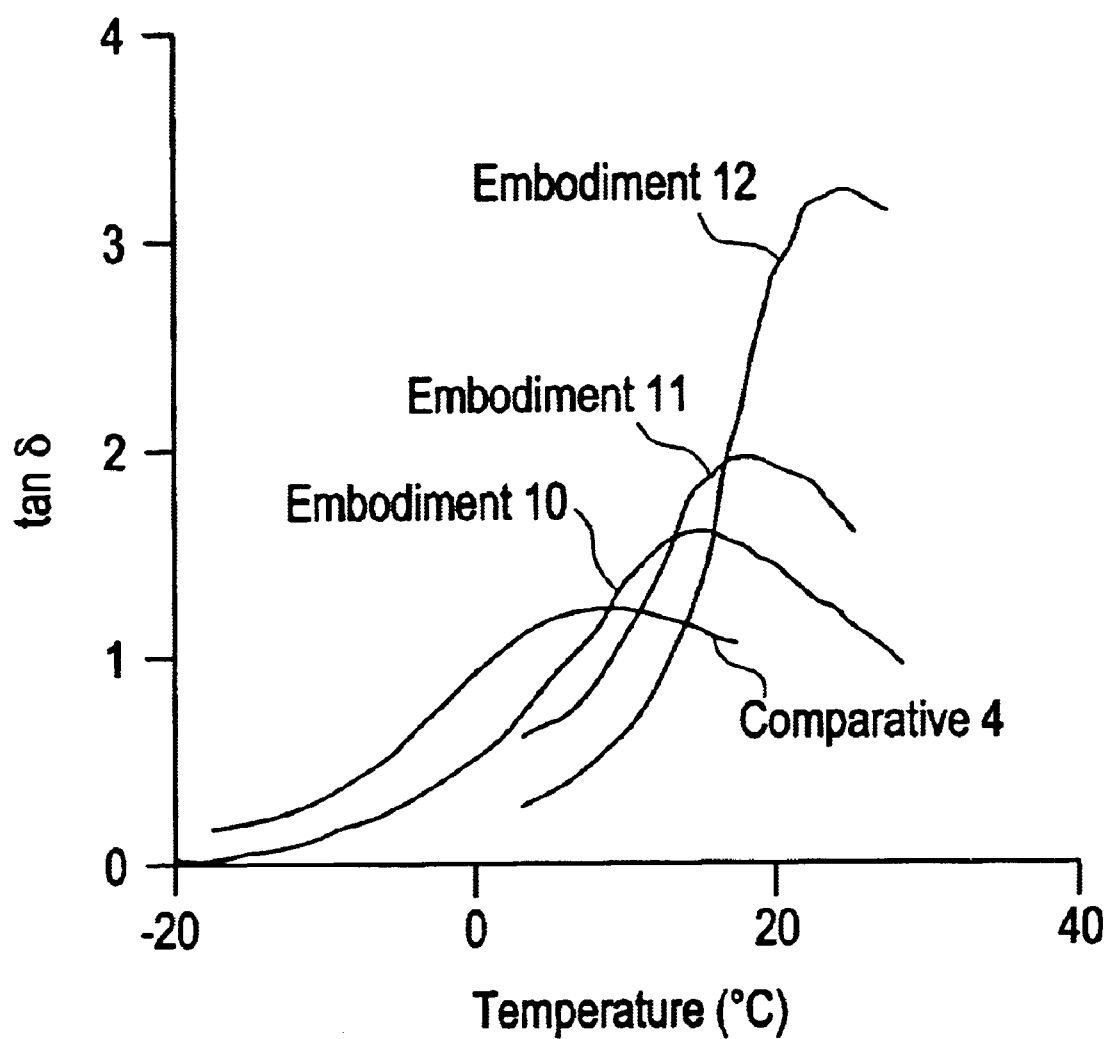
FIG. 8 is a graph showing respective relationships between the temperature and elastic tangents (tan δ) of Embodiments 10 to 12 and Comparison 4.

The sheets according to Embodiments 10 to 12 and Comparison 4 were measured for elastic tangent (tan δ) at various temperatures in the same manner as for Embodiment 1. The results are shown in FIG. 8.

Next, 0 part by weight (Comparison 5), 20 parts by weight (Comparison 6), 30 parts by weight (Comparison 7), 40 parts by weight (Comparison 8), and 50 parts by weight (Comparison 9) of DCHBSA were respectively mixed with isoprene rubber (2200 manufactured by Japan Zeon Inc.) to provide sample sheets in the same manner as for Embodiment 1.

Figure 9:
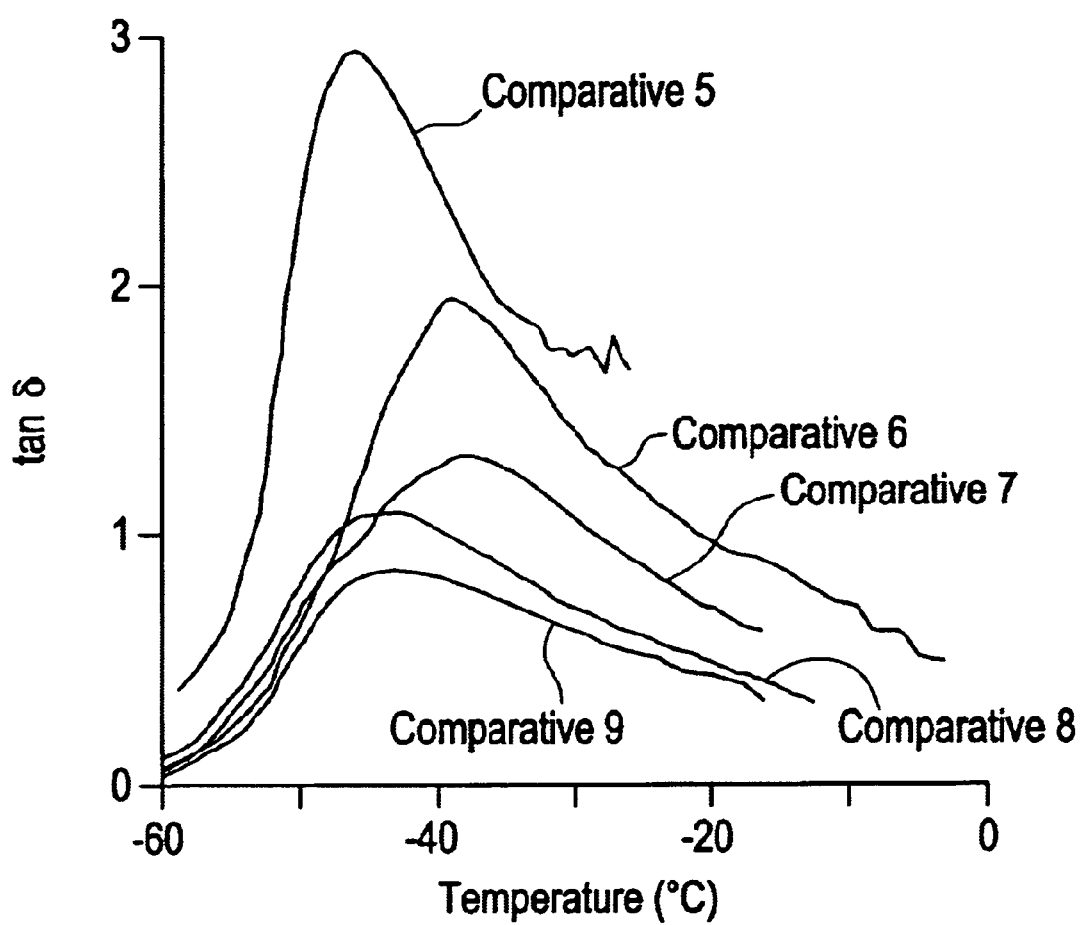
FIG. 9 is a graph showing respective relationships between the temperature and elastic tangents (tan δ) of Comparisons 5 to 9.

The sheets according to Comparisons 5 to 9 were measured for elastic tangent (tan δ) at various temperatures in the same manner as for Embodiment 1. The results are shown in FIG. 9.

As is apparent from FIGS. 5 to 9, the vibration damping levels of the sample sheets according to Embodiments 1 to 12 significantly increased as compared with the elastic tangents (tan δ) of the sample sheets according to Comparisons 1 to 4. The peaks of the elastic tangents (tan δ) of the sample sheets according to Embodiments 1 to 12 all fall near the normal temperature zone, indicating that these materials have an excellent vibration-energy absorption capability in the operation temperature region. In particular, the sheet according to Embodiment 1 has an elastic tangent (tan δ) of more than 3 near 20 C., indicating that this sheet is practically very useful.

Isoprene rubber (non-polarity polymer) with or without DCHBSA according to Comparisons 5 to 9 did not show improvement as seen from the respective elastic tangents (tan δ).

Next, embodiments of an unconstrained vibration damper of the present invention are explained. 65.0 parts by weight of mica scales (Clarite Mica 30C manufactured by Kurare Co., Ltd.), 13.0 parts by weight of DCHP, and 13.0 parts by weight of DCHBSA were mixed with 9 parts by weight of polyvinyl chloride, and the mixture was fed and kneaded in roll means set at 160 C. The kneaded mixture was then sandwiched between molds and heated at 180 C. for 180 seconds. It was then pressed at 80 kgf/cm$^2$ for 30 seconds with press means to provide a sheet 1 mm thick. The sheet was cut into test pieces of 67 mm×9 mm (Embodiment 13) for the measurement of loss factor.

65.0 parts by weight of mica scales (Clarite Mica 30C), 10.4 parts by weight of DCHP, 10.4 parts by weight of DCHBSA, and 5.2 parts by weight of ECDPA were mixed with 9 parts by weight of polyvinyl chloride to prepare test pieces (Embodiment 14) in the same manner as for Embodiment 1.

50.0 parts by weight of mica scales (Clarite Mica 30C) was added to 50 parts by weight of polyvinyl chloride with a DOP addition to prepare test pieces (Comparison 10) in the same manner as for Embodiment 1.

The test pieces according to Embodiments 13 and 14 and Comparison 10 were measured for dielectric loss factor ($\in$"), loss factor (η), and elastic tangent (tan δ). The loss factor (η) and elastic tangent (tan δ) were measured with a dynamic viscoelasticity measuring and testing apparatus (Reovibron DDV-25FP) and the dielectric loss factor ($\in$") was measured using Impedance/Gain Phase Analyzer 4194A (Yokokawa Hewlett Packard, Inc). Table 1 shows the results of the measurements of the dielectric tangent (tan δ), dielectric constant ($\in$'), and dielectric loss factor ($\in$") of each test piece, and FIG. 10 shows the results of the measurements of the loss factor (η).

TABLE 1

| Test Piece | Dielectric Tangent (tan δ) | Dielectric Constant ($\epsilon$') | Dielectric Loss Factor ($\epsilon$") |
|---|---|---|---|
| Embodiment 1 | 4.80 | 18.84 | 90.41 |
| Embodiment 2 | 4.42 | 17.97 | 79.43 |
| Comparison | 2.78 | 11.29 | 31.39 |

Figure 10:
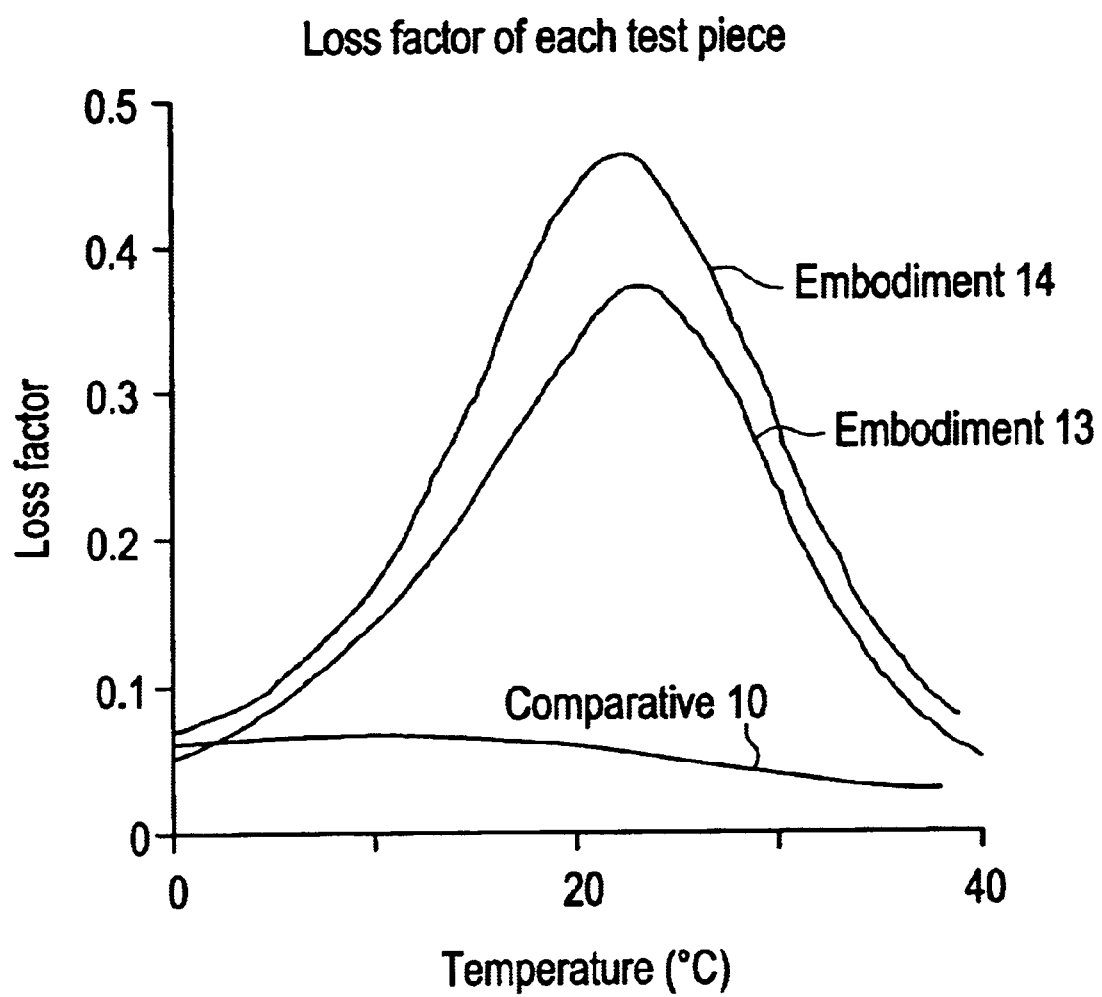
FIG. 10 is a graph showing respective relationships between the temperature and loss factors (η) of Embodiments 13 and 14 and Comparison 10.
Figure 11:
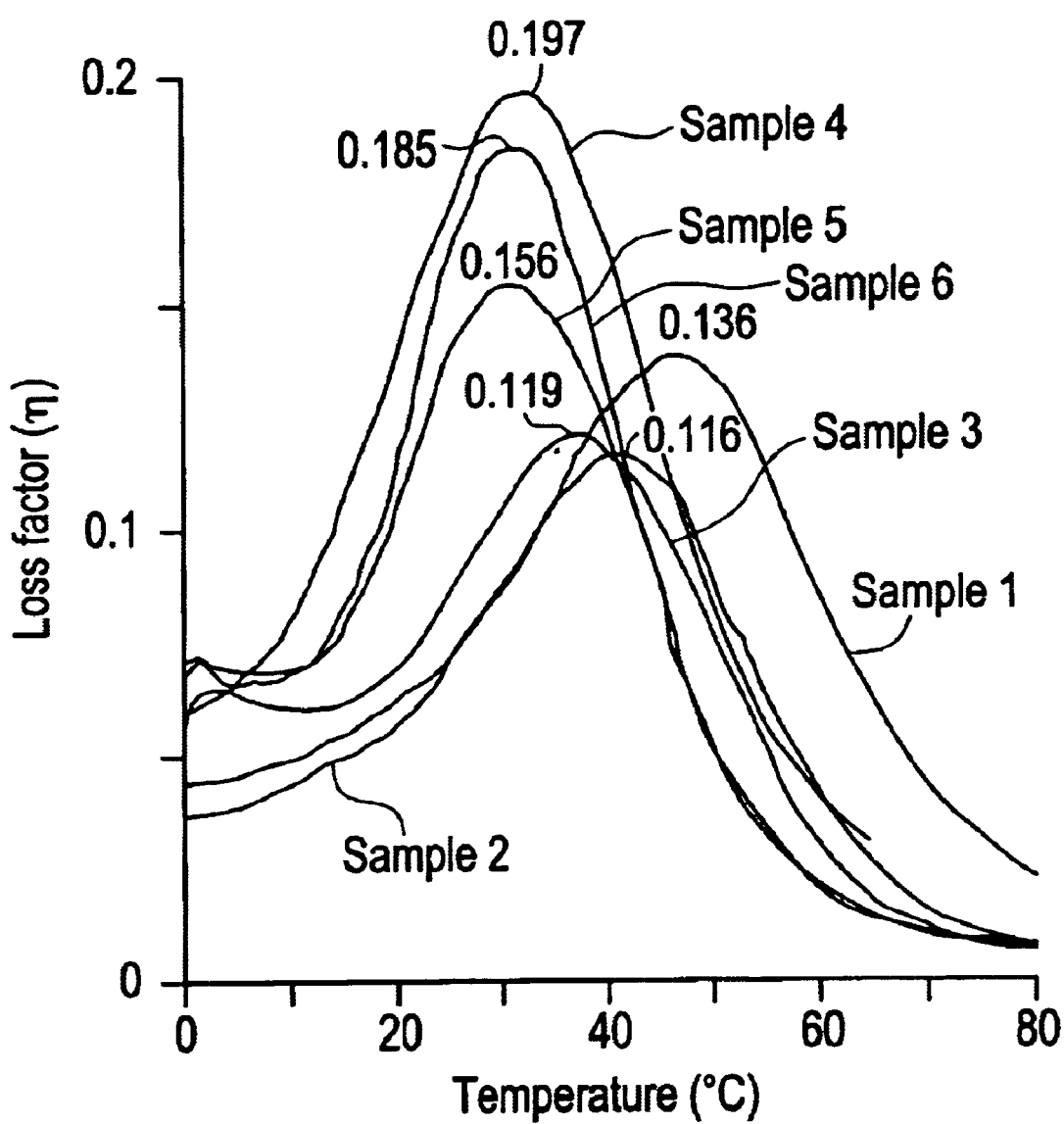
FIG. 11 is a graph showing respective relationships between the temperature and loss factors (η) of Samples 1 to 6.

Table 1 and FIG. 10 show that the test pieces according to Embodiments 13 and 14 exhibited a good vibration-energy absorption capability, that is, a loss factor (η) about five to seven times as high as that of Comparison 10, indicating that the vibration-energy absorption capability of the unconstrained damping material according to this invention is far superior to that of the conventional unconstrained damping materials. Embodiments were comparable to constrained conventional damping materials. In addition, the dielectric loss factors (∈") of the test pieces according to Embodiments 14 and 13 exceeded 50.

Next, embodiments for the vibration damping paint of the present invention are explained. Damping paints each containing a moment activator were each deposited on substrates (Table 2). Vibration damping layers formed on the substrates were respectively measured for dielectric loss factor (∈"), loss factor (η), and loss tangent (tan δ).

The dielectric loss factor (∈"), loss factor (h) and elastic tangent (tan δ) were measured using the dynamic viscoelasticity measuring and testing apparatus (Reovibron DDV-25FP) and the dielectric loss factor (∈") was measured with Impedance/Gain Phase Analyzer 4194A (Yokokawa Hewlett Packard, Inc).

TABLE 2

| Damping Layer | Ratio | η | Tan δ | Dielectric Loss Factor (ε") |
|---|---|---|---|---|
| EC818/DCHBSA | 10/0 | 0.064 | 0.062 | 33.19 |
| | 9/1 | 0.061 | 0.062 | 32.55 |
| (200 HK 71.7 wt %) | 8/2 | 0.072 | 0.085 | 40.26 |
| | 7/3 | 0.139 | 0.124 | 46.70 |
| | 6/4 | 0.107 | 0.111 | 43.03 |
| | 5/5 | 0.115 | 0.097 | 59.62 |
| EC818/2HPMMB | 9/1 | 0.070 | 0.050 | 34.44 |
| | 7/3 | 0.055 | 0.045 | 23.62 |
| (200 HK 71.7 wt %) | 5/5 | 0.063 | 0.045 | 28.65 |
| VN168/DCHBSA | 10/0 | 0.036 | 0.021 | 24.31 |
| | 9/1 | 0.050 | 0.100 | 13.57 |
| (200 HN 71.7 wt %) | 7/3 | 0.025 | 0.041 | 9.80 |
| | 5/5 | — | — | — |
| VN168/2HPMMB | 9/1 | 0.035 | 0.040 | 22.38 |
| | 7/3 | 0.030 | 0.021 | 13.24 |
| (200 HK 71.7 wt %) | 5/5 | 0.025 | 0.021 | 9.46 |

In Table 2, EC818 is an acrylic paint material manufactured by Dainippon Ink Chemical Industry, Inc. (50% nonvolatile component). VN-168 is vinyl acetate/acrylic copolymer manufactured by Dainippon Ink Chemical Industry, Inc. (44.0 to 46.0% of nonvolatile component), and 200HK is mica scales manufactured by Kurare Co., Ltd.

Next, the moment activators and mica scales shown in Table 3 were mixed in EC818 and VN-168 to produce vibration damping paints, which were respectively deposited on substrates. Vibration damping layers were formed on the substrates and measured for loss factor (η). The results are given in FIGS. 11 to 14. The loss factor (η) was measured using the dynamic viscoelasticity measuring and testing apparatus (Reovibron DDV-25FP).

TABLE 3

| Sample No. | Damping Layer (% by weight) (paint material/moment activator/filler) |
|---|---|
| 1 | EC818/DCHBSA/Mica scales (200 HK) (28.3/0/71.7) |
| 2 | EC818/DCHBSA/Mica scales (200 HK) (25.5/2.8/71.7) |
| 3 | EC818/DCHBSA/Mica scales (200 HK) (22.6/5.7/71.7) |
| 4 | EC818/DCHBSA/Mica scales (200 HK) (19.8/8.5/71.7) |
| 5 | EC818/DCHBSA/Mica scales (200 HK) (17.0/11.3/71.7) |
| 6 | EC818/DCHBSA/Mica scales (200 HK) (14.15/14.15/71.7) |
| 7 | EC818/2HPMMB/Mica scales (200 HK) (28.3/0/71.7) |

TABLE 3-continued

| Sample No. | Damping Layer (% by weight) (paint material/moment activator/filler) |
|---|---|
| 8 | EC818/2HPMMB/Mica scales (200 HK) (25.5/2.8/71.7) |
| 9 | EC818/2HPMMB/Mica scales (200 HK) (19.8/8.5/71.7) |
| 10 | EC818/2HPMMB/Mica scales (200 HK) (14.15/14.15/71.7) |
| 11 | VN168/DCHBSA/Mica scales (200 HK) (28.3/0/71.7) |
| 12 | VN168/DCHBSA/Mica scales (200 HK) (25.5/2.8/71.7) |
| 13 | VN168/DCHBSA/Mica scales (200 HK) (19.8/8.5/71.7) |
| 14 | VN168/2HPMMB/Mica scales (200 HK) (28.3/0/71.7) |
| 15 | VN168/2HPMMB/Mica scales (200 HK) (25.5/2.8/71.7) |
| 16 | VN168/2HPMMB/Mica scales (200 HK) (19.8/8.5/71.7) |
| 17 | VN168/2HPMMB/Mica scales (200 HK) (14.15/14.15/71.7) |

Figure 15:
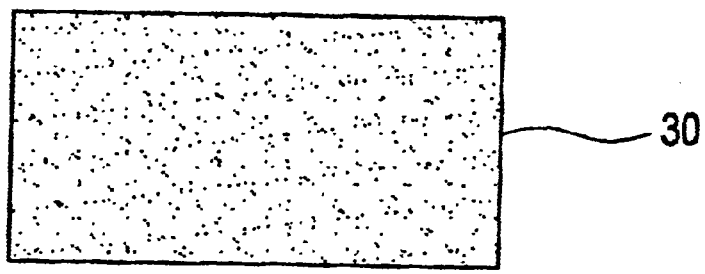
FIG. 15 is a schematic drawing showing a sound absorptive film comprising a sound absorptive material according to this invention.
Figure 16:
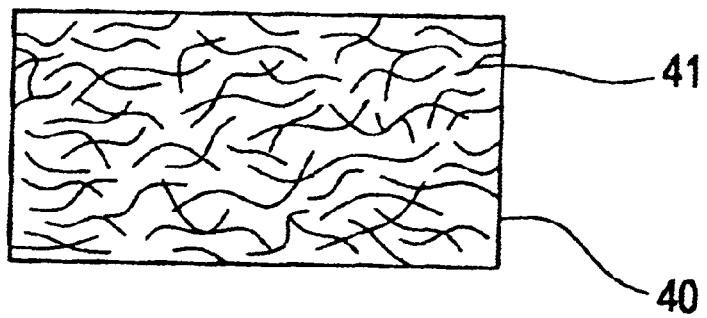
FIG. 16 is a schematic drawing showing a sound absorptive sheet comprising sound absorptive fibers according to this invention.
Figure 17:
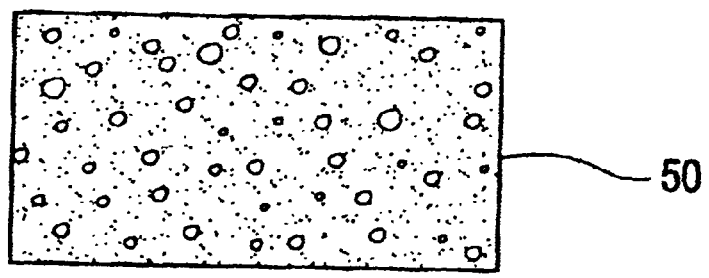
FIG. 17 is a schematic drawing showing a sound absorptive foam of the present invention.

In the following are given embodiments of the sound absorptive material of the present invention as shown in FIGS. 15 to 17. FIG. 15 shows a sound absorptive sheet 30 formed by adding 100 parts by weight of DCHBSA to a vinyl chloride resin and processing the mixture into a sheet 1 mm thick. FIG. 16 shows a sound absorptive sheet 40 formed by adding 100 parts by weight of DCHBSA to a vinyl chloride resin, spinning the mixture to prepare sound absorptive short fibers 41 to be incorporated into a sheet. FIG. 17 shows an open-cell foam polyurethane molding 50 with an addition of 100 parts by weight of DCHBSA.

Figure 18:
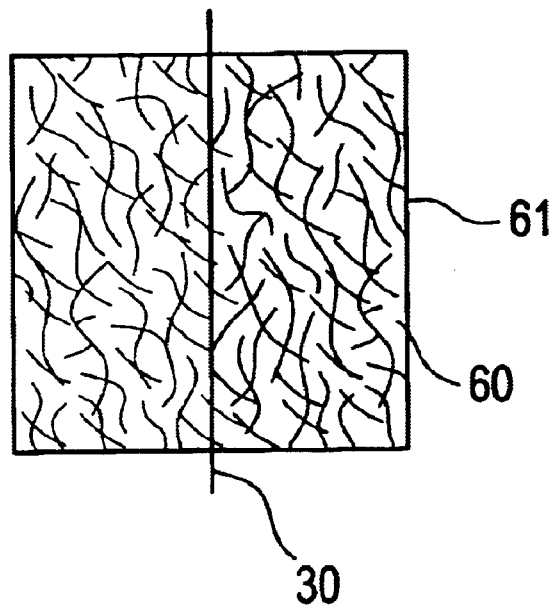
FIG. 18 is a schematic drawing showing a sound absorber incorporating a sound absorptive sheet according to the present invention.

FIG. 18 shows a sound absorptive sheet 30 of FIG. 15 disposed in a conventional sound absorber 60 comprising glass fibers 61. It was possible with the present invention to make the sound absorber 60 very thin and to still damp low-frequency sound of 500 Hz or less, which was not possible with a conventional noise damping material.

Figure 19:
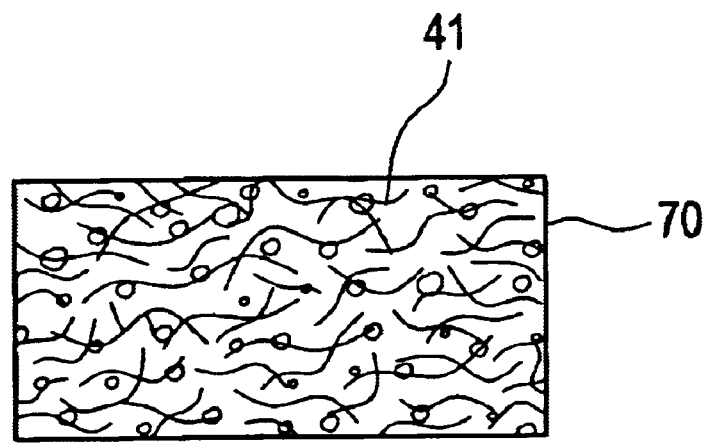
FIG. 19 is a schematic drawing showing a porous polyurethane foam containing sound absorption fibers according to this invention.
Figure 20:
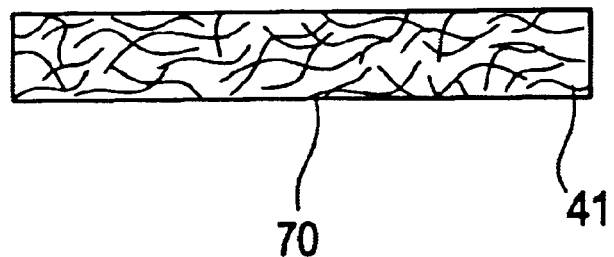
FIG. 20 is a schematic drawing showing a sound damping paper incorporating sound absorptive fibers according to this invention.
Figure 21:
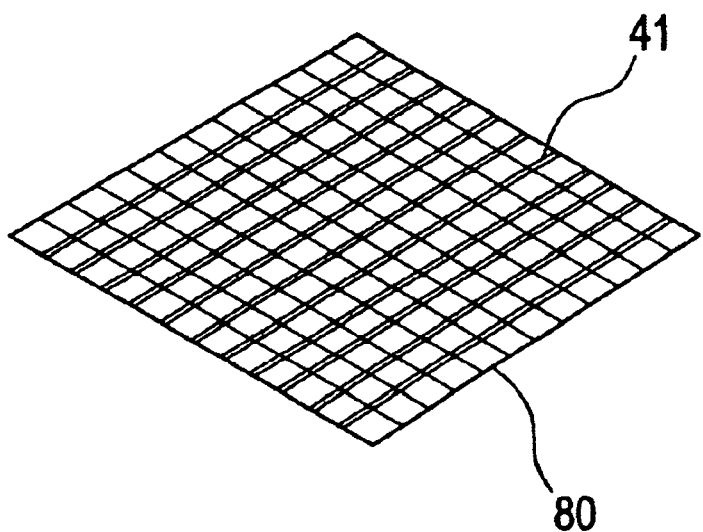
FIG. 21 is a schematic drawing showing a sound damping fabric incorporating sound absorptive fibers according to this invention.

FIG. 19 shows sound absorption fibers 41 contained in an open cell foam polyurethane molding. FIGS. 20 and 21 respectively show a sheet of paper 70 and a fabric 80 comprising the sound absorptive fibers 41. They provide an excellent sound absorption capability and can be advantageously used as wall or floor materials.

The sound absorptive materials with and without a moment activator in the resin matrix were tested. Table 4 shows the results.

TABLE 4

| No. | Sample | Mixing Ration % by weight | Dynamic Tan δ 23 C. |
|---|---|---|---|
| 1 | Chlorinated PE + DCHBSA | 50/50 | 3.2 |
| 2 | PVC + PVC(DOP) + NBR + DCHP + Calcium Carbonate | 12/32/6/30/20 | 2.0 |
| 3 | PVC(DOP) + NBR + Calcium Carbonate | 68/12/20 | 0.6 |
| 4 | PVC | 100 | 0.01 |

Figure 22:
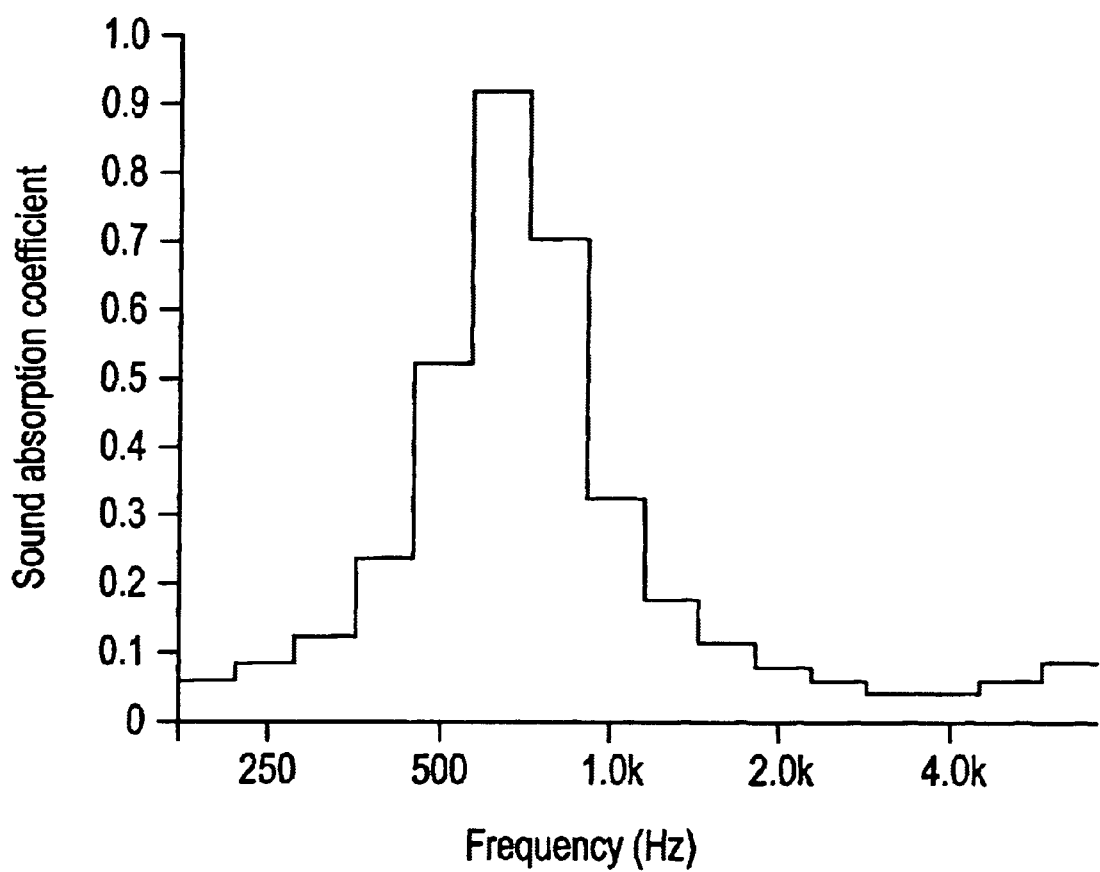
FIG. 22 is a graph showing the sound absorption performance of Sample 4 in relation to the frequency.
Figure 23:
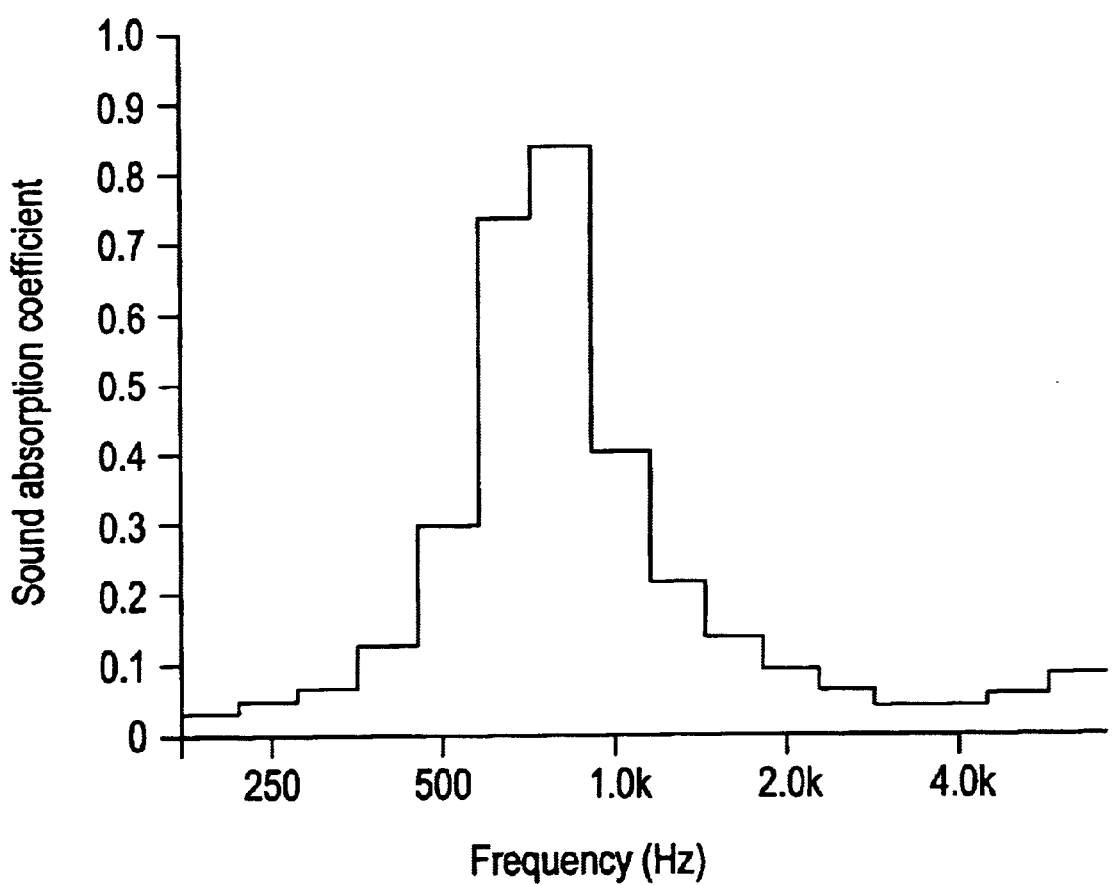
FIG. 23 is a graph showing the sound absorption performance of Sample 3 in relation to the frequency.
Figure 24:
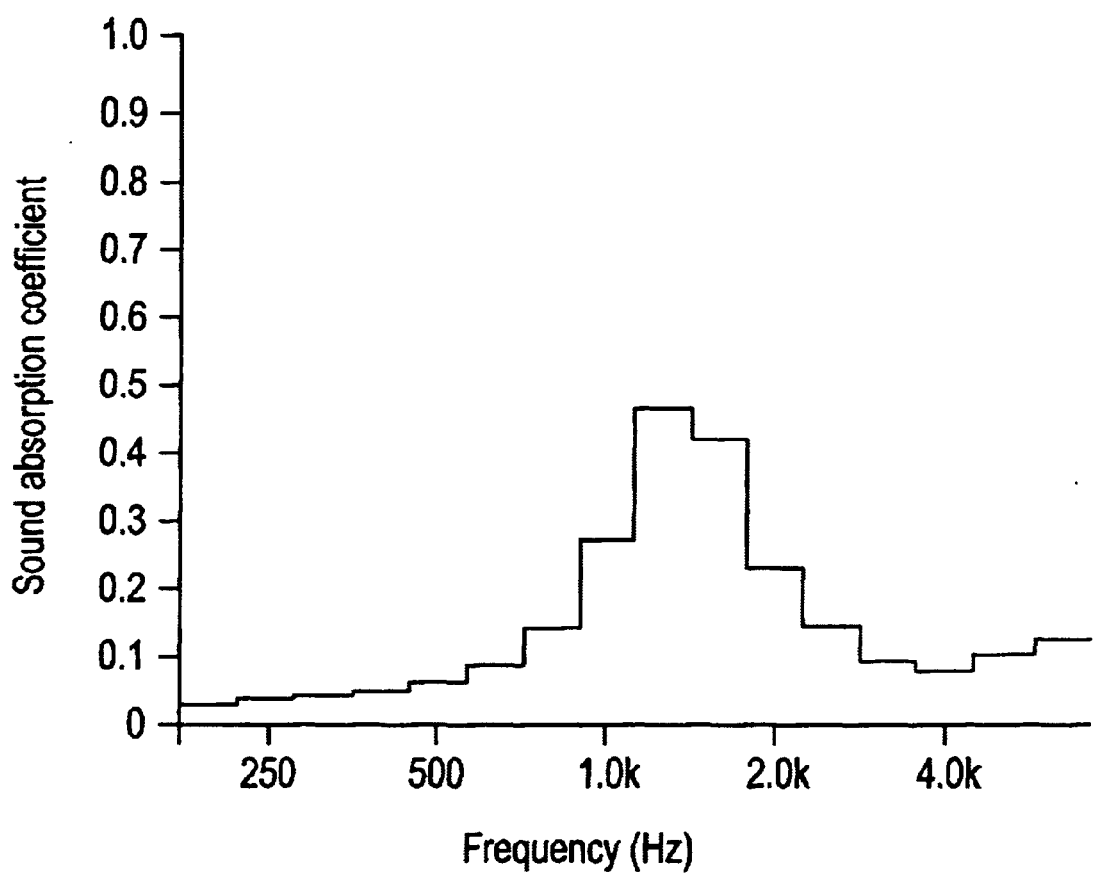
FIG. 24 is a graph showing the sound absorption performance of Sample 2 in relation to the frequency.
Figure 25:
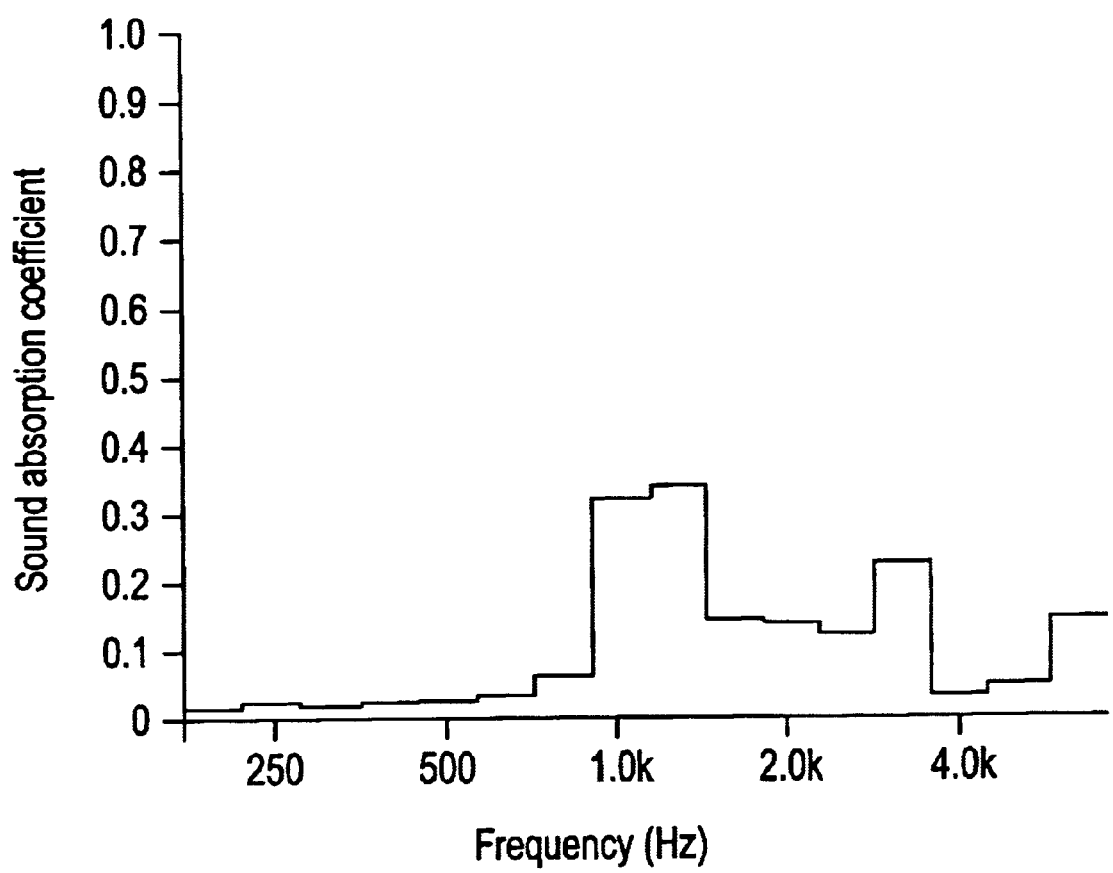
FIG. 25 is a graph showing the sound absorption performance of Sample 1 in relation to the frequency.

These samples were measured for the sound absorption coefficient using a vertical-incident-sound absorption coefficient measuring apparatus manufactured by B & K Inc. (JIS No. A1405). The results are shown in FIGS. 22 (Sample 1), 23 (Sample 2), 24 (Sample 3), and 25 (Sample 4). Each sample had ø29 and was 200 µm thick having a 20 mm air layer behind.

FIGS. 22 to 25 show that the sound absorption coefficient of Sample 4 consisting of only PVC was 0.1 to 0.3 between 1,000 Hz to 4,000 Hz while it was much lower than 0.1 in the low frequency region of 1,000 Hz or less, indicating that this sample does not sufficiently absorb sound energy. Sample 3, which contained no moment activator, exhibited a maximum sound absorption coefficient of 0.5 between 1,000 Hz and 2,000 Hz, which is somewhat higher than that of Sample 4 but also indicates that the energy absorption coefficient of Sample 3 is insufficient below 1,000 Hz.

On the contrary, Samples 1 and 2 exhibited a sound absorption coefficient of more than 0.3 between about 400 Hz and about 1,200 Hz, and it is noteworthy that Sample 1 had a maximum sound absorption coefficient of more than 0.9 and that Sample 2 had a maximum sound absorption coefficient of more than 0.8.

In addition, the dynamic tand of each sample shown in Table 4 and the sound absorption coefficient shown in FIGS. 22 to 25 show that the sound absorption coefficient increases as the dynamic tand increases.

Next, embodiments of the sound absorptive sheet of the present invention are explained. Paper (Tsumikusa paper P100-35; 12 g/m$^2$) provided fibrous sound absorptive sheets (136 g/m$^2$; 24 g/m$^2$ polymer), by means of immersing the paper in an emulsion of a polymer material comprising 100 parts by weight of DCHBSA and 100 parts by weight of chlorinated polyethylene, and drying same (Embodiment 15).

The fibrous sheet of Embodiment 15 was also used as Comparison 11.

Japan paper of 32 g/m$^2$ was used to provide fibrous sound absorptive sheets (73 g/m$^2$; 41 g/m$^2$) by means of immersing the paper in an emulsion of a polymer material comprising 100 parts by weight of DCHBSA and 100 parts by weight of chlorinated polyethylene, and drying same (Embodiment 16).

The fibrous sheet of Embodiment 16 was also used as Comparison 12.

Silk fabric of 36 g/m$^2$ was used to provide fibrous sound absorptive sheets (204 g/m$^2$; 168 g/m$^2$ polymer) by means of immersing the fabric in an emulsion of a polymer material comprising 100 parts by weight of DCHBSA and 100 parts by weight of chlorinated polyethylene, and drying same (Embodiment 17).

The fibrous sheet of Embodiment 17 was also used as Comparison 13.

The sound absorptive sheets according to Embodiments 15 to 17 and Comparisons 11 to 13 were measured for dynamic loss tangent (tan δ), dielectric tangent (tan δ), dielectric loss factor ($\in$") and dielectric constant ($\in$').

Figure 26:
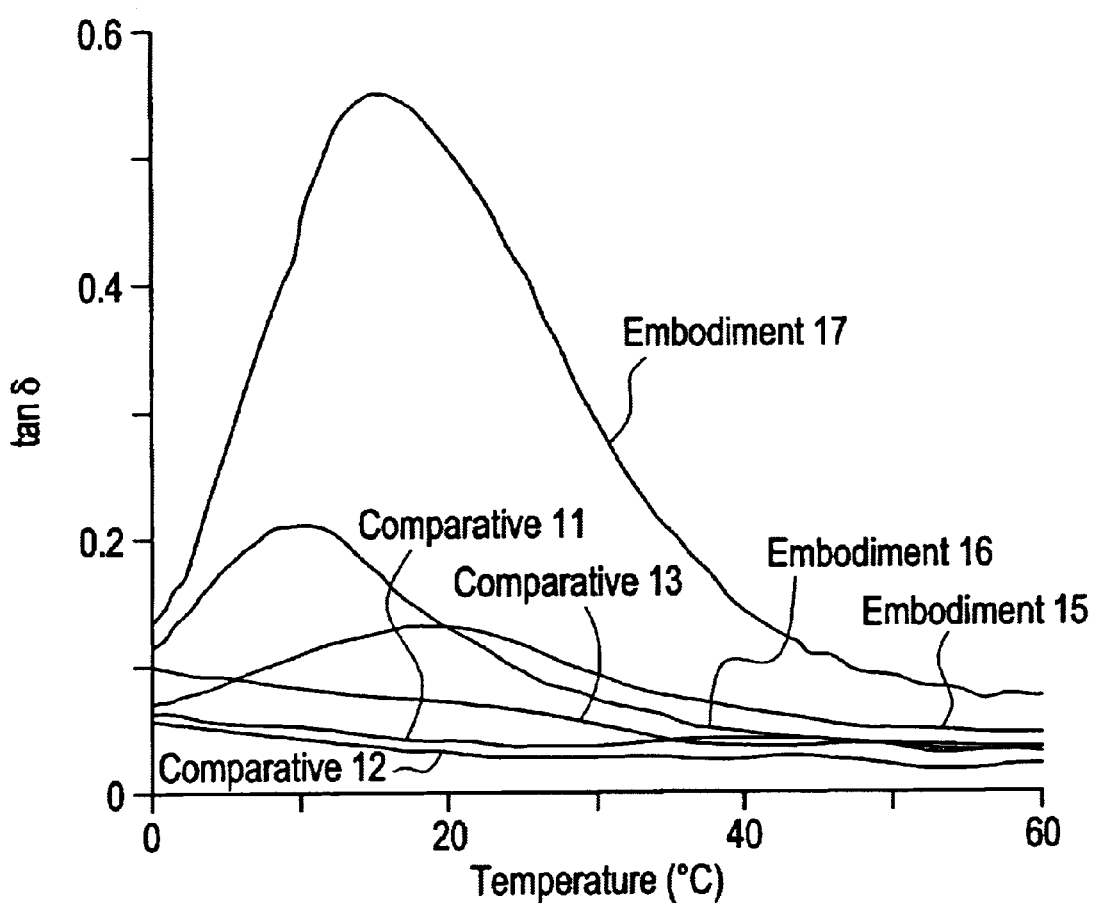
FIG. 26 is a graph showing respective relationships between the temperature and dynamic loss tangents (tan δ) of the sound absorptive sheets according to Embodiments 15 to 17 and Comparisons 11 to 13.

The results are shown in Table 5 and FIG. 26.

TABLE 5

| Sound Absorptive Sheet | Dielectric Tangent δ | Dielectric Constant ($\epsilon$') | Dielectric Loss Factor ($\epsilon$") |
|---|---|---|---|
| Embodiment 15 | 5.43 | 1.86 | 10.11 |
| Embodiment 16 | 5.1 | 1.4 | 7.3 |
| Embodiment 17 | 5.1 | 4.4 | 22.4 |
| Embodiment 11 | 4.57 | 0.22 | 0.99 |
| Embodiment 12 | 2.7 | 1.22 | 3.3 |
| Embodiment 13 | 4.1 | 1.7 | 6.95 |

These sound absorptive sheets were measured for sound absorption coefficient using the vertical-incident-sound absorptive coefficient measuring apparatus manufactured by B & K Inc. (JIS No. A1405).

Figure 27:
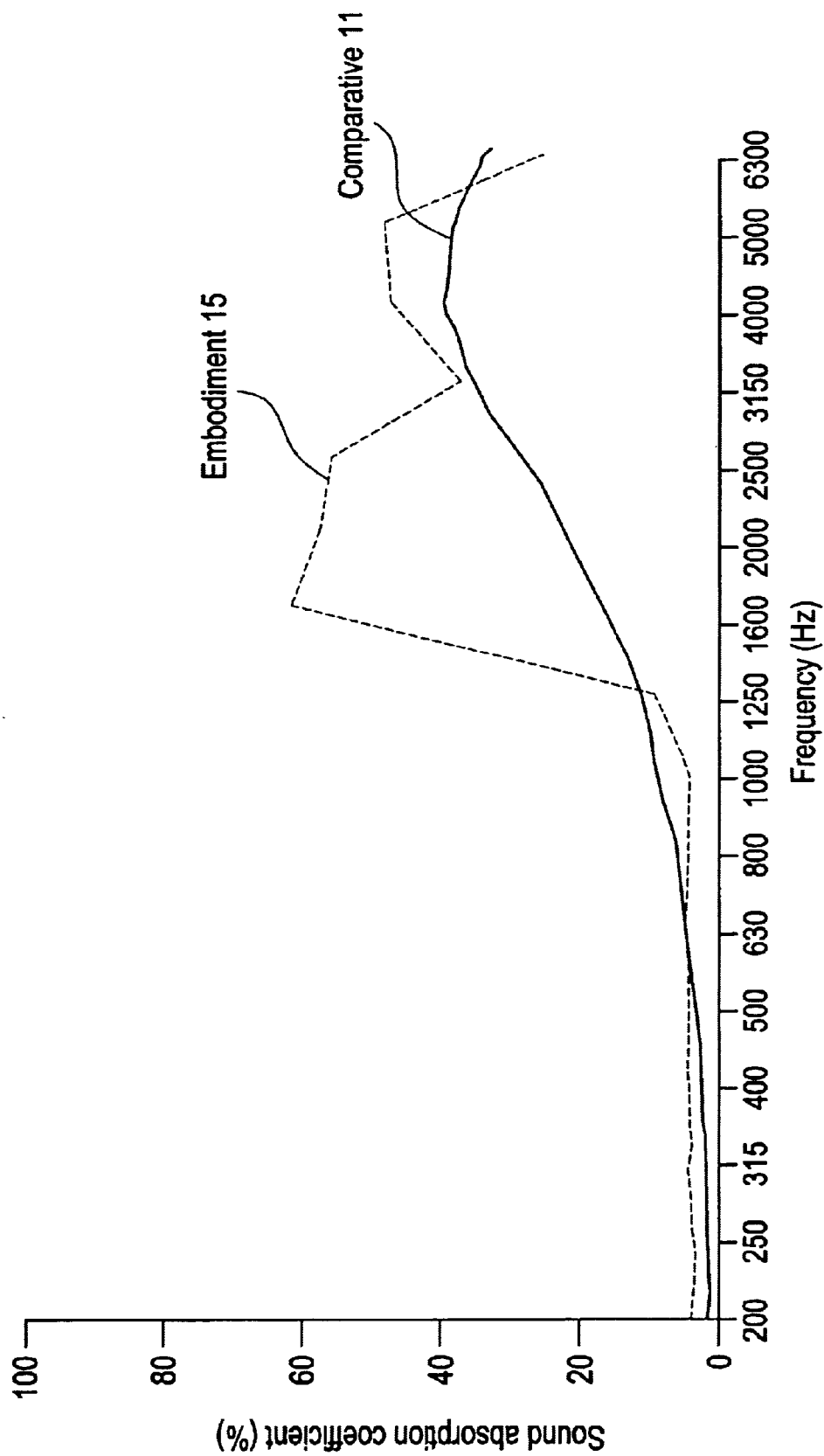
FIG. 27 is a graph showing respective sound absorption performances of the sound absorptive sheets according to Embodiment 15 and Comparison 11 in relation to the frequency.
Figure 28:
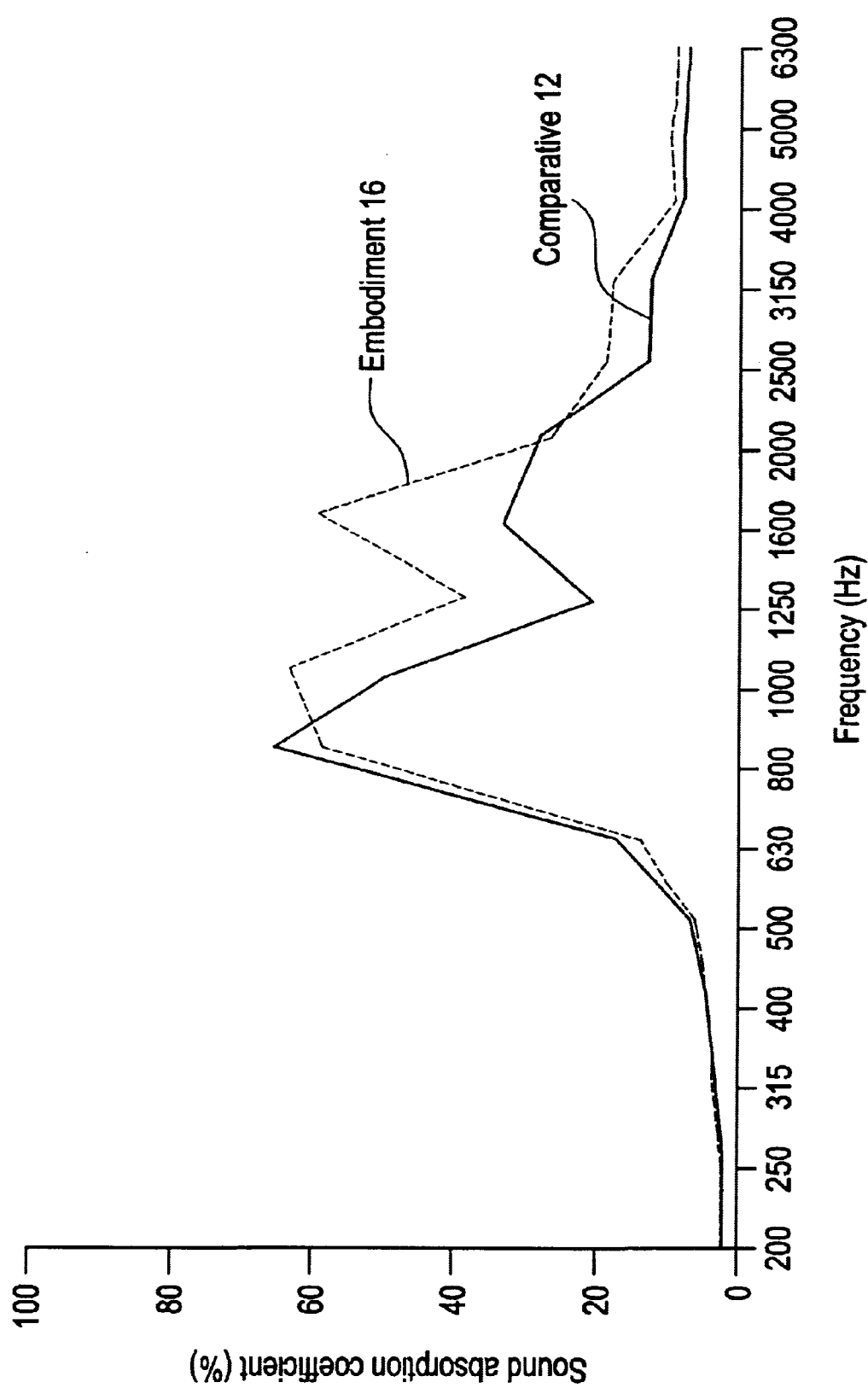
FIG. 28 is a graph showing respective sound absorption performances of the sound absorptive sheets according to Embodiment 16 and Comparison 12 in relation to the frequency.
Figure 29:
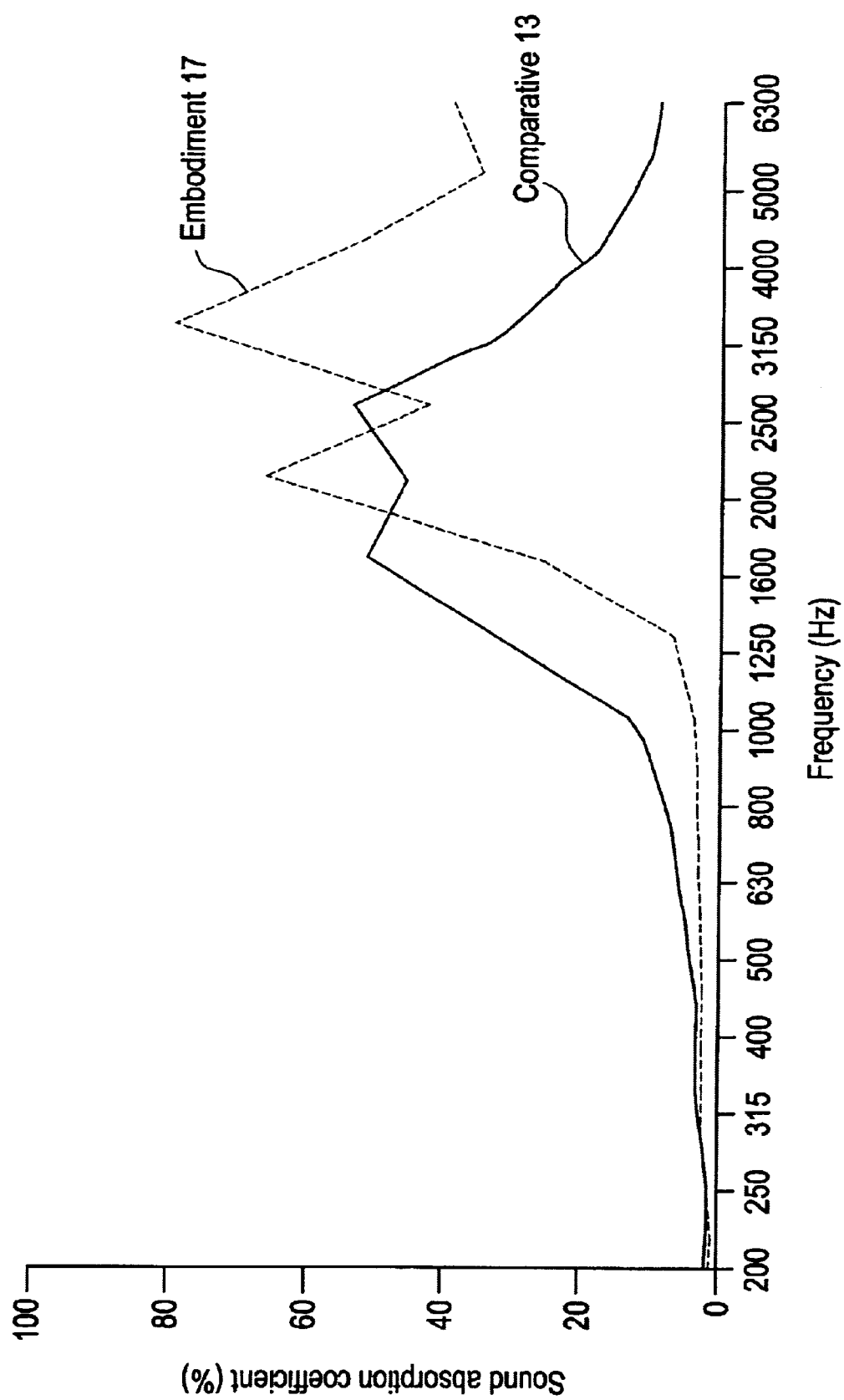
FIG. 29 is a graph showing respective sound absorption performances of the sound absorptive sheets according to Embodiment 17 and Comparison 13 in relation to the frequency.

The results are shown in FIGS. 27 (Embodiment 15 and Comparison 11), 28 (Embodiment 16 and Comparison 12), and 29 (Embodiment 17 and Comparison 13). Each sample had ø29 and was 200 μm thick having a 20 mm air layer behind.

Next, embodiments of the foam sound absorptive material of the present invention are explained. DCHBSA was mixed in liquid A (Polyol MP-923 manufactured by Mitsui Toatsu Chemical, Inc.). The mixture was kneaded for five minutes using ceramic triple roller means.

Liquid B (Cosmonate MC-71 manufactured by Mitsui Toatsu Chemical, Inc.) was added to the kneaded mixture and stirred at a high speed for ten seconds and then fed in a pipe 100 mm in diameter for foaming (room temperature). A cover was attached on the upper opening of the pipe to prevent the mixture from foaming over the volume of the pipe.

Liquids A and B were mixed at the weight ratio of 100 to 47.

The mixture of 100 parts by weight was respectively blended with 30 parts by weight (Embodiment 18), 50 parts by weight (Embodiment 19), and 100 parts by weight (Embodiment 20) of DCHBSA to provide three types of mixtures. They were adjusted to provide an expansion rate of 20 times the pipe volume.

The foamed moldings were cut into test pieces 20 mm thick. A test piece containing no DCHBSA was also prepared as Comparison 14.

The sound absorptive sheets according to Embodiments 18 to 20 and Comparison 14 were measured for dielectric tangent (tan δ), dielectric loss factor ($\in$"), and dielectric constant ($\in$'). The results are shown in Table 6.

TABLE 6

| Sound Absorptive Material | Dielectric Tangent δ | Dielectric Constant ($\epsilon$') | Dielectric Loss Factor ($\epsilon$") |
|---|---|---|---|
| Embodiment 18 | 0.98 | 9.91 | 9.71 |
| Embodiment 19 | 1.11 | 11.40 | 12.66 |
| Embodiment 20 | 1.58 | 24.77 | 39.10 |
| Comparison 14 | 0.81 | 6.68 | 5.41 |

These test pieces were measured for sound absorption coefficient using the vertical-incident-sound absorption coefficient measuring apparatus manufactured by B & K Inc. (JIS No. A1405). The results are shown in FIG. 30.

Figure 30:
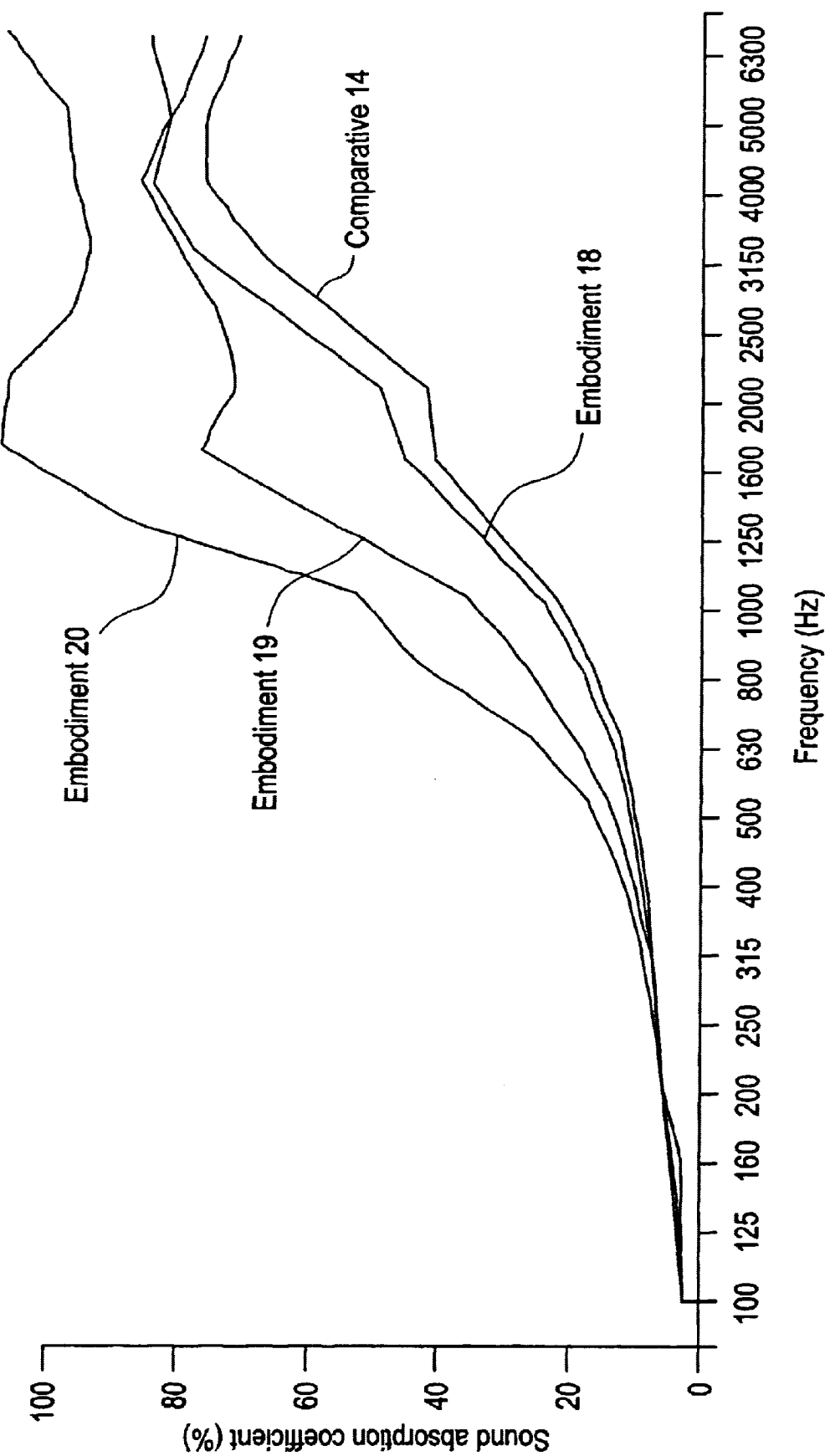
FIG. 30 is a graph showing respective sound absorption performances of the test pieces of Embodiments 18 to 20 and Comparison 14 in relation to the frequency.

FIG. 30 shows that when the frequency was lower than 2,000 Hz, the sound absorption coefficient of Comparison 14 rapidly decreased to half the coefficient between 1,000 Hz and 2,000 Hz. The figure also shows that the sound absorption coefficient increased as the mixing amount of DCHBSA increased (Embodiment 18 to 20). In particular, between 1,000 Hz and 2,000 Hz, the sound absorption coefficient of Embodiment 3 was unexpectedly high, twice to 2.5 times that of Comparison 14.

Next, embodiments of the sound absorptive fibers of the present invention are explained. DCHBSA was mixed in chlorinated polyethylene and the mixture as a fibrous material was fed in extrusion-spinning means. The mixing ratios (parts by weight) of chlorinated polyethylene to DCHBSA were 100 to 0 (Comparison 15) and 100 to 100 (Embodiment 21). The diameter of a screw blade of the spinning machine was 25 mm, and the diameter of a nozzle was 1 mm. The temperature of the nozzle was 130 C. The extruded fibers were drawn to provide the diameter of 0.4 mm and then cut to 40 mm long pieces.

These fibers were immersed and stirred in a container containing a water solution of 1% polyvinyl alcohol, and when the solution became uniform, the water solution was drained and a 3-D test piece (non-woven cloth) of polyvinyl alcohol fabric was obtained on the mesh at the bottom of the container.

The test pieces of Embodiment 21 and Comparison 15 were measured for dielectric tangent (tan δ), dielectric loss factor (∈"), and dielectric constant (∈'). The results are shown in Table 7.

TABLE 7

| Test Piece | Dielectric Tangent δ | Dielectric Constant (ε') | Dielectric Loss Factor (ε") |
|---|---|---|---|
| Embodiment 21 | 1.71 | 25.31 | 43.28 |
| Embodiment 15 | 0.62 | 6.38 | 3.96 |

Figure 31:
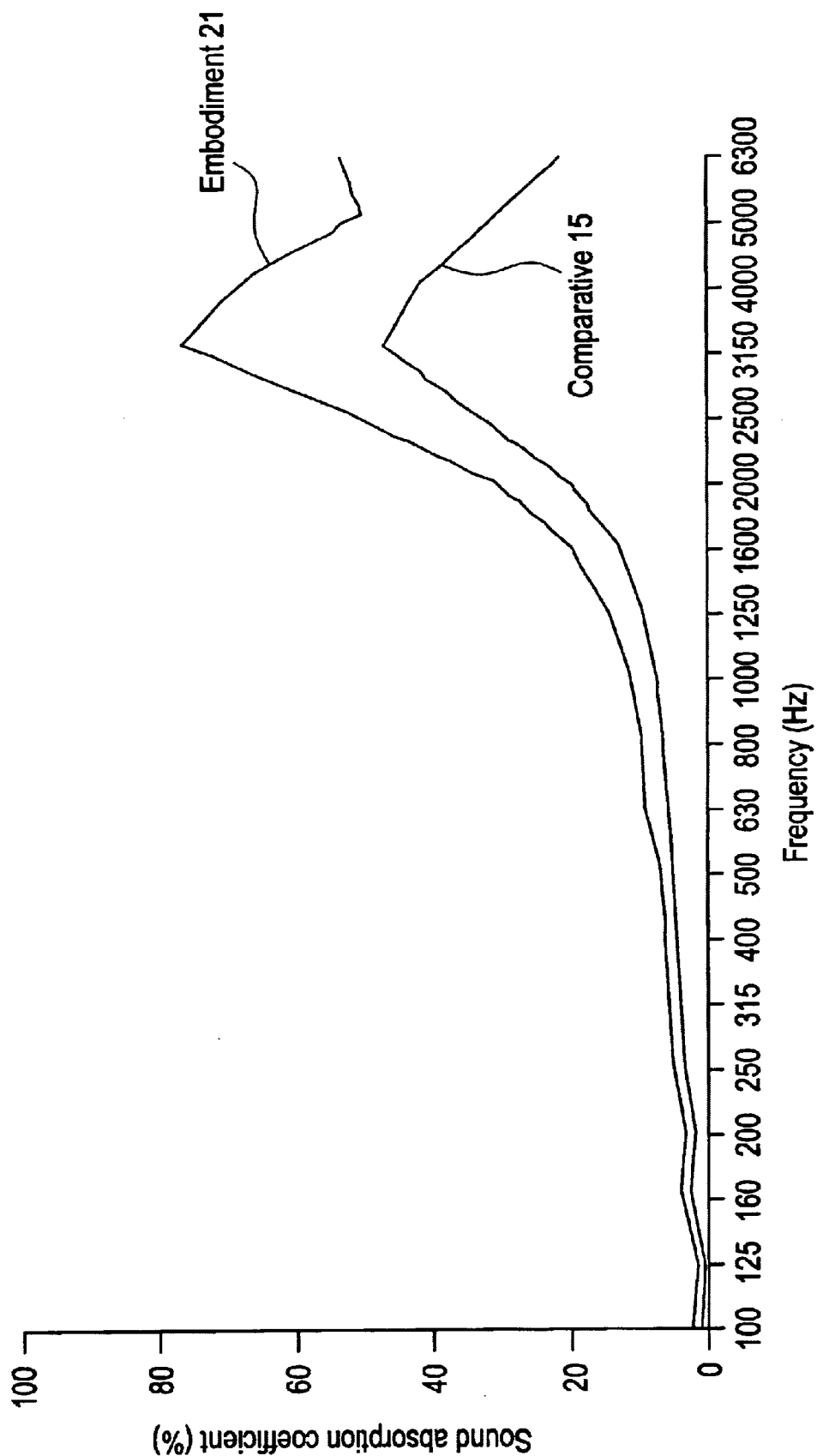
FIG. 31 is a graph showing respective sound absorption performances of the test pieces of Embodiment 21 and Comparison 15 in relation to the frequency.

These test pieces were measured for sound absorption coefficient. The results are shown in FIG. 31. The sound absorption coefficient was measured using the vertical-incident-sound absorption coefficient measuring apparatus manufactured by B & K Inc. (JIS No. A1405). Each test piece had a thickness of 20 mm and ø29 mm or ø100 mm.

FIG. 31 shows that the sound absorption coefficient of the test piece according to Embodiment 21 consisting of sound absorptive fibers which comprise chlorinated polyethylene and DCHBSA as a moment activator is 2 to 35% higher than that of the test piece of Comparison 15 consisting of sound absorptive fibers which comprise chlorinated polyethylene without DCHBSA. There is a large difference between 2,000 Hz and 6,300 Hz. This clearly shows that the mixture of DCHBSA significantly improves the sound absorption capability.

Figure 32:
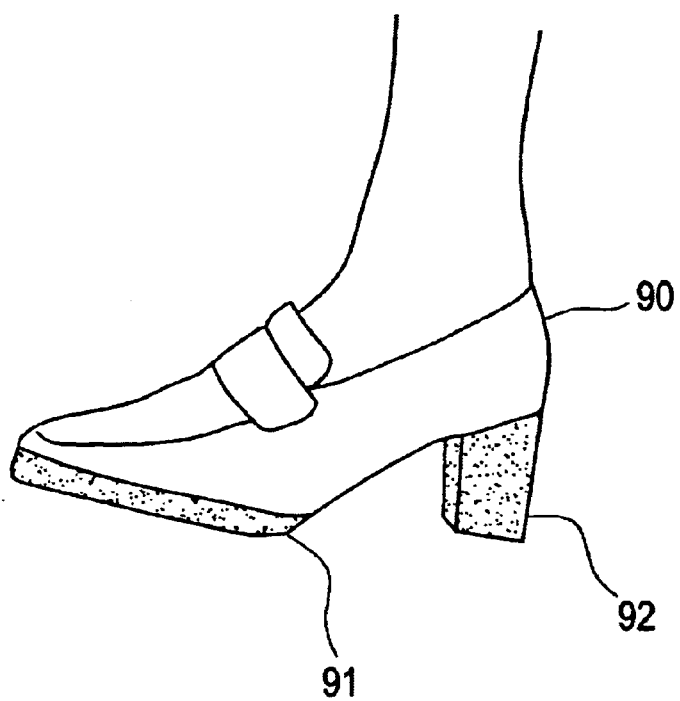
FIG. 32 is a schematic drawing showing a shoe incorporating an impact absorptive material according to the present invention.

Next, embodiments of the impact absorptive material of the present invention are explained. FIG. 32 shows a shoe 90 where a bottom surface 91 and a kneel portion 92 are formed by means of adding 100 parts by weight of DCHBSA to a vinyl chloride resin. The shoe 90 whose bottom surface 91 and kneel portion 92 are composed of the impact absorptive material of the invention provides excellent impact absorption and can reduce fatigue of the wearer from a long walk.

Figure 33:
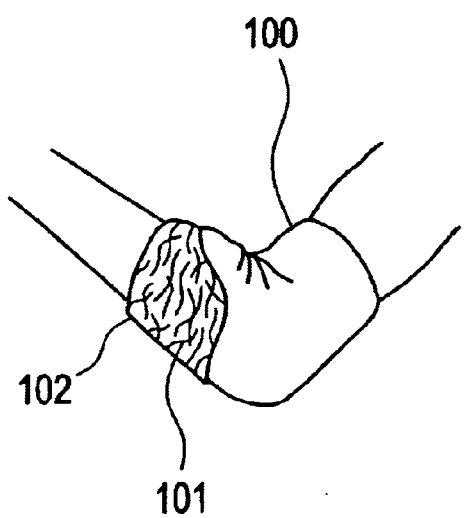
FIG. 33 is a schematic drawing showing an impact absorptive plaster cast incorporating a non-woven cloth comprising impact absorptive fibers of the present invention.

FIG. 33 shows a plaster cast 100 comprising a non-woven cloth layer 102 consisting of fibers 101 formed by spinning a vinyl chloride resin where 100 parts by weight of DCHBSA was added. When a force is applied onto the plaster cast 100, the energy is absorbed by impact absorptive fibers 101 which provide the non woven cloth layer 102, thereby reliably protecting the wearer's body portion from the impact.

Figure 34:
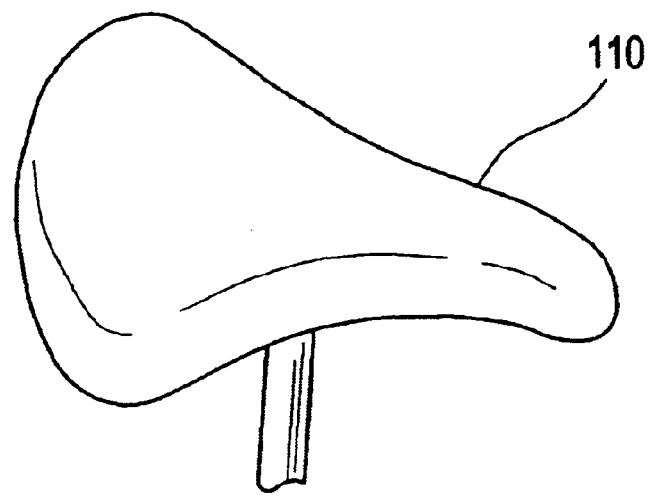
FIG. 34 is a schematic drawing showing a top cover of a bicycle saddle comprising an impact absorptive material of the present invention.
Figure 35:
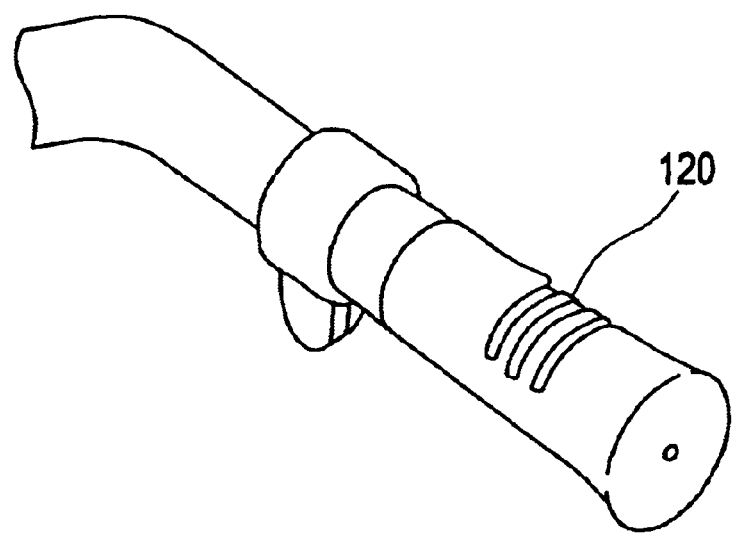
FIG. 35 is a schematic drawing showing an impact absorptive bicycle handle grip comprising an impact absorptive material of the present invention.

FIGS. 34 and 35 respectively show a top cover of a saddle 110 and a handle grip 120 of a bicycle. The base material which can magnificently damp shocks was provided by means of adding 100 parts by weight of DCHBSA to a vinyl chloride resin and molding the mixture.

Next, embodiments of another impact absorptive material of the invention are explained. One hundred parts by weight of DCHBSA was mixed in 100 parts by weight of chlorinated polyethylene and the mixture was molded into cylinders with a diameter of 29.0 mm and thickness of 2, 3, 5, 6, and 12.7 mm (Embodiment 22).

Urethane was used instead of chlorinated polyethylene, and as for Embodiment 1 six cylinders with different diameters without DCHBSA were prepared as Comparison 16. NBR was used instead of chlorinated polyethylene, and as for Embodiment 22 six cylinders with different diameters without DCHBSA were prepared as Comparison 17. BR was used instead of chlorinated polyethylene and as for Embodiment 22 six cylinders with different diameters without DCHBSA were prepared as Comparison 18. Acrylic resin was used instead of chlorinated polyethylene, and as for Embodiment 22 six cylinders with different diameters without DCHBSA were prepared as Comparison 19. Sorbosein was used instead of chlorinated polyethylene, and as for Embodiment 22 six cylinders with different diameters without DCHBSA were prepared as Comparison 20. Each of these samples was measured for impact resilience in accordance with the impact resilience test specified in JIS K6301-1975. The results are shown in FIG. 36.

The test apparatus shown in FIGS. 37 to 40 was used to measure the impact resilience. An iron bar was horizontally suspended with 4 hanging threads, and its impact end was shaped semi-spherical with a diameter of 12.7 mm, the other end providing a pointer. The iron bar had a length of about 356 mm, diameter of 12.7 mm, and weight of 350 g. The suspension height of the iron bar was 2,000 mm and the drop height was 100 mm.

The measurement scale of the testing apparatus had a horizontal length of 625 mm and the radius of 2,000 mm. The pointer was adjusted so that when the iron bar was suspended it was placed at zero with its impact end contacting the surface of the test piece.

Figure 36:
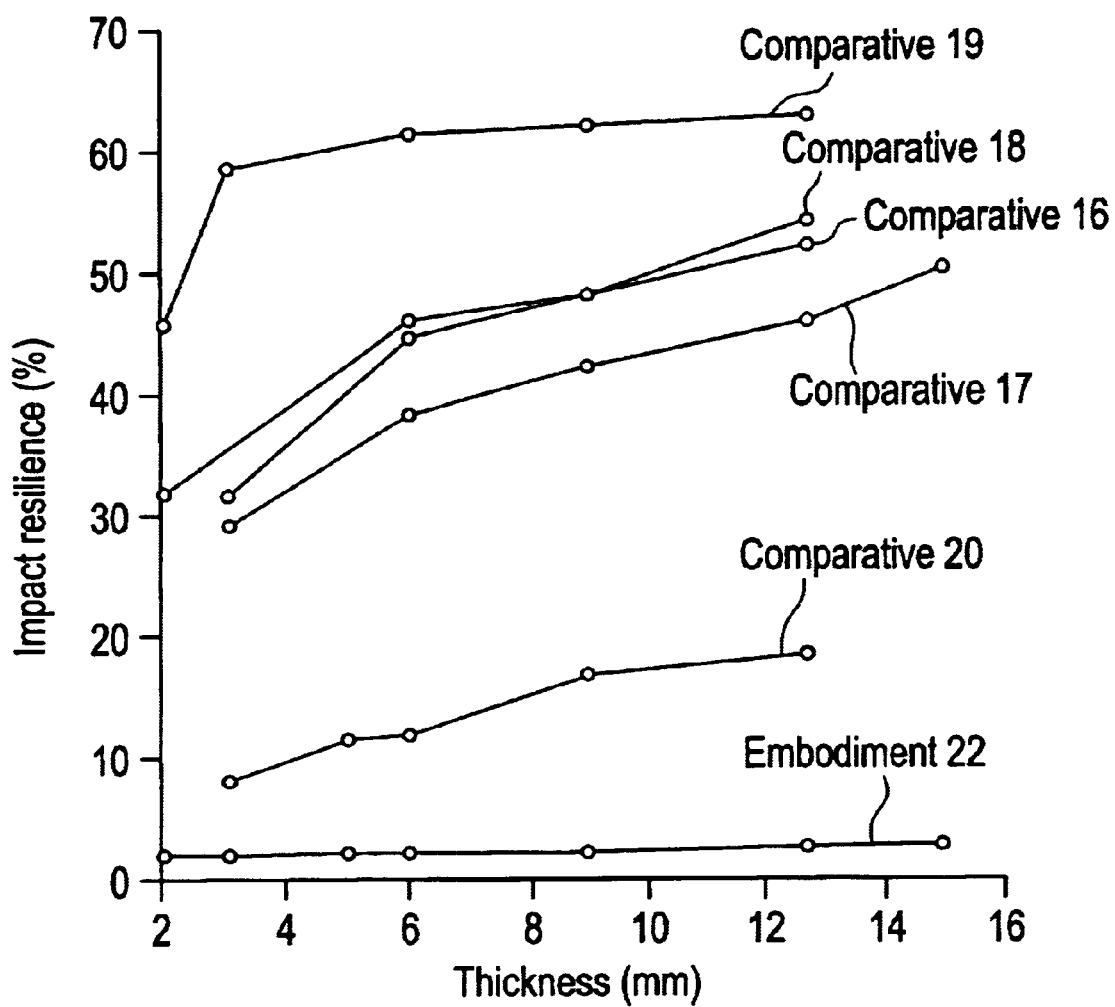
FIG. 36 is a graph showing respective relationships between the thickness and impact resilience of the samples of Embodiment 22 and Comparisons 16 to 20.
Figure 37:
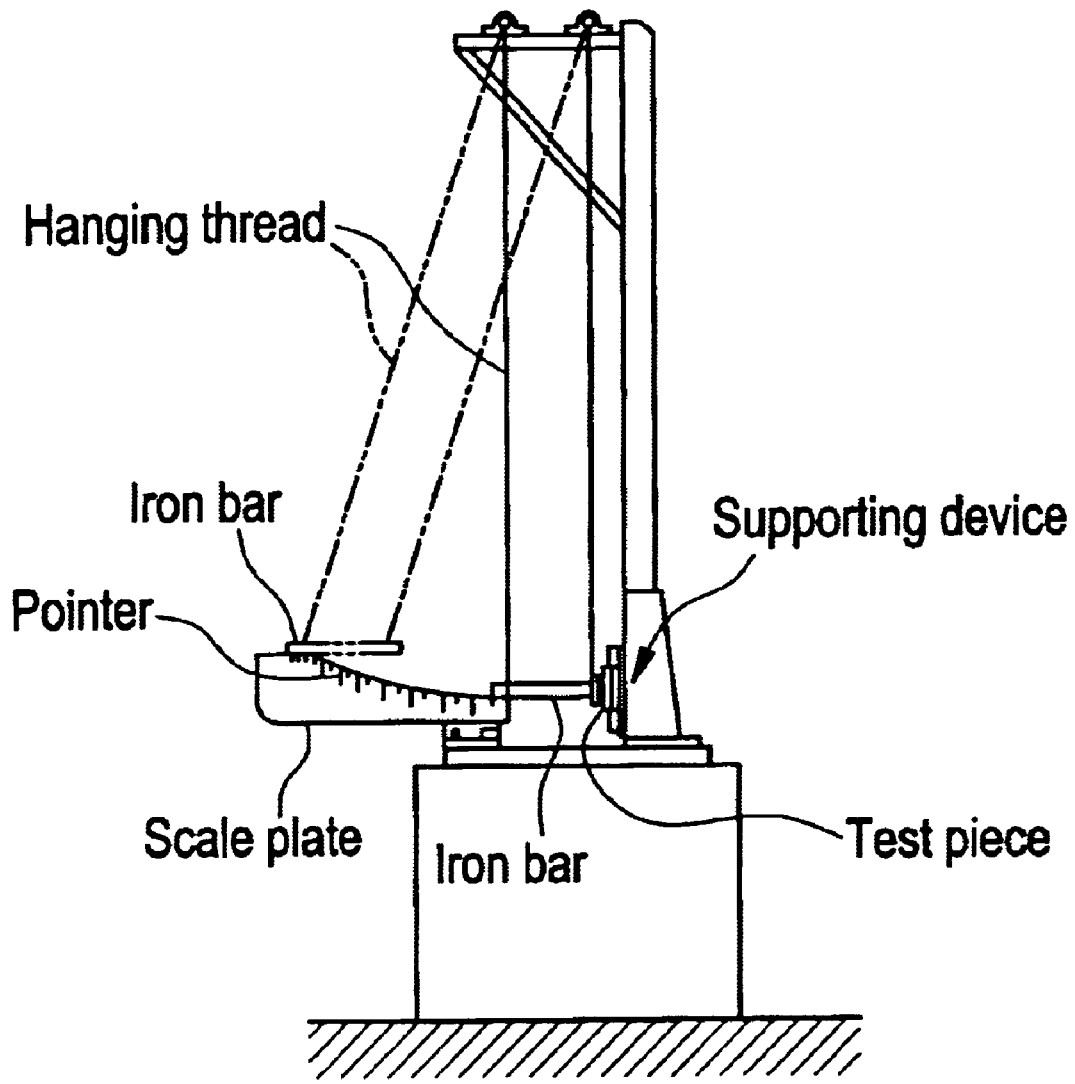
FIG. 37 is a front view showing an impact resilience measuring apparatus.
Figure 38:
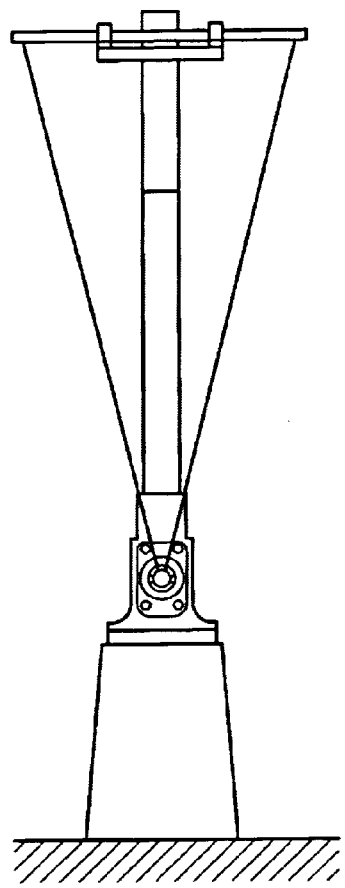
FIG. 38 is a side view showing the impact resilience measuring apparatus.
Figure 39:
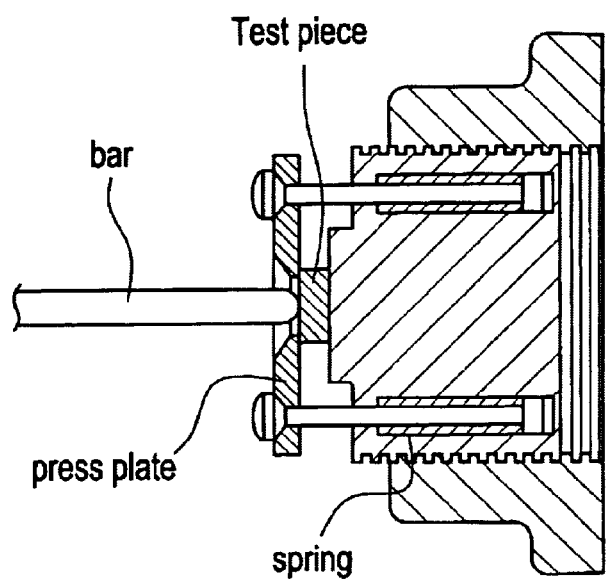
FIG. 39 is an enlarged view showing a portion of the impact resilience measuring apparatus.
Figure 40:
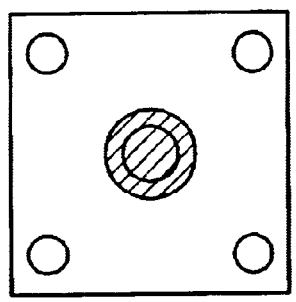
FIG. 40 is a side view showing the enlarged portion of the impact resilience measuring apparatus.

As shown in FIG. 36, the impact resilience of the impact absorptive material according to Embodiment 22 was as low as about 2%, whereas the impact resilience of the impact absorptive material according to Comparison 20 was about 8 to 18%. The impact resilience of the impact absorptive materials according to Comparisons 16 to 19 was as high as about 30 to 55%, indicating that these materials did not provide sufficient impact absorption. Since the results of the tests show that the impact absorptive material of Embodiment 22 can provide excellent impact absorption regardless of its thickness, the material can be practically used in varied applications.

Next, 6 samples were prepared similarly with Embodiment 22 except that 70 parts by weight for Embodiment 23, 50 parts by weight for Embodiment 24, 30 parts by weight for Embodiment 25, and 0 part by weight for Comparison 21 of DCHBSA were blended within the samples. Each sample was measured for impact resilience as for Embodiment 1.

Figure 41:
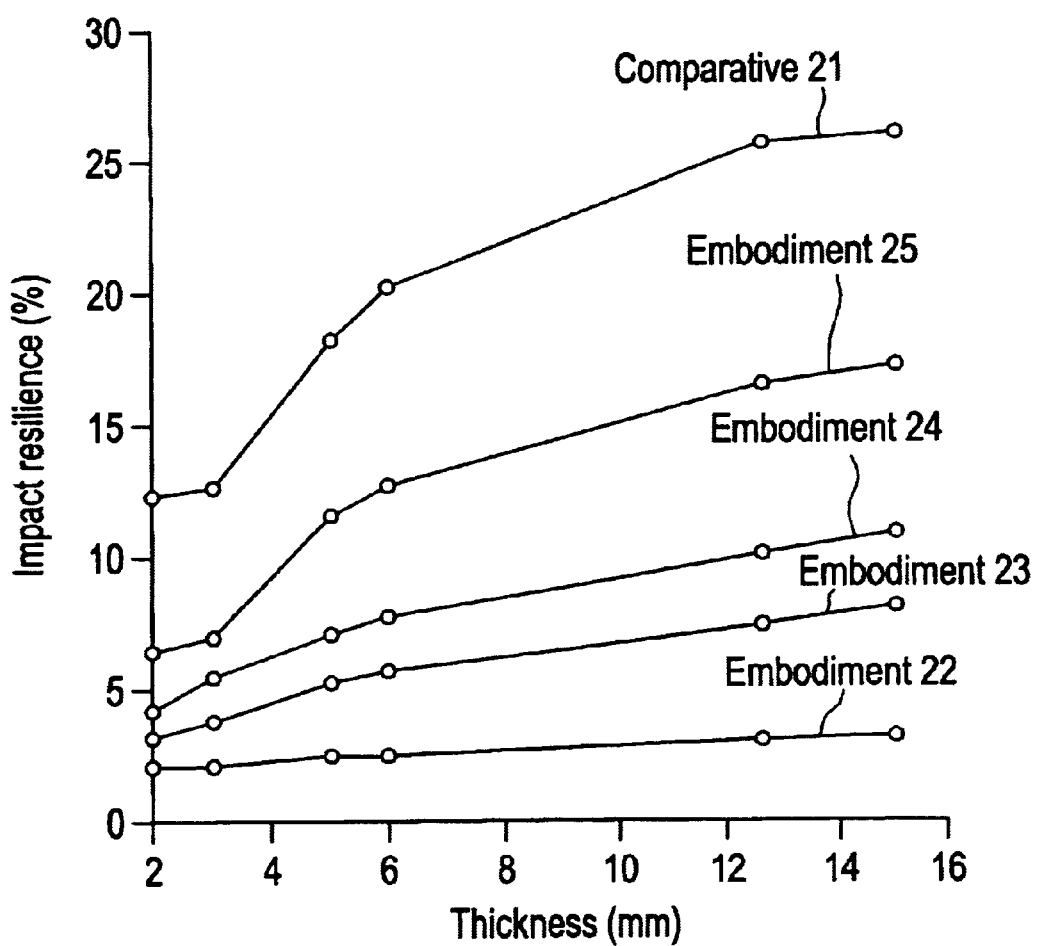
FIG. 41 is a graph showing respective relationships between the thickness and impact resilience of the samples of Embodiments 22 to 25 and Comparison 21.

The results are shown in FIG. 41 together with the results of the measurement of the sample of Embodiment 22.

As shown in FIG. 41, the impact absorptive material according to Comparison 21 containing no DCHBSA had an impact resilience of about 13 to 26%, whereas the impact absorptive material according to Embodiment 25 had an impact resilience of about 6 to 17%. The impact absorptive material according to Embodiment 24 had an impact resilience of about 4 to 11%, the impact absorptive material according to Embodiment 23 had an impact resilience of about 3 to 8%, and the impact absorptive material of Embodiment 22 had an impact resilience of about 2 to 3%, indicating that the impact damping capability improves as the amount of DCHBSA therein increases. The capability improves from Embodiments 25 to 22 in that order as the amount of DCHBSA increases in the same order, which is independent of the thickness of the materials.

Figure 42:
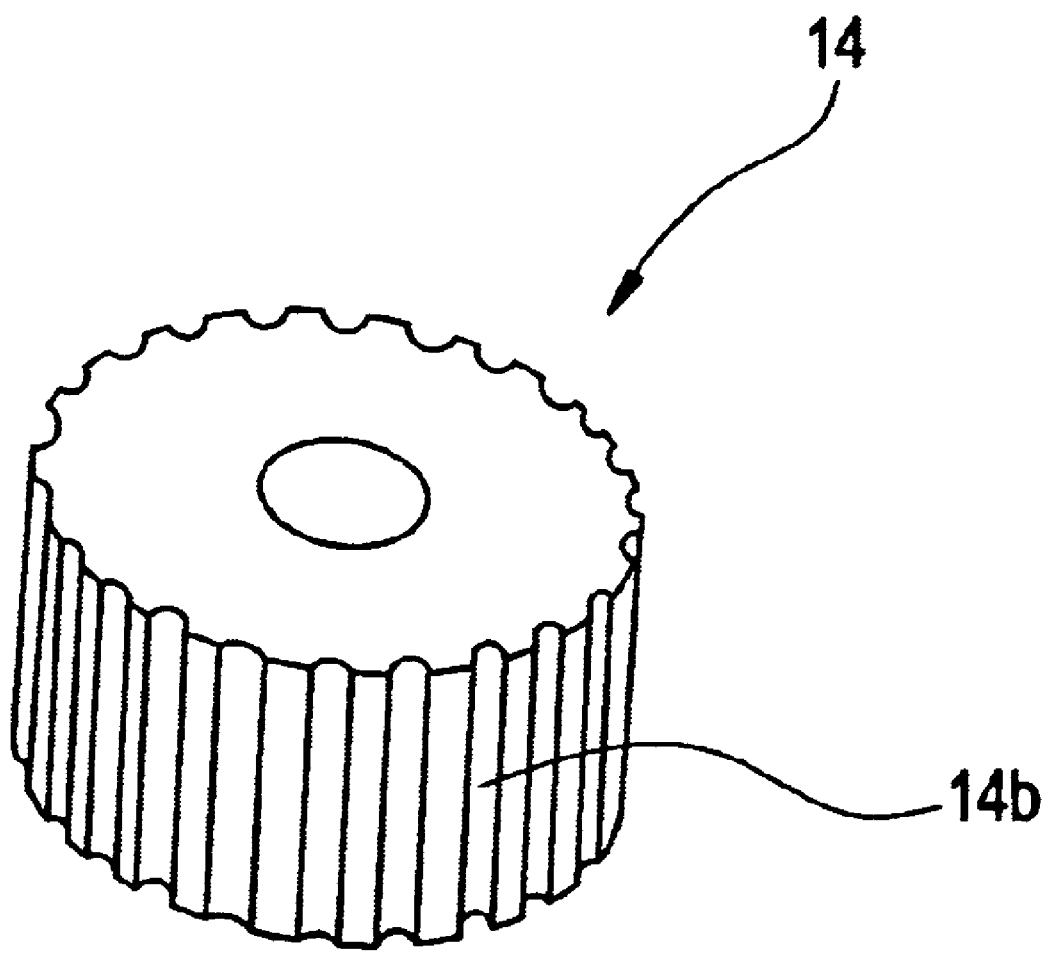
FIG. 42 is an enlarged perspective view showing an impact absorber according to the present invention.

Next, embodiments of the impact absorptive material according to this invention as applied onto front forks are explained. 50% by weight of DCHBSA was mixed in 50% by weight of chlorinated polyurethane (the temperature of the sample was 22 C.) and the mixture was molded into a cylinder having a diameter of 28 mm and a height of 30 mm. The cylinder had grooves 14b in its circumference as shown in FIG. 42. This cylinder was used as an impact absorber (Embodiment 26).

An impact absorber (Comparison 22) was formed by means of molding as for Embodiment 26 except that an MCU elastomer (manufactured by TANGE CORPORATION) was used.

An impact absorber (Comparison 23) was formed by means of molding as for Embodiment 26 except that 100% by weight of chlorinated polyethylene was used.

An impact absorber (Comparison 24) was formed by means of molding as for Embodiment 26 except that 100% by weight of NBR (hardness: 70) was used.

The impact absorbers according to Embodiment 26 and Comparison 22 to 24 were measured for dielectric tangent (tan δ), dielectric loss factor (∈"), and dielectric constant (∈'). The results are shown in Table 8.

TABLE 8

| Impact Absorber | Dielectric Tangent δ | Dielectric Constant (ε') | Dielectric Loss Factor (ε") |
|---|---|---|---|
| Embodiment 26 | 23.5 | 9.0 | 211.7 |
| Comparison 22 | 1.8 | 0.9 | 1.62 |
| Comparison 23 | 17.1 | 3.4 | 58.14 |
| Comparison 24 | 8.6 | 1.3 | 11.18 |

Figure 43:
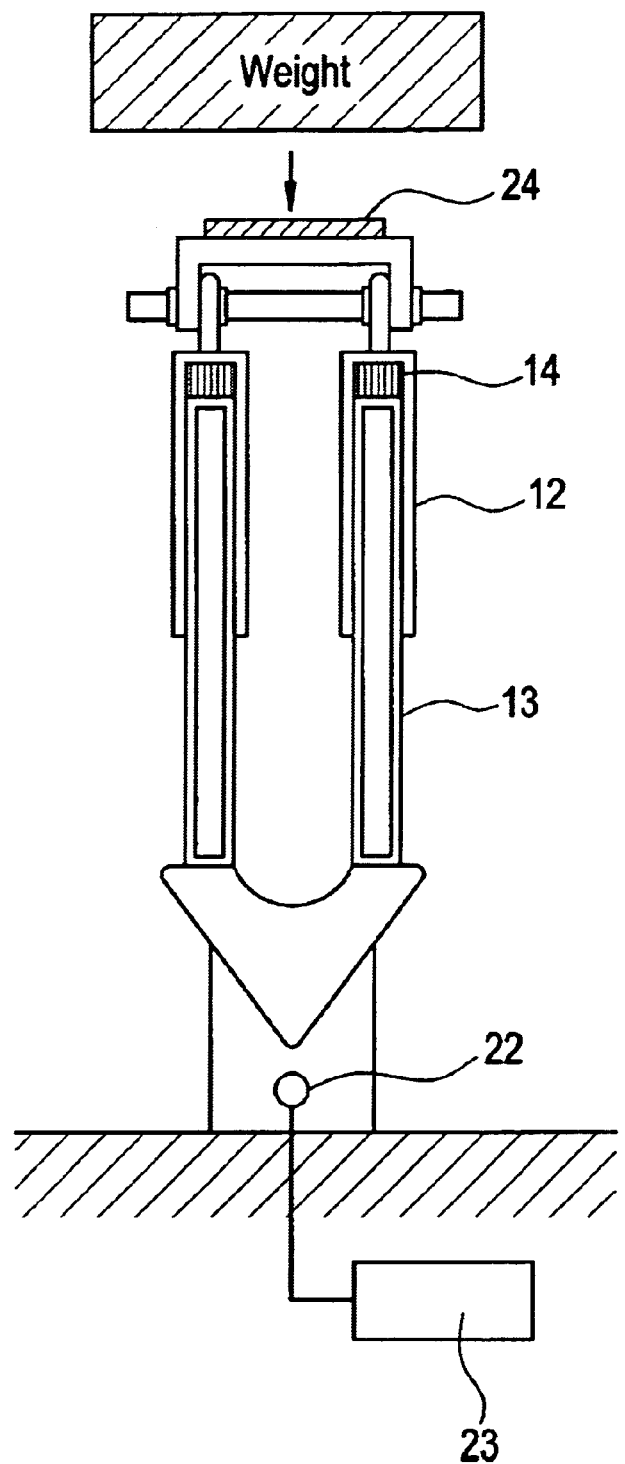
FIG. 43 is a schematic drawing showing an apparatus for measuring the vibration acceleration level of the impact absorbers according to Embodiment 26 and Comparisons 22 to 24.
Figure 44:
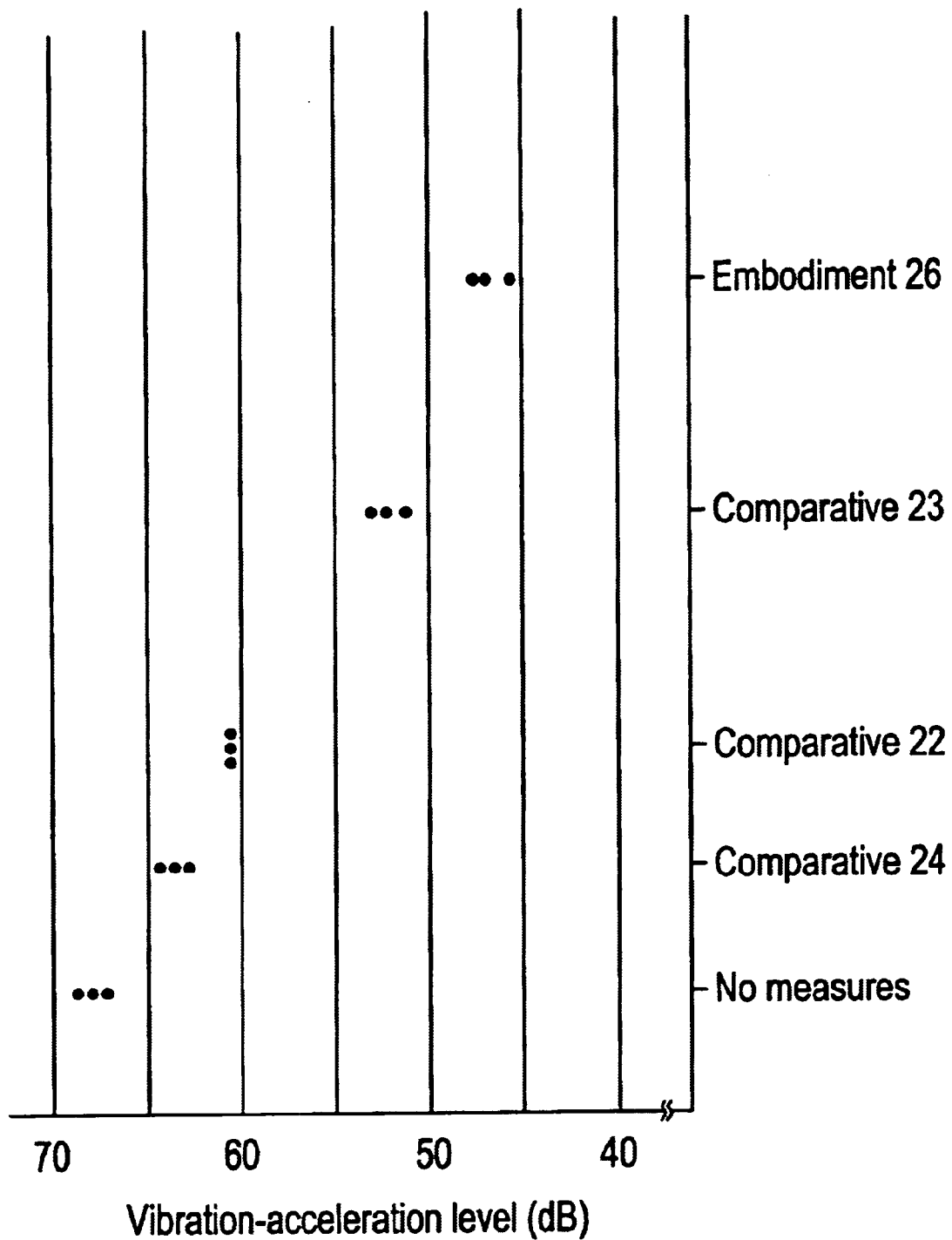
FIG. 44 is a graph showing respective vibration acceleration levels of the impact absorbers according to Embodiment 26 and Comparisons 22 to 24.

The impact absorbers were also subjected to an impact absorption test. As shown in FIG. 43, the test was conducted by installing the impact absorbers 14 between the bottom of the outer tube 12 and the lower end of the inner tube 13, and dropping a 12-kg weight onto a plate 24 on the outer tube 12 from a height of 50 mm. A vibration pickup 22 (NP-601) attached to the inner tube 13 was used to measure the impact. An FFT analyzer 23 (Ono Instrument Inc.) was used to amplify the signal obtained. The results are shown in FIG. 44. For comparison, a front fork having no built-in impact absorber was also tested for impact absorption. The test was conducted under ambient vibration of 44.80 dB and temperature of 17 C. The results of 50 tests were averaged.

As is apparent from FIG. 44, the vibration acceleration level of the front fork having no impact absorber was 65 to 70 dB, whereas the front fork including the impact absorber according to Comparison 22 had a vibration acceleration level of 60 dB, that is, 5 to 10 dB lower than that of the front fork without impact absorber. The front fork having the built-in impact absorber according to Comparison 24 which comprises NBR as its base material exhibited a vibration acceleration level of 63 to 65 dB, and the front fork having the built-in impact absorber according to Comparison 23 which comprises chlorinated polyethylene as its base material exhibited a vibration acceleration level of 50 to 55 dB, indicating that the impact was absorbed. Likewise, the front fork having the built-in impact absorber according to Embodiment 26 which comprises chlorinated polyethylene as its base material and DCHBSA had a vibration acceleration level of 45 to 50 dB, that is, 15 to 20 dB lower than the front fork without absorber material and Comparison 22. These results show that the impact absorber according to Embodiment 26 provides excellent impact absorption, which is unexpectedly higher than those of conventional impact absorptive products.

Next, embodiments of the impact absorptive member according to this invention as applied onto a grip tape are explained.

50% by weight of DCHBCA was mixed in 50% by weight of chlorinated polyethylene (the temperature of the sample was 22-C.) and the mixture was molded into a grip tape 1 mm thick, 25 mm wide, and 1,200 mm long (Embodiment 27).

Another grip tape was prepared as Comparison 25 as above except that 100% by weight of chlorinated polyethylene was used.

Conventional Product 1
  A grip tape wound round a tennis racket grip (Wilson Inc., "Lady Ultra")
Conventional Product 2
  "G-296" manufactured by Dyack Inc. (NBR)
Conventional Product 3
  "Wet Super Grip" (Yonex Inc.)
Conventional Product 4
  "EXGRAD" over-grip (Prince Inc.)
Conventional Product 5
  "Multi-Soft Grip Tape" (Mizuno Inc.)

The grip tapes according to Embodiment 27, Comparison 25, and Conventional Products 1 to 5 were measured for dielectric tangent (tan δ), dielectric loss factor (∈"), and dielectric constant (∈'). The results are shown in Table 9.

TABLE 9

| Grip Tape | Dielectric Tangent δ | Dielectric Constant (ε') | Dielectric Loss Factor (ε") |
|---|---|---|---|
| Embodiment 27 | 9.00 | 23.50 | 211.70 |
| Comparison 25 | 3.40 | 17.10 | 58.14 |
| Convention 1 | 1.30 | 8.60 | 11.18 |
| Convention 2 | 1.60 | 8.90 | 14.24 |
| Convention 3 | 1.80 | 9.20 | 16.56 |
| Convention 4 | 2.00 | 9.10 | 18.20 |
| Convention 5 | 0.90 | 6.50 | 5.85 |

Figure 45:
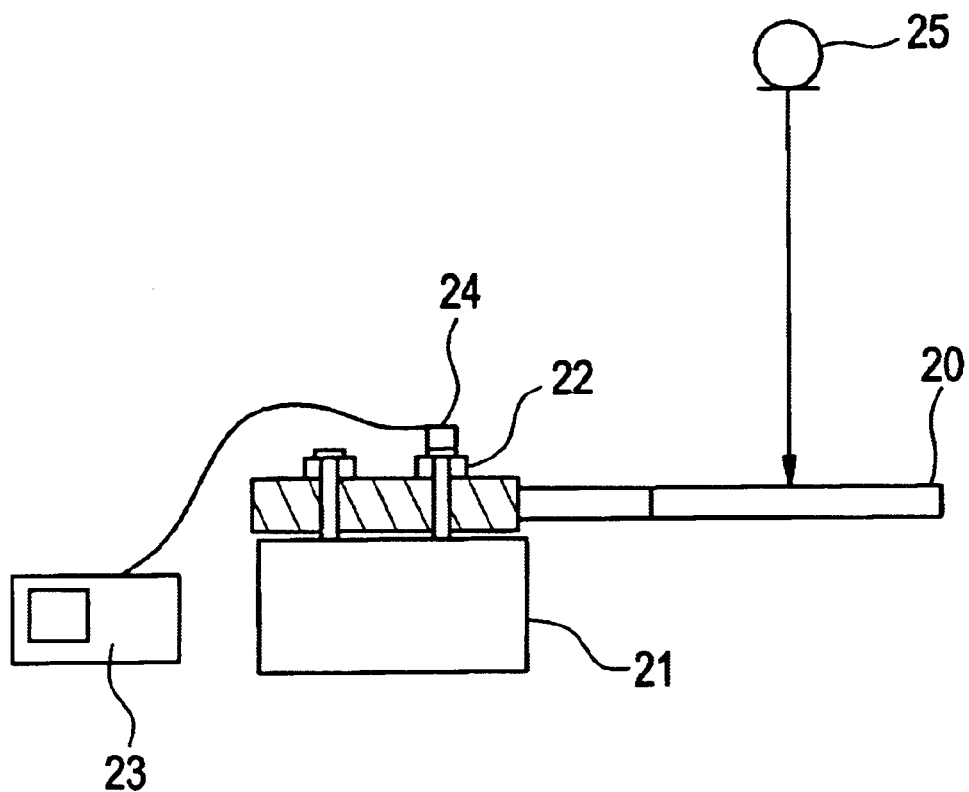
FIG. 45 is a side view schematically showing an apparatus for measuring the vibration acceleration level (dB) of the grip tapes according to Embodiment 27, Comparison 25 and Conventions 1 to 5.
Figure 46:
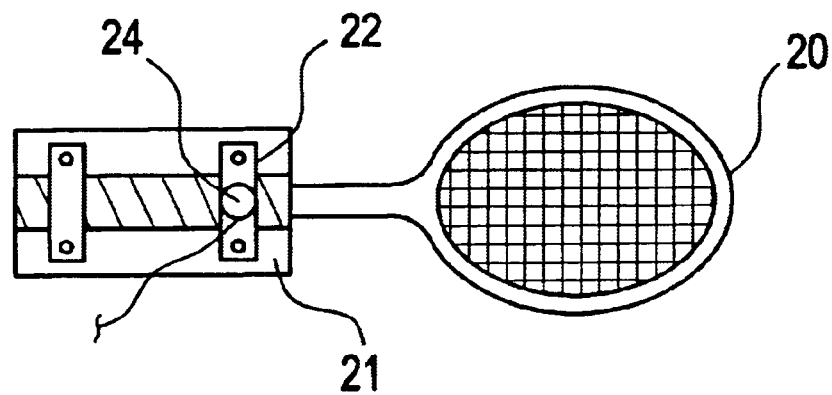
FIG. 46 is a plan view of the apparatus of FIG. 45.

The grip tapes according to Embodiment 27, Comparison 25, and Conventional Products 1 to 5 were subjected to an impact absorption test. As shown in FIGS. 45 and 46, a tennis racket 20 manufactured by Wilson Inc. ("Lady Ultra"), having a grip tape wound round its grip end was placed on a base 21 and fixed by bolt and plate means 22.

A vibration acceleration pickup (NP-601) 24 connected to an FFT analyzer (Ono Instrument Inc.) 23 was mounted on the plate 22.

Figure 47:
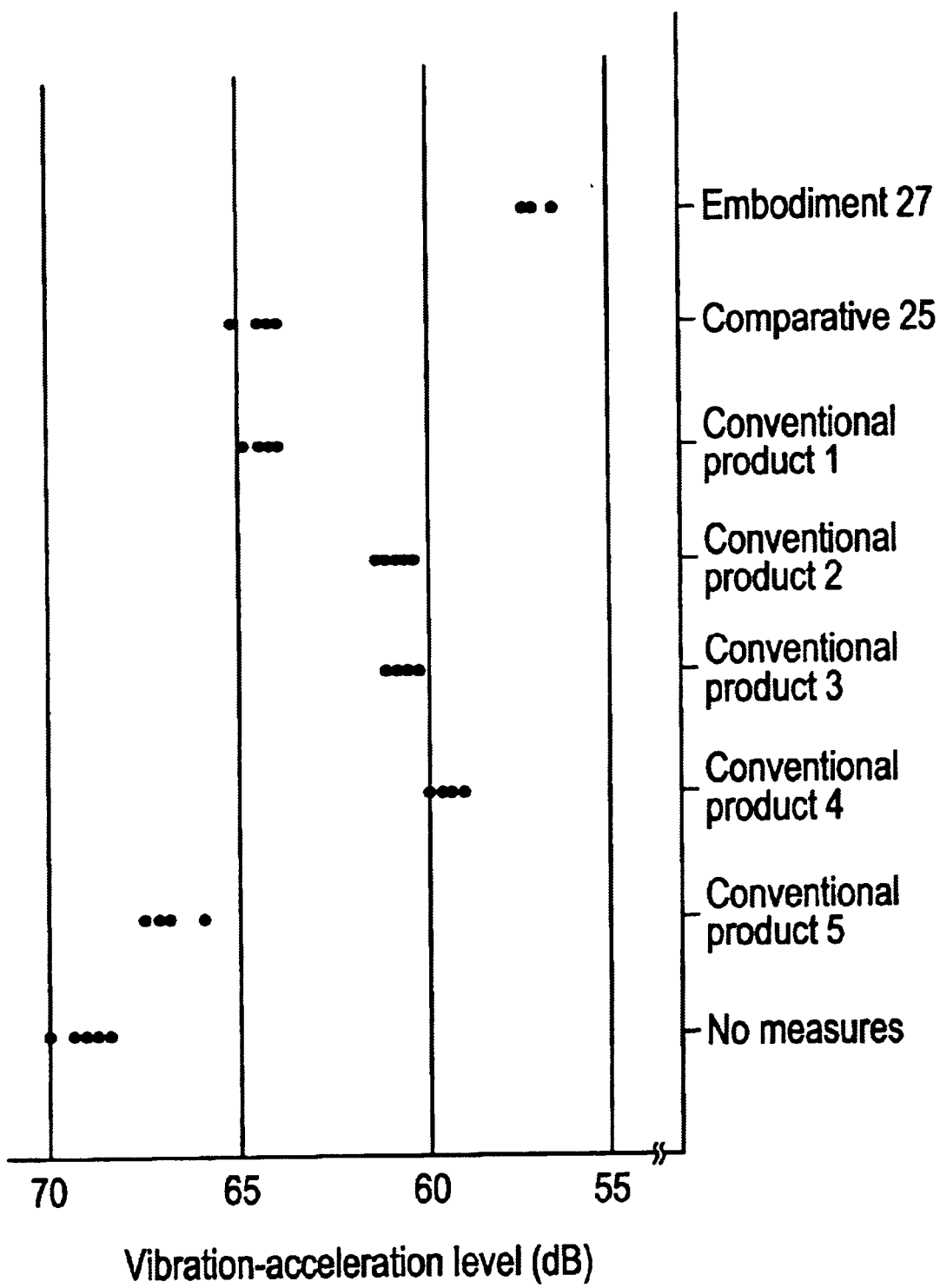
FIG. 47 is a graph showing the respective vibration acceleration levels (dB) of the grip tapes according to Embodiment 27, Comparison 25 and Conventions 1 to 5.

A tennis ball 25 was dropped onto the net of the racket 20 from a height of 1 m, and the vibration acceleration level (dB) was measured using the vibration acceleration pickup 24 to provide measurement of the impact vibration generated on the plate 22. The FF1 analyzer 23 (Ono Instrument Inc.) was used to amplify the signal. The results of the measurement are shown in FIG. 47. During the measurement, the temperature was 20 C. and the ambient vibration was 49.20 dB. The results are shown in FIG. 47 (average of 50 measurements). For comparison, a grip without a grip tape was prepared and also subjected to an impact absorption test.

As is apparent from FIG. 47, the vibration acceleration level of the grip end without a tape was 68 to 70 dB, whereas the vibration acceleration level of the Conventional Product 5 was 66 to 68 dB, only about 2 dB lower than the grip end without a tape. Conventional Products 1 to 4 and Comparison 25 exhibited a vibration acceleration level of 60 to 65 dB, which was considerably lower than that of the grip end without a tape. On the other hand, the grip end according to Embodiment 27 exhibited a vibration acceleration level of 56 to 57 dB, which was 11 to 14 dB lower than that of the grip end without a tape, indicating that Embodiment 27 has an excellent impact absorption capability.

Next, embodiments of the impact absorptive material according to this invention as applied onto a shoe sole are explained.

50% by weight of DCHBSA was mixed in 50% by weight of chlorinated polyethylene (the temperature of the sample was 22 C.) and the mixture was molded into plates 1 mm thick (Embodiment 28), 3 mm thick (Embodiment 29), 5 mm thick (Embodiment 30), and 10 mm thick (Embodiment 31).

Additional plates 1 mm thick (Comparison 26), 3 mm thick (comparison 27), 5 mm thick (Comparison 28), and 10 mm thick (Comparison 29) were also prepared as for the Embodiments except that 100% by weight of chlorinated polyethylene was used.

Conventional product (heel pad, plate 4 mm thick, Impulse Inc.) (Comparison 30).

Conventional product (gel, plate 4 mm thick, Impulse Inc.) (Comparison 31).

Conventional product (air, plate 10 mm thick, Impulse Inc.) (Comparison 32).

Conventional product (sports gel, plate 3 mm thick, Wilson Inc.) (Comparison 33).

Those impact absorbers according to Embodiment 28 and Comparisons 26 and 30 to 33 were measured for dielectric tangent (tan δ), dielectric loss factor ($\epsilon''$), and dielectric constant ($\epsilon'$). The results are shown in Table 10.

TABLE 10

| Impact Absorber | Dielectric Tangent δ | Dielectric Constant ($\epsilon'$) | Dielectric Loss Factor ($\epsilon''$) |
|---|---|---|---|
| Embodiment 28 | 9.0 | 23.50 | 211.70 |
| Comparison 26 | 3.4 | 17.10 | 58.14 |
| Comparison 30 | 0.5 | 1.70 | 0.85 |
| Comparison 31 | 0.6 | 2.20 | 1.32 |
| Comparison 32 | 0.5 | 1.30 | 0.65 |
| Comparison 33 | 1.1 | 1.90 | 2.09 |

Figure 48:
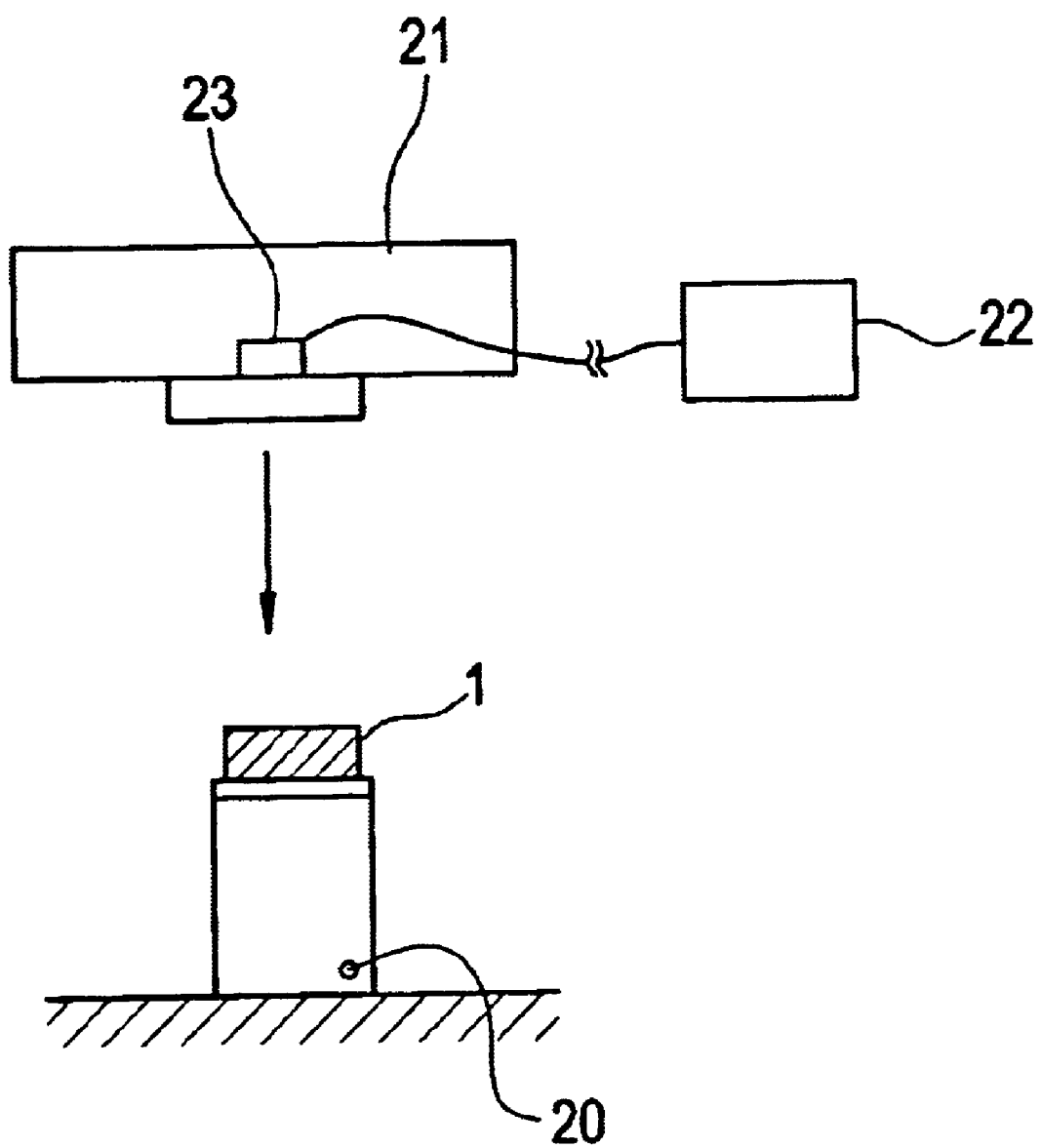
FIG. 48 is a schematic drawing showing an apparatus for measuring the vibration acceleration level of the impact absorbers according to Embodiments 28 to 31 and Comparisons 26 to 33.
Figure 49:
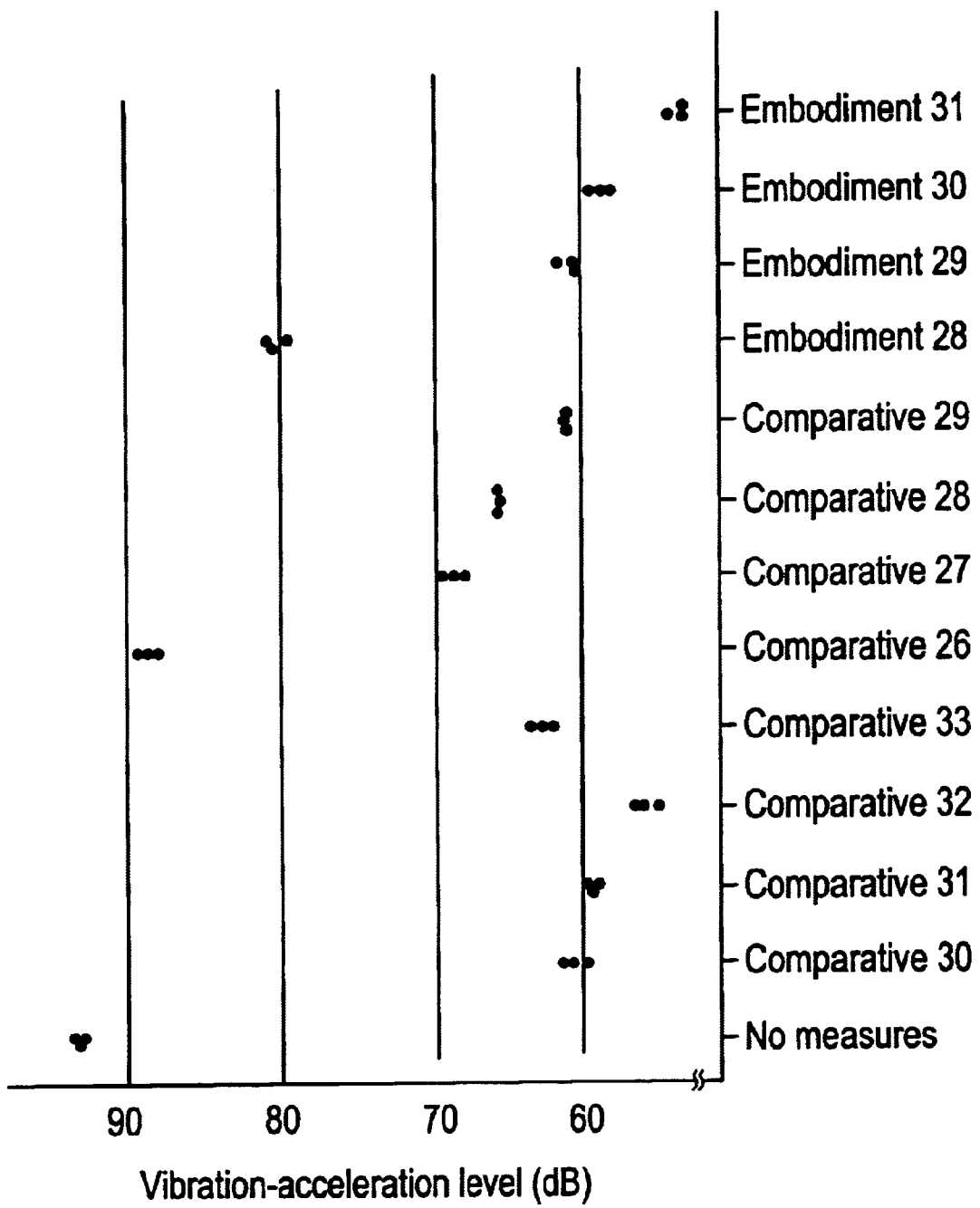
FIG. 49 is a graph showing the respective vibration acceleration levels of the impact absorbers according to Embodiments 28 to 31 and Comparisons 26 to 33 as measured by the apparatus shown in FIG. 48.

The impact absorbers according to Embodiments 28 to 31 and Comparisons 26 to 33 were subjected to an impact absorption test. As shown in FIG. 48, the test was conducted by placing each impact absorber 1 on a base 20, dropping a 12-kg weight 21 onto the base 20 from a height of 250 mm, using a vibration pickup 23 (NP-601) connected to the weight 21 to measure the impact acceleration level (dB), and using an FFT analyzer 22 (Ono Instrument Inc.) to amplify the signal. The results of the test are shown in FIG. 49. During the measurement, the temperature was 20 C. and the ambient vibration was 49.56 dB. The results are shown in FIG. 49 as the average of 50 measurements. For comparison, a shoe sole without any impact absorber was also prepared and subjected to an impact absorption test.

As is apparent from FIG. 49, the vibration acceleration level of the device without an impact absorber was about 73 dB, and the impact absorption capability of the Comparisons was gradually improved as the thickness of the impact absorbers increased. The vibration acceleration level of Comparison 26 comprising chlorinated polyethylene as its base material was 80 dB. The levels were respectively 69, 65 and 61 dB from Comparisons 27 to 29. In addition, Comparisons 30 to 33 all exhibited a vibration level of 55 to 65 dB, whereas the damping capability increased from Embodiment 29 to Embodiment 31 where the thickness increases in this order, with an exception of Embodiment 1 whose thickness is 1 mm. In particular, Embodiment 31 with a thickness of 10 mm exhibited an excellent damping property of 52 to 53 dB.

Figure 50:
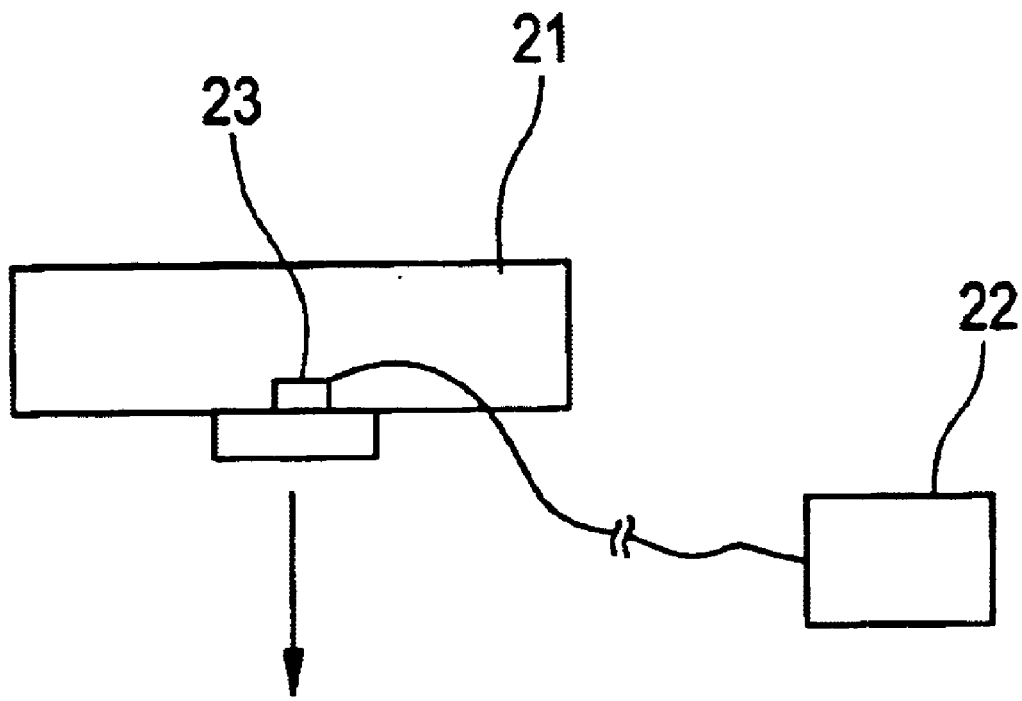
FIG. 50 is a schematic drawing showing an apparatus for measuring the vibration acceleration level of the impact absorbers as applied on a safety shoe (JIS product) according to Embodiments 28 to 31 and Comparisons 26 to 33.
Figure 50:
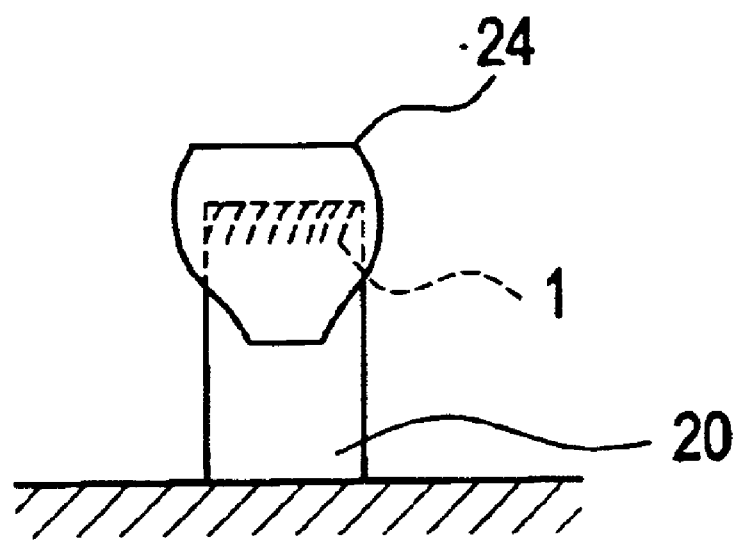
Figure 51:
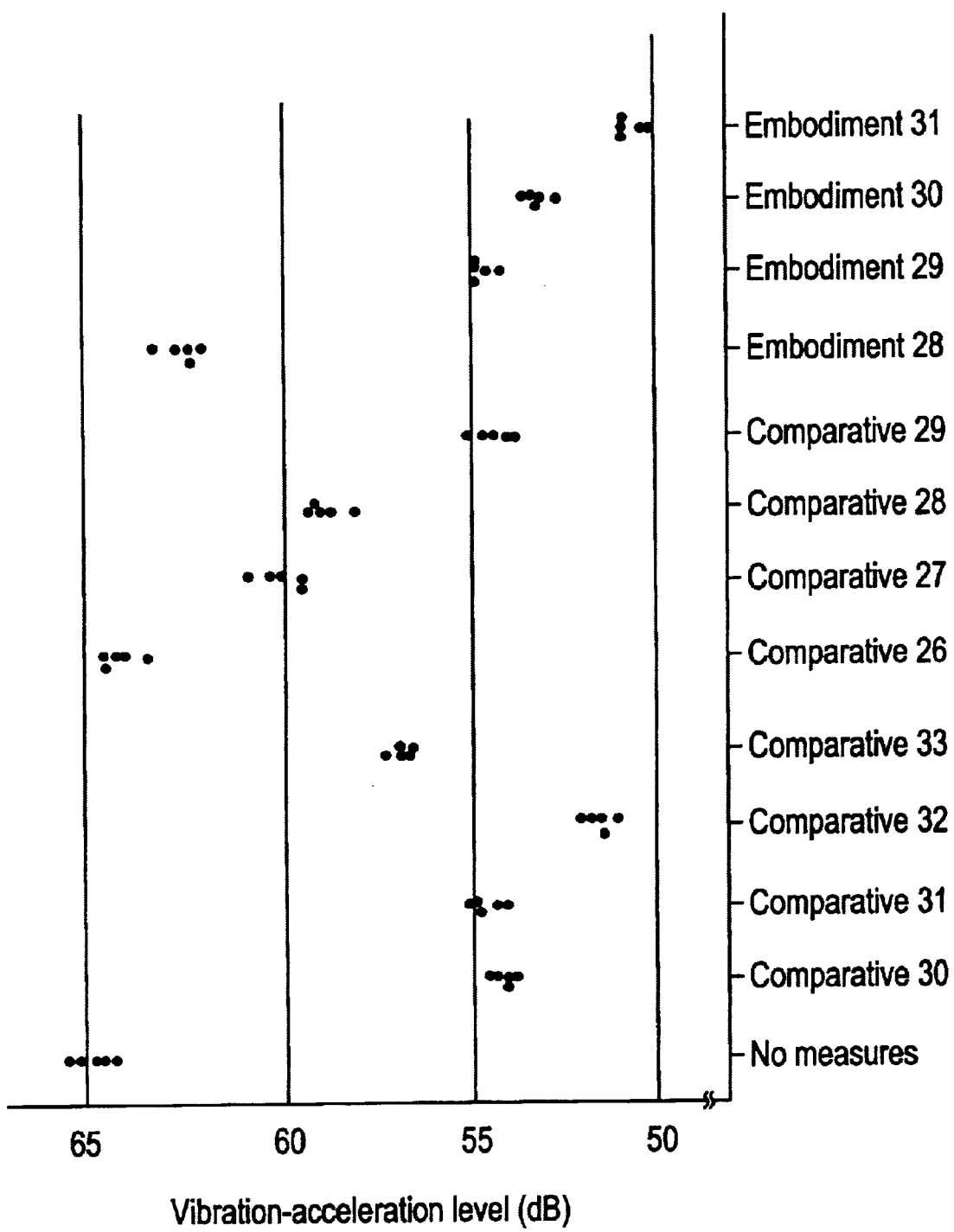
FIG. 51 is a graph showing the respective vibration acceleration levels of the impact levels of the impact absorbers according to Embodiments 28 to 31 and Comparisons 26 to 31 as measured by the apparatus shown in FIG. 50.

As shown in FIG. 50, each of the impact absorbers 1 according to Embodiments 28 to 31 and Comparisons 26 to 33 was placed in a safety shoe 24 (JIS product) and the vibration acceleration level was measured as described above. The results are shown in FIG. 51. For comparison, a safety shoe without impact absorber was prepared and also subjected to an impact absorption test.

As is apparent from FIG. 51, the vibration acceleration level of the device without an impact absorber was about 65 dB, and the impact absorption capability of the Comparisons was gradually improved as the thickness of the impact absorbers increased. The vibration acceleration level of Comparison 26 comprising chlorinated polyethylene as its base material was 64 dB, and Comparisons 27 to 29 (the thickness increasing in this order) exhibited a vibration acceleration level of 60, 59, and 54 dB, respectively.

Comparisons 30 to 32 using conventional products exhibited a vibration level of 55 to 57 dB and Comparison 33 exhibited a level of 52dB, whereas, with an exception of Embodiment 28 with a thickness of 1 mm, the damping capability improved from Embodiment 29 to Embodiment 31 (50 to 55 dB) whose thickness increased in this order.

In particular, Embodiment 31 with a thickness of 10 mm exhibited a very excellent level of 50 to 52 dB.

Next, embodiments of the electromagnetic wave absorptive material according to this invention are explained.

DCHBSA was mixed in chlorinated polyethylene, and the mixture was kneaded and molded between rollers into a sheet 1 mm thick. The sheet was cut into 200 mm×200 mm pieces, which were used as test pieces.

The mixing ratio (parts by weight) of chlorinated polyethylene to DCHBSA was 100 to 0 (Comparison 34), 100 to 30 (Embodiment 32), 100 to 50 (Embodiment 33), 100 to 70 (Embodiment 34), and 100 to 100 (Embodiment 35).

The test pieces according to Embodiments 32 to 35 and Comparison 34 were measured for dielectric tangent (tan δ), dielectric loss factor ($\epsilon''$), and dielectric constant ($\epsilon'$). The results are shown in Table 11.

TABLE 11

| Electromagnetic Absorber | Dielectric Tangent δ | Dielectric Constant ($\epsilon'$) | Dielectric Loss Factor ($\epsilon''$) |
|---|---|---|---|
| Embodiment 32 | 5.2 | 22.1 | 115.0 |
| Embodiment 33 | 5.7 | 29.1 | 164.7 |
| Embodiment 34 | 6.9 | 25.8 | 178.0 |
| Embodiment 35 | 9.0 | 23.5 | 211.7 |
| Comparison 34 | 3.4 | 17.1 | 58.9 |

Figure 52:
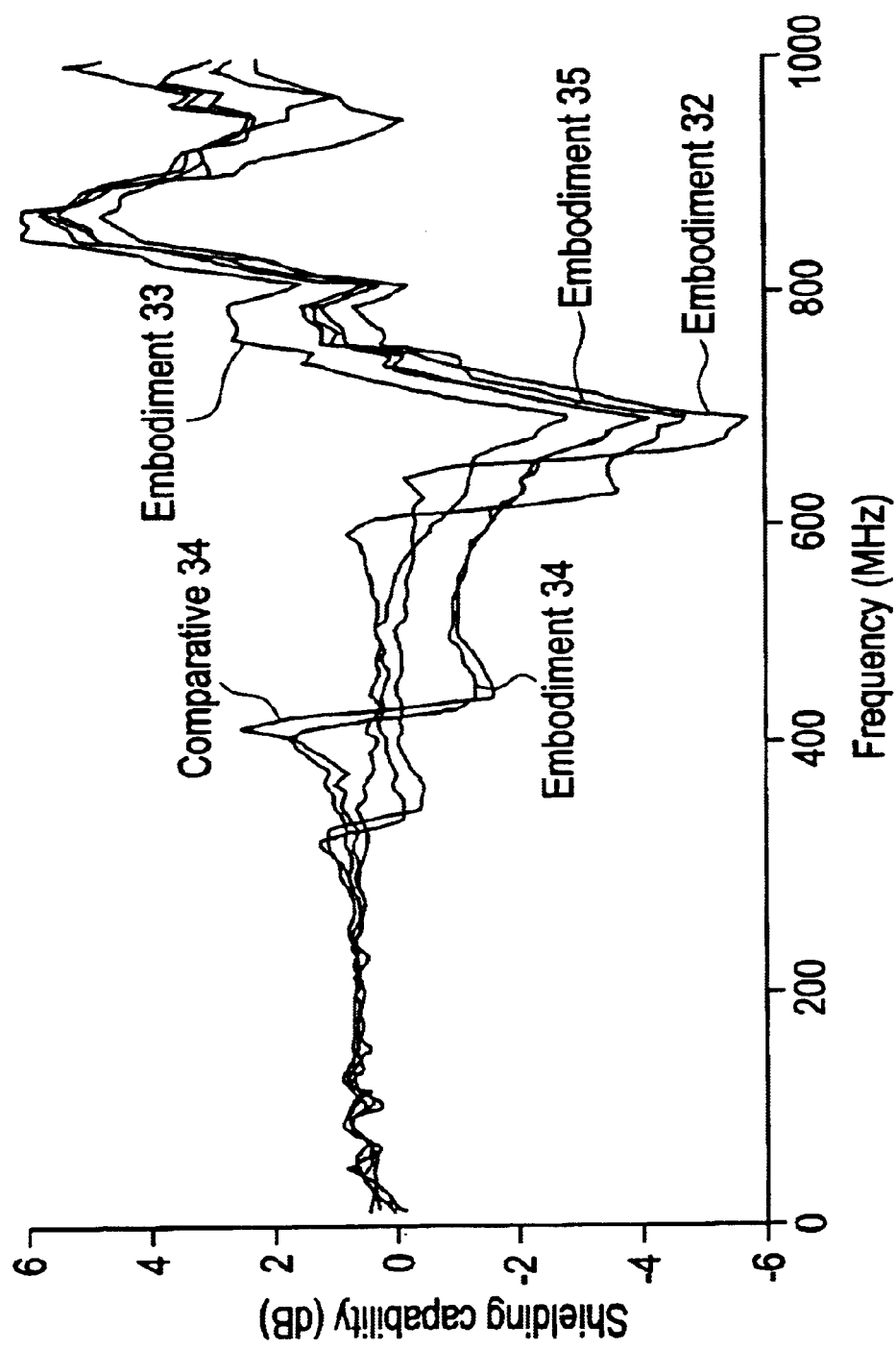
FIG. 52 is a graph showing respective relationships between the frequency and electromagnetic absorptive capabilities of the test pieces according to Embodiments 32 to 35 and Comparison 34.

These test pieces were measured for electromagnetic wave absorption capability (db). The results are shown in FIG. 52. The electromagnetic wave absorption capability electromagnetic shied evaluating apparatus (TR-17301 manufactured by Advantest Inc.). Electric fields of 10 to 1,000 MHz were used in the test.

Embodiments of the electromagnetic wave absorptive paint comprising the electromagnetic wave absorptive material according to this invention are described below. A mixture of chlorinated polyethylene and DCHBSA was dispersed in water to provide an emulsion, which was deposited on a surface of a substrate using an air spray gun.

Figure 12:
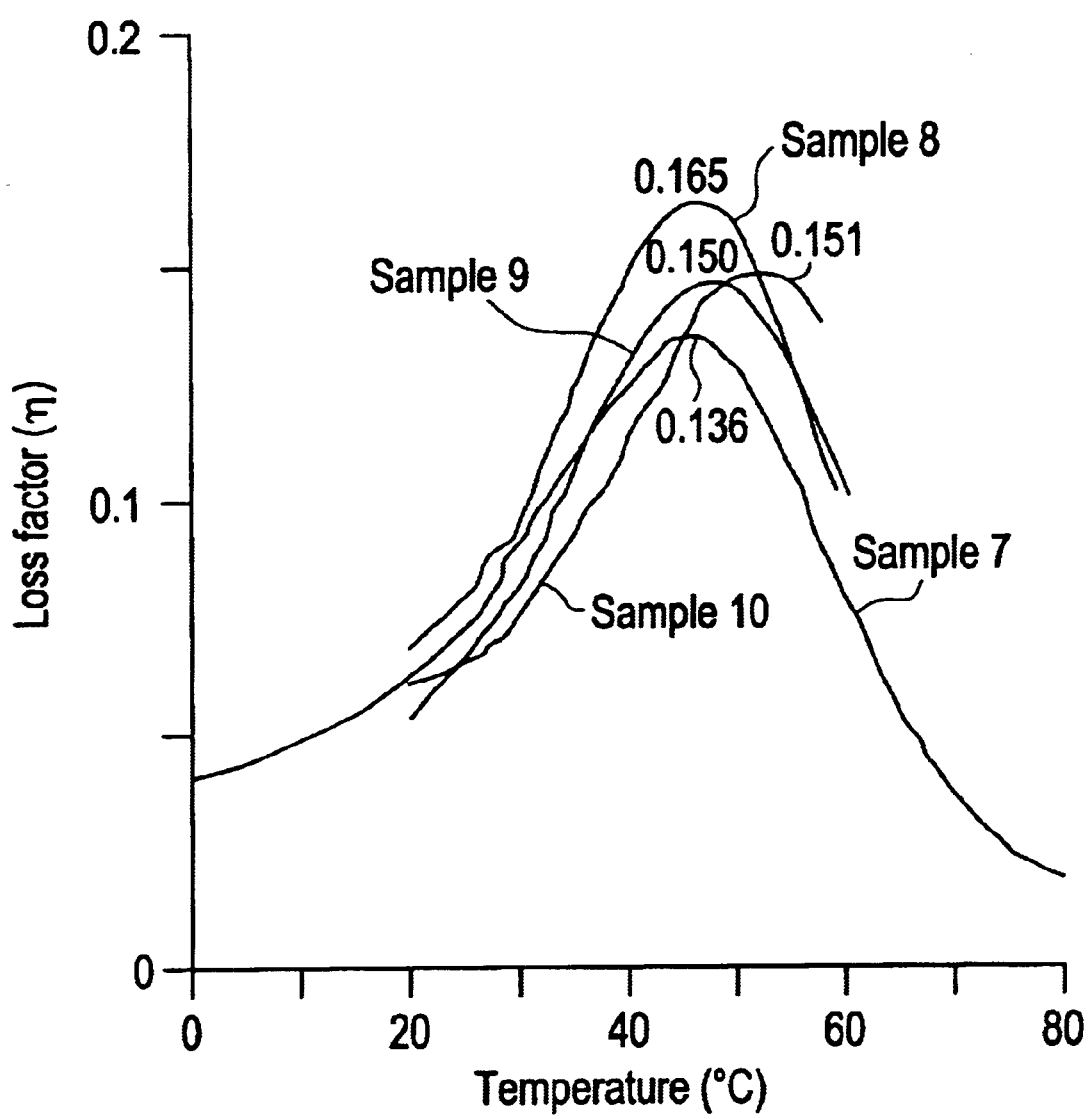
FIG. 12 is a graph showing respective relationships between the temperature and loss factors (η) of Samples 7 to 10.
Figure 13:
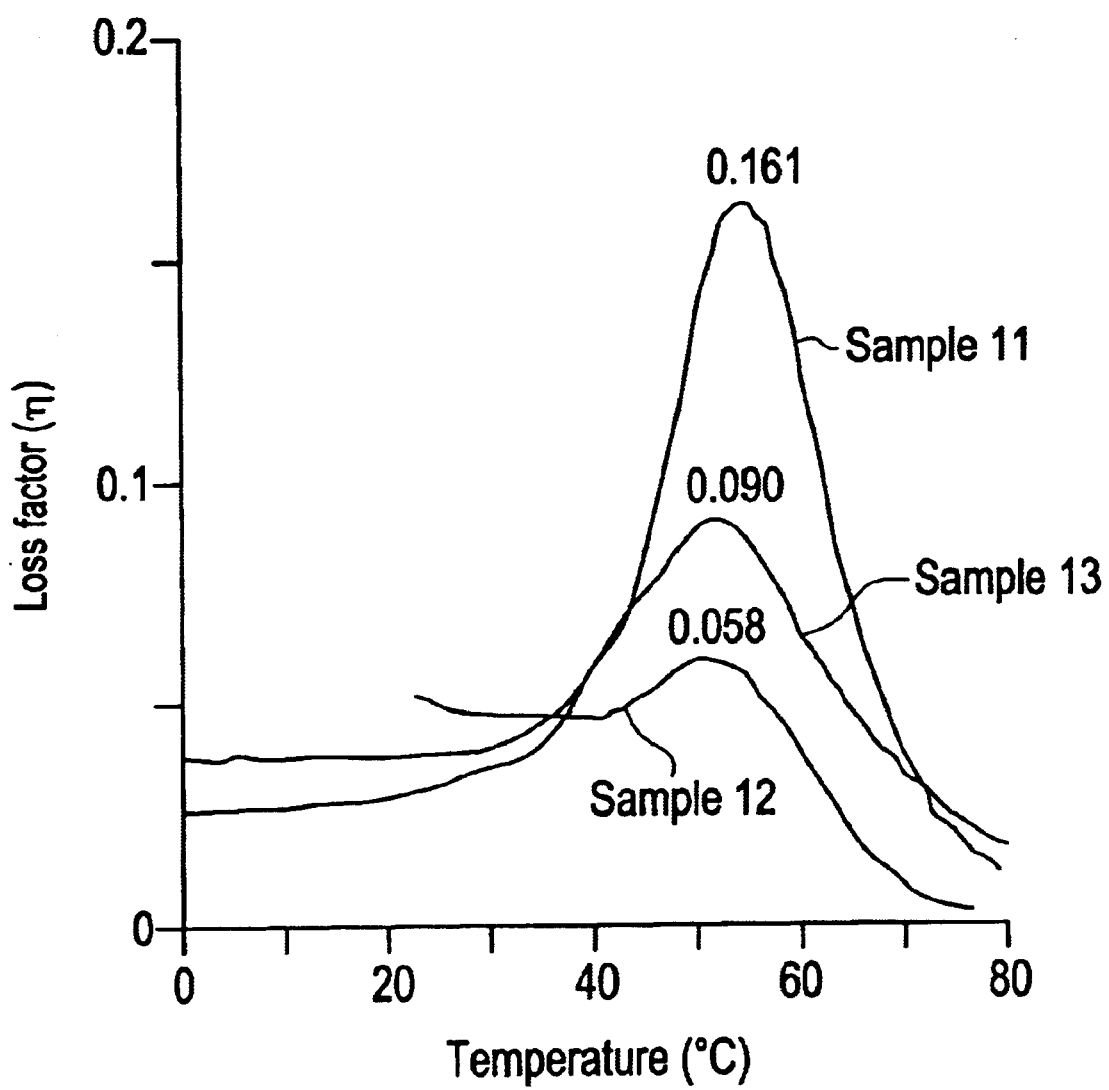
FIG. 13 is a graph showing respective relationships between the temperature and loss factors (η) of Samples 11 to 13.
Figure 14:
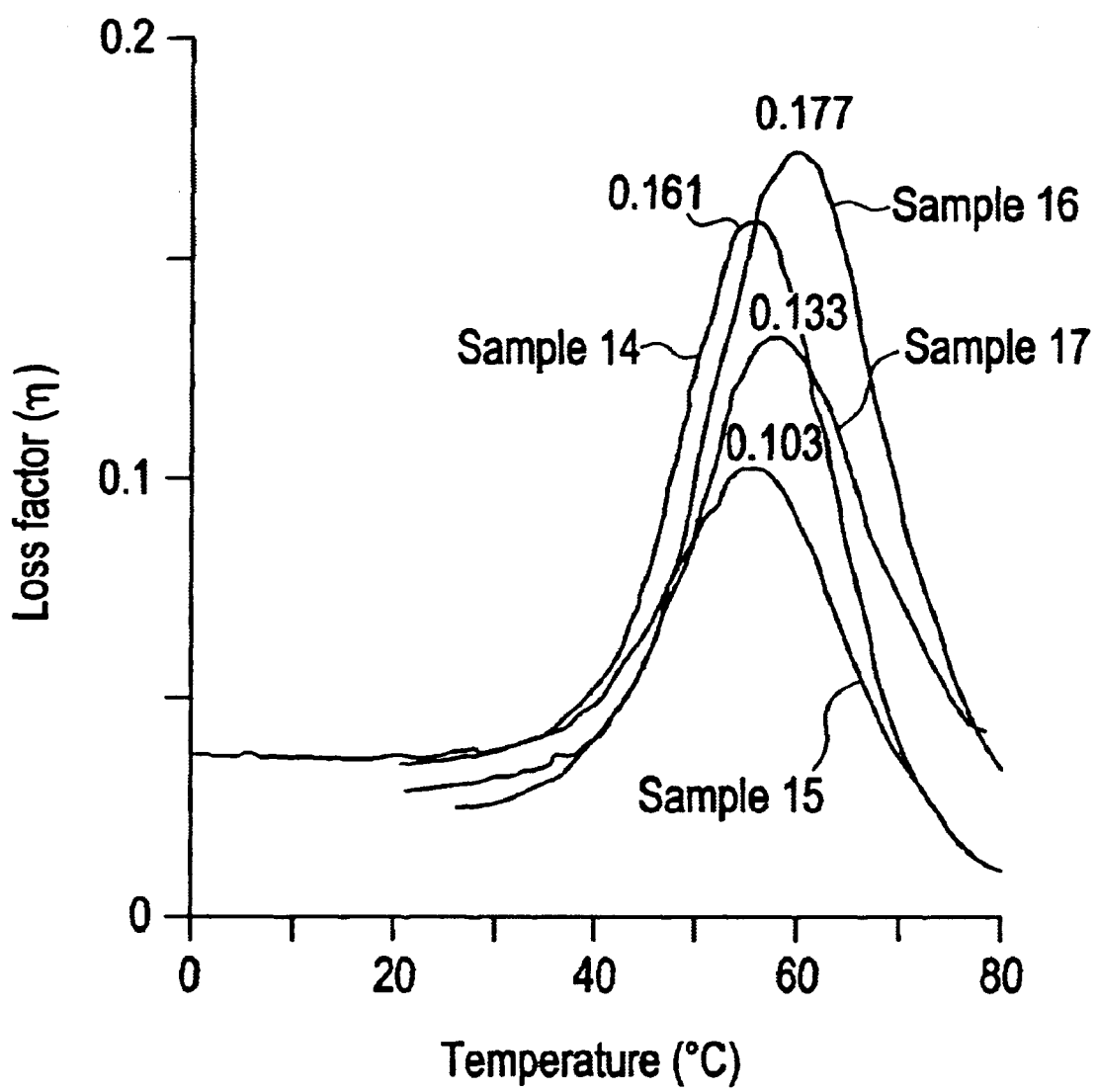
FIG. 14 is a graph showing respective relationships between the temperature and loss factors (η) of Samples 14 to 17.

An electromagnetic wave absorptive layer was provided. This layer was measured for dielectric tangent (tan δ), dielectric loss factor ($\epsilon''$), and dielectric constant ($\epsilon'$). The results are shown in FIG. 12.

The mixing ratio (parts by weight) of chlorinated polyethylene to DCHBSA was 100 to 0 (Comparison 35), 100 to 30 (Embodiment 36), 100 to 50 (Embodiment 37), 100 to 70 (Embodiment 38), and 100 to 100 (Embodiment 39).

TABLE 12

| Electromagnetic Absorptive Layer | Dielectric Tangent δ | Dielectric Constant ($\epsilon'$) | Dielectric Loss Factor ($\epsilon''$) |
|---|---|---|---|
| Embodiment 36 | 5.2 | 22.1 | 115.0 |
| Embodiment 37 | 5.7 | 29.1 | 164.7 |
| Embodiment 38 | 6.9 | 25.8 | 178.0 |
| Embodiment 39 | 9.0 | 23.5 | 211.7 |
| Comparison 35 | 3.4 | 17.1 | 58.9 |

These electromagnetic wave absorption layers were measured for electromagnetic wave absorption capability (db).

Figure 53:
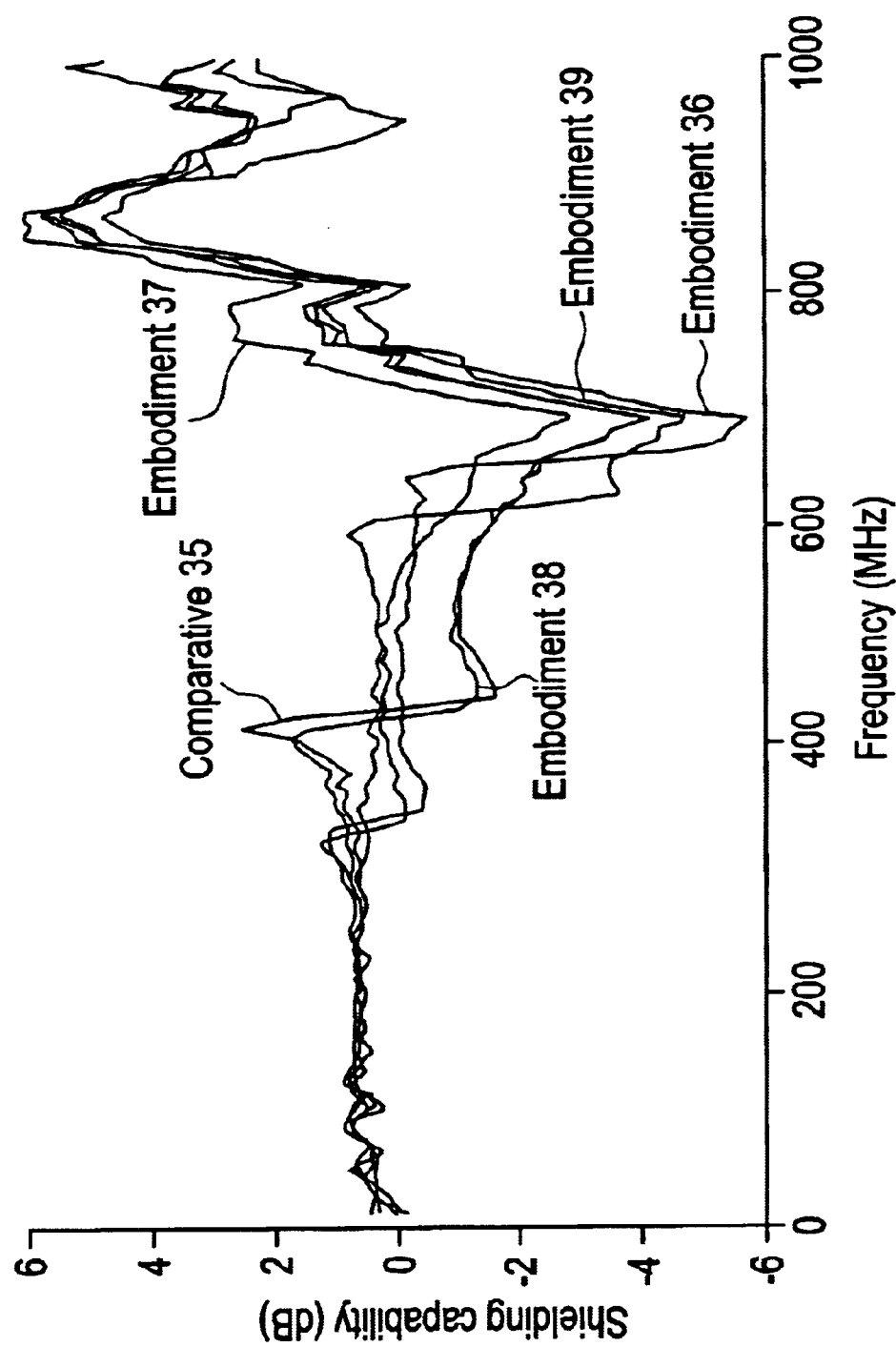
FIG. 53 is a graph showing respective relationships between the frequency and electromagnetic wave absorption capabilities of the electromagnetic wave absorptive layers according to Embodiments 36 to 39 and Comparison 35.

The results are shown in FIG. 53. The electromagnetic wave absorption capability (db) was measured using the electromagnetic shied evaluating apparatus (TR-17301 manufactured by Advantest, Inc.). Electric fields of 10 to 1,000 MHz were used in the test.

Next, embodiments of the vibration-proofing material according to this invention are described. Tables 13-1 and 13-2 show the compositions, dielectric properties, mechanical properties, and damping ratios. The dielectric loss factor ($\epsilon''$) shown in Tables 13-1 and 13-2 was measured with Impedance/Gain Phase Analyzer 4194A, a measuring apparatus manufactured by Yokokawa Hewlette Packard, Inc. and the elastic tangent (tan δ) was measured using Reovibron DDV-25FP, a measuring apparatus manufactured by Orientech, Inc. The damping ratio (ζ) is tand/2, so it was simply provided by dividing the elastic tangent (tan δ) by 2.

The measurement was made at 20, 40, or 60-C. The frequency was 110 Hz and the T/P size was ø20×t 1.0 mm.

TABLE 13-1

| Vibration Shield | | | | Dielectric Property (110 Hz) | | | Mech. | Damping (110 Hz) |
|---|---|---|---|---|---|---|---|---|
| Base | Moment Act | Mix | Temp (C.) | $\epsilon'$ | Tan δ | $\epsilon''$ | Tan δ | ζ |
| | | | 20 | 6.1 | 2.1 | 12.8 | 0.01 | 0.005 |
| | | | 40 | 7.6 | 2.1 | 16.0 | 0.02 | 0.010 |
| | | | 60 | 8.0 | 2.5 | 20.0 | 0.03 | 0.015 |

TABLE 13-1-continued

| Vibration Shield | | | | Dielectric Property (110 Hz) | | | Mech. | Damping (110 Hz) |
|---|---|---|---|---|---|---|---|---|
| Base | Moment Act | Mix | Temp (C.) | $\epsilon'$ | Tan δ | $\epsilon''$ | Tan δ | ζ |
| PVC Tand peak 105 C. | DCHP peak 50 C. | 100 phr | 20 40 60 | 13.7 41.2 37.3 | 1.8 3.4 3.2 | 24.7 140.1 119.4 | 0.25 2.00 1.80 | 0.125 1.000 0.900 |
| | DCHBSA peak 80 C. | 100 phr | 20 40 60 | 12.4 8.2 9.8 | 1.3 2.3 3.2 | 16.1 18.9 31.4 | 0.01 0.02 0.55 | 0.005 0.010 0.275 |
| | 2HPMMB peak 100 C. | 100 phr | 20 40 60 | 11.9 7.1 7.6 | 1.1 2.0 2.1 | 13.1 14.2 16.0 | 0.01 0.01 0.02 | 0.005 0.005 0.010 |
| | DDP peak 50 C. | 100 phr | 20 40 60 | 11.7 36.4 16.8 | 1.8 3.4 3.6 | 21.1 123.8 60.5 | 0.23 1.95 1.20 | 0.115 0.975 0.600 |
| | CBS peak 50 C. | 100 phr | 20 40 60 | 10.2 28.8 18.1 | 1.8 3.7 5.3 | 18.4 106.6 95.9 | 0.20 1.65 1.40 | 0.100 0.825 0.700 |
| | BBS peak 50 C. | 100 phr | 20 40 60 | 5.9 29.4 32.6 | 1.7 3.7 4.0 | 10.0 108.8 130.4 | 0.15 1.50 1.85 | 0.075 0.750 0.925 |
| | MBTS peak 50 C. | 100 phr | 20 40 60 | 4.1 18.2 25.1 | 2.0 3.7 3.9 | 8.2 67.3 97.9 | 0.10 1.00 1.05 | 0.050 0.500 0.525 |
| | ECDPA | 100 phr | 20 40 60 | 9.5 37.9 19.9 | 2.0 3.5 5.1 | 19.0 132.7 101.5 | 0.30 2.05 1.20 | 0.150 1.025 0.600 |

TABLE 13-2

| Vibration Shield | | | | Dielectric Property (110 Hz) | | | Mech. | Damping (110 Hz) |
|---|---|---|---|---|---|---|---|---|
| Base | Moment Act | Mix | Temp. (C.) | $\epsilon'$ | Tan δ | $\epsilon''$ | Tan δ | ζ |
| Chlo .PE Peak 10 C. | DCHBSA peak 15 C. 18 C. 23 C. | — 30 phr 50 phr 100 phr | 20 — — — | 17.1 22.1 29.1 23.5 | 3.4 5.2 5.7 9.0 | 58.9 115.0 164.7 211.7 | 1.00 1.50 2.00 2.70 | 0.500 0.750 1.000 1.350 |
| NBR AN 15% Peak −30 C. | DCHBSA peak −22 C. −18 C. −10 C. −5 C. | — 20 wt % 30 wt % 40 wt % 50 wt % | 20 — — — — | 6.1 8.6 10.7 16.5 15.1 | 1.8 1.9 3.1 3.3 2.4 | 10.7 16.6 33.1 55.0 36.7 | 0.09 0.10 0.40 0.60 0.50 | 0.045 0.050 0.200 0.300 0.250 |
| NBR AN 35% Peak 0 C. | DCHBSA peak 3 C. 8 C. 10 C. 13 C. | — 10 phr 30 phr 50 phr 70 phr | 20 — — — — | 14.3 21.1 21.8 22.2 22.6 | 3.4 3.4 4.5 6.6 9.6 | 48.3 71.5 98.0 146.6 216.9 | 0.80 1.00 1.40 1.80 3.00 | 0.400 0.500 0.700 0.900 1.500 |
| NBR AN 45% Peak 15 C. | DCHBSA Peak 17 C. 19 C. — | — 10 phr 30 phr — | 20 — — — | 54.3 27.0 27.9 — | 2.7 6.0 7.6 — | 146.2 162.9 212.5 — | 1.60 1.80 2.40 — | 0.800 0.900 1.200 — |
| ACR Peak 15 C. | DCHBSA Peak 15 C. 15 C. | 0 phr 10 phr 30 phr | 20 — — | 18.3 19.9 19.2 | 9.6 11.3 6.0 | 175.3 244.5 114.9 | 2.50 2.90 1.80 | 1.250 1.450 0.900 |

Next, embodiments of the piezoelectric material according to this invention are described.

One hundred parts by weight of DCHBSA was mixed in 100 parts by weight of polyvinyl chloride (the sample temperature was 22 C.) and the mixture was molded into a plate with a thickness of 1 mm and dimension 150×50 mm. An electrode of silver paste (Asahi Chemical Research, Inc., LS-506J, 140×40 mm) was formed on both surfaces of the plate to prepare a sample (Embodiment 40).

A sample (Embodiment 41) was prepared as for Embodiment 40 except that 100 parts by weight of 2HPMMB was blended in 100 parts by weight of polyvinyl chloride.

A sample (Embodiment 42) was prepared as for Embodiment 40 except that 100 parts by weight of ECDPA was blended in 100 parts by weight of polyvinyl chloride.

A sample (Comparison 36) was prepared as for Embodiment 40 using only polyvinyl chloride.

These samples according to Embodiments 40 to 42 and Comparison 36 Sample were measured for dielectric tangent (tan δ), dielectric loss factor (∈"), and dielectric constant (∈'). The results are shown in Table 14. The dielectric tangent (tan δ), dielectric loss factor (∈"), and dielectric constant (∈') were measured at the glass transition point of each sample.

TABLE 14

| Sample | Dielectric Tangent δ | Dielectric Constant ($\epsilon'$) | Dielectric Loss Factor ($\epsilon''$) |
|---|---|---|---|
| Embodiment 40 | 3.3 | 39.1 | 129.0 |
| Embodiment 41 | 3.9 | 40.6 | 158.3 |
| Embodiment 42 | 3.5 | 37.9 | 132.7 |
| Comparison 36 | 2.1 | 6.1 | 12.8 |

Figure 54:
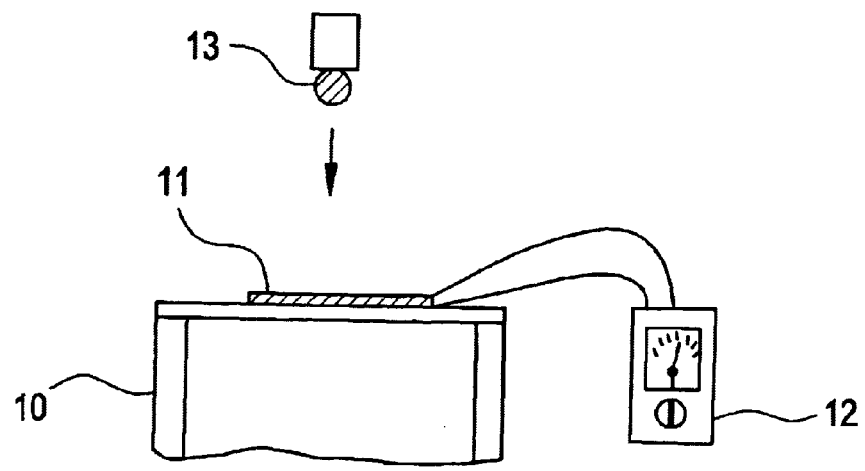
FIG. 54 is a schematic drawing showing an apparatus for measuring the piezoelectric property of the piezoelectric materials according to Embodiments 40 to 42 and Comparison 36.

The samples according to Embodiments 40 to 42 and Comparison 36 were measured for piezoelectric capability. The measurement was made by electrically connecting the electrodes on the respective surfaces of the sample 11 to a voltmeter 12, placing the sample on a base 10, dropping an iron ball 13 (diameter: 20 mm; weight: 32.6 g) onto the sample 11 from a height of 200 mm, and reading from the voltmeter 12 the maximum voltage generated in the sample 11 (FIG. 54). This procedure was repeated five times to obtain the averages of the results, which are shown in Table 15. For comparison, the samples according to Embodiments 40 to 42 and Comparison 36 were polarized and measured for piezoelectric capability in the same manner. The polarization was carried out by applying a 1-kV direct current to each sample in an oil bath at 100 C. for 1 hour and leaving the sample until the temperature of the bath became the room temperature.

TABLE 15

| | Generated Voltage (mV) | |
|---|---|---|
| Sample | No Polarization | Polarization |
| Comparison 36 | 1.36 | 1.88 |
| Embodiment 40 | 88.74 | 90.78 |
| Embodiment 41 | 114.04 | 141.22 |
| Embodiment 42 | 112.58 | 113.81 |

Table 15 shows that Comparison 36 exhibited a low value, 1.36 or 1.88 mV regardless of polarization treatment, whereas Embodiments 40 to 42 without polarization exhibited an extraordinarily high value, about 90 to 110 mV. The value of polarized Embodiment 41 was about 70 times as high as that of polarized Comparison 36, indicating that the moment activator such as DCHBSA or 2HPMMB substantially contributed to the improvement of the piezoelectric capability.

Figure 55:
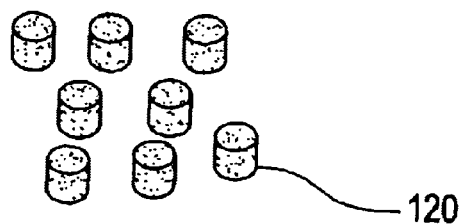
FIG. 55 is a schematic drawing showing endothermic pellets of the present invention.

FIG. 55 shows pellets formed by adding 100 parts by weight of DCHBSA to vinyl chloride resin and molding the mixture. These pellets 120 can be melt spun to provide endothermic fibers.

Figure 56:
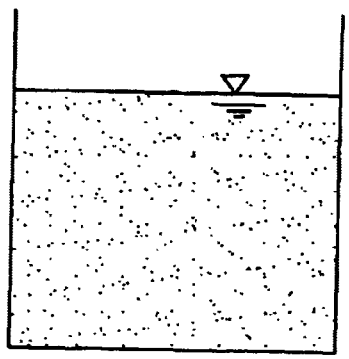
FIG. 56 is a schematic drawing showing a casing of a seismic vibration-proof apparatus and a viscous fluid in the casing.

FIG. 56 shows a tank of an earthquake-proof apparatus and a viscous fluid filled in the tank. This viscous fluid comprised ethyleneglycol where 100 parts by weight of DCHBSA was blended.

A smaller amount of this viscous fluid was able to provide the same earthquake-proof effect as a larger amount of viscous fluid without DCHBSA.

A high-latent-heat medium that can be advantageously used in transmission cooling liquids, engine coolants, or mold cooling liquids was produced by adding 100 parts by weight of DCHBSA to ethyleneglycol.

This high-latent-heat medium has a latent heat similar to that of water and is resistant to rusting. The medium provides an excellent cooling effect. The use of this medium can significantly reduce the size of a cooling apparatus such as a radiator.

What is claimed is:

1. An energy conversion composition, excluding the conversion of electrical into mechanical energy, and excluding the conversion of optical energy, wherein the composition comprises
a base material; and
a moment activator selected from the group consisting of N,N-dicyclohexylbenzothiazyl-2sulfenamide, 2-mercaptobenzothiazole, dibenzothiazylsulfide, N-cyclohexylbenzothiazyl-2-sulfenamide, N-tert-butylbenzothiazyl-2-sulfenamide, N-oxydiethylenebenzothiazyl-2-sulfenamide, and N,N-diisopropylbenzothiazyl-2-sulfenamide mixed into the base material, in a quantity of 10 to 500 parts by weight per 100 parts by weight of the base material, wherein the composition is in the form of a sheet, fiber or combination thereof.

2. The energy conversion composition of claim 1, wherein the base material comprises at least one polymer selected from the group consisting of polyvinyl chloride, polyethylene, chlorinated polyethylene, polypropylene, ethylene-vinyl acetate copolymer, polymethyl methacrylate, polyvinylidene fluoride, polyisoprene, polystyrene, styrene-butadiene-acrylonitrile copolymer, styrene-acrylonitrile copolymer, polyester, polyurethane, polyamide, polyvinylidene chloride, polyacrylonitrile, polyvinyl alcohol, cellulose, acrylonitrile-butadiene ruber, styrene-butadiene rubber, butadiene rubber, natural rubber, and isoprene rubber.

3. The energy conversion composition of claim 1, wherein the base material comprises at least one polymer selected from the polarity polymer group consisting of polyvinyl chloride, chlorinated polyethylene, acrylic rubber, acrylonitrile-butadiene rubber, styrene-butadiene rubber, and chloroprene rubber.

4. The energy conversion composition of claim 1, wherein the base material has a glass transition point in the operating temperature region.

5. The energy conversion composition of claim 1, wherein the base material comprises plasticizer, a glycol, water, or a combination thereof.

6. The energy conversion composition of claim 1, wherein the moment activator is present in an amount from 10 to 100 parts by weight per 100 parts by weight of the base material.

7. The energy conversion composition of claim 1, wherein the moment activator is present in an amount of 10 to 300 parts by weight per 100 parts by weight of the base material.

8. The energy conversion composition of claim 1, wherein the moment activator is present in an amount from 101 to 500 parts by weight per 100 parts by weight of the base material.

9. The energy conversion composition of claim 1, further comprising a second moment activator, wherein the second moment activator comprises a benzothiazyl, benzotriazole, or diphenyl acrylate radical and has a glass transition temperature different from the first moment activator, thereby expanding the working temperature region of the composition.

10. The energy conversion composition of claim 1, wherein the moment activator is present in a quantity effective for vibration damping, sound absorption, impact absorption, or electromagnetic wave absorption.

11. An energy conversion composition, excluding the conversion of electrical into mechanical energy, and excluding the conversion of optical energy, wherein the composition comprises
   a base material selected from the group consisting of chlorinated polyethylene, polyvinylidene fluoride, polyisoprene, styrene-acrylonitrile copolymer, polyurethane, polyacrylonitrile, polyvinyl chloride, acrylic rubber, acrylonitrile-butadiene rubber, styrene-butadiene rubber, polyethylene, polypropylene, polystyrene, styrene-butadiene-acrylonitrile copolymer, natural rubber, isoprene rubber, butadiene rubber, and chloroprene rubber; and
   a moment activator selected from the group consisting of N,N-dicyclohexylbenzothiazyl-2sulfenamide, 2-mercaptobenzothiazole, dibenzothiazylsulfide, N-cyclohexylbenzothiazyl-2-sulfenamide, N-tert-butylbenzothiazyl-2-sulfenamide, N-oxydiethylenebenzothiazyl-2-sulfenamide, and N,N-diisopropylbenzothiazyl-2-sulfenamide mixed into the base material, excluding compounds having a benzothiazyl radical, in a quantity of 10 to 500 parts by weight per 100 parts by weight of the base material, wherein the composition is in the form of a sheet, fiber, or combination thereof.

12. The energy conversion composition of claim 11, wherein the base material has a glass transition point in the operating temperature region.

13. The energy conversion composition of claim 11, wherein the base material comprises plasticizer, a glycol, water, or a combination thereof.

14. The energy conversion composition of claim 11, wherein the moment activator is present in an amount from 10 to 100 parts by weight per 100 parts by weight of the base material.

15. The energy conversion composition of claim 11, wherein the moment activator is present in an amount of 10 to 300 parts by weight per 100 parts by weight of the base material.

16. The energy conversion composition of claim 11, wherein the moment activator is present in an amount from 101 to 500 parts by weight per 100 parts by weight of the base material.

17. The energy conversion composition of claim 11, further comprising a second moment activator, wherein the second moment activator comprises a benzothiazyl, benzotriazole, or diphenyl acrylate radical and has a glass transition temperature different from the first moment activator, thereby expanding the working temperature region of the composition.

18. The energy conversion composition of claim 11, wherein the moment activator is present in a quantity effective for vibration damping, sound absorption, impact absorption, or electromagnetic wave absorption.

19. An energy conversion composition, wherein the composition consists essentially of
   a base material wherein the base material comprises at least one polymer selected from the group consisting of polyvinyl chloride, polyethylene, polypropylene, ethylene-vinyl acetate copolymer, polymethyl methacrylate, polyvinylidene fluoride, polyisoprene, polystyrene, styrene-butadiene-acrylonitrile copolymer, styrene-acrylonitrile copolymer, polyester, polyurethane, polyamide, polyvinylidene chloride, polyacrylonitrile, polyvinyl alcohol, cellulose, acrylonitrile-butadiene rubber, styrene-butadiene rubber, butadiene rubber, natural rubber, chlorinated polyethylene, acrylic rubber, chloroprene rubber and isoprene rubber; and
   a moment activator selected from the group consisting of N,N-dicyclohexylbenzothiazyl-2-sulfenamide, 2-mercaptobenzothiazole, dibenzothiazylsulfide, N-cyclohexylbenzothiazyl-2-sulfenamide, N-tert-butylbenzothiazyl-2-sulfenamide, N-oxydiethylenebenzothiazyl-2-sulfenamide, and N,N-diisopropylbenzothiazyl-2-sulfenamide in a quantity of 10 to 500 parts by weight per 100 parts by weight of the base material.

20. The energy conversion composition of claim 19, wherein the moment activator is N,N-dicyclohexylbenzothiazyl-2-sulfenamide.

21. The energy conversion composition of claim 19, wherein the base material has a glass transition point in the operating temperature region.

22. The energy conversion composition of claim 19, wherein the base material comprises plasticizer, a glycol, water, or a combination thereof.

23. The energy conversion composition of claim 19, wherein the moment activator is present in an amount from 10 to 100 parts by weight per 100 parts by weight of the base material.

24. The energy conversion composition of claim 19, wherein the moment activator is present in an amount of 10 to 300 parts by weight per 100 parts by weight of the base material.

25. The energy conversion composition of claim 19, wherein the moment activator is present in an amount from 101 to 500 parts by weight per 100 parts by weight of the base material.

26. The energy conversion composition of claim 19, further comprising a second moment activator, wherein the second moment activator comprises a benzothiazyl, benzotriazole, or diphenyl acrylate radical and has a glass transition temperature different from the first moment activator, thereby expanding the working temperature region of the composition.

27. The energy conversion composition of claim 19, wherein the moment activator is present in a quantity effective for vibration damping, sound absorption, impact absorption, or electromagnetic wave absorption.

28. An energy conversion article, wherein the composition of claim 1 is fixedly deposited on a synthetic resin film or fibrous sheet.

29. The energy conversion composition of claim 11, wherein the composition is foamed.

30. An energy conversion article, wherein the composition of claim 11 is fixedly deposited on a synthetic resin film or fibrous sheet.

31. The energy conversion composition of claim 19, wherein the composition is in the form of a sheet, fiber, or combination thereof.

32. The energy conversion composition of claim 19, wherein the composition is foamed.

33. An energy conversion composition, excluding the conversion of electrical into mechanical energy, and excluding the conversion of optical energy, wherein the composition comprises
   a base material; and
   a moment activator selected from the group consisting of N,N-dicyclohexylbenzothiazyl-2-sulfenamide, 2-mercaptobenzothiazole, dibenzothiazylsulfide, N-cyclohexylbenzothiazyl-2-sulfenamide, N-tert-butylbenzothiazyl-2-sulfenamide, N-oxydiethylenebenzothiazyl-2-sulfenamide, and N,N-diisopropylbenzothiazyl-2-sulfenamide mixed into the base material, in a quantity of 10 to 500 parts by weight per 100 parts by weight of the base material, wherein the composition is foamed.

34. An energy conversion composition, excluding the conversion of electrical into mechanical energy, and excluding the conversion of optical energy, wherein the composition comprises
   a base material comprising chlorinated polyethylene; and
   a moment activator selected from the group consisting of N,N-dicyclohexylbenzothiazyl-2-sulfonamide, mixed into the base material, in a quantity of 10 to 500 parts by weight per 100 parts by weight of the base material.

35. An energy conversion composition, excluding the conversion of electrical into mechanical energy, and excluding the conversion of optical energy, wherein the composition comprises
   a base material comprising ethylene-vinyl acetate copolymer; and
   a moment activator selected from the group consisting of N,N-dicyclohexylbenzothiazyl-2-sulfonamide, mixed into the base material, in a quantity of 10 to 500 parts by weight per 100 parts by weight of the base material.

36. An energy conversion composition, excluding the conversion of electrical into mechanical energy, and excluding the conversion of optical energy, wherein the composition comprises
   a base material comprising polyurethane; and
   a moment activator selected from the group consisting of N,N-dicyclohexylbenzothiazyl-2-sulfonamide, mixed into the base material, in a quantity of 10 to 500 parts by weight per 100 parts by weight of the base material.

37. An energy conversion composition, excluding the conversion of electrical into mechanical energy, and excluding the conversion of optical energy, wherein the composition comprises
   a base material comprising polypropylene; and
   a moment activator selected from the group consisting of N,N-dicyclohexylbenzothiazyl-2-sulfonamide, mixed into the base material, in a quantity of 10 to 500 parts by weight per 100 parts by weight of the base material.

* * * * *